US007338740B2

(12) United States Patent
Nakao et al.

(10) Patent No.: US 7,338,740 B2
(45) Date of Patent: *Mar. 4, 2008

(54) POSITIVE RESIST COMPOSITION

(75) Inventors: Hajime Nakao, Shizuoka (JP); Makoto Momota, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 85 days.

This patent is subject to a terminal disclaimer.

(21) Appl. No.: 10/809,389

(22) Filed: Mar. 26, 2004

(65) Prior Publication Data

US 2004/0191676 A1    Sep. 30, 2004

(30) Foreign Application Priority Data

Mar. 27, 2003    (JP)    ............ P. 2003-089021

(51) Int. Cl.
  *G03F 7/00*    (2006.01)
  *G03F 7/004*    (2006.01)
(52) U.S. Cl. .................................. 430/270.1
(58) Field of Classification Search .......... 430/270.1
  See application file for complete search history.

(56) References Cited

U.S. PATENT DOCUMENTS

| 6,753,124 B2 * | 6/2004 | Nishimura et al. ...... 430/270.1 |
| 6,787,282 B2 * | 9/2004 | Sato ......................... 430/170 |
| 2005/0095532 A1 * | 5/2005 | Kodama et al. ......... 430/270.1 |

FOREIGN PATENT DOCUMENTS

| EP | 1179750 A1 * | 2/2002 |
| JP | 10-254139 A | 9/1998 |
| JP | 2001-142212 A | 5/2001 |
| JP | 2002-229192 A | 8/2002 |

* cited by examiner

*Primary Examiner*—Amanda C. Walke
(74) *Attorney, Agent, or Firm*—Sughrue Mion, PLLC

(57) ABSTRACT

A positive resist composition comprising (A) a resin comprising at least one kind of acrylate derivative repeating units, repeating units having lactone structures and repeating units having hydroxy group-substituted adamantane structures, having a glass transition temperature in the range of 70 to 155° C. and capable of increasing its solubility in an alkali developer under action of an acid, (B) a compound capable of generating an acid upon irradiation with an actinic ray or radiation, and (C) an organic solvent.

18 Claims, No Drawings

POSITIVE RESIST COMPOSITION

FIELD OF THE INVENTION

The present invention relates to a positive resist composition used in a manufacturing process of semiconductors, such as ICs, in a process of producing circuit boards of LCDs and thermal heads, and in other photo fabrication processes. More specifically, the invention is concerned with a positive resist composition suitable for cases where far ultraviolet light of wavelengths not longer than 250 nm is used as an exposure light source or a beam of electrons is used as an irradiation source.

BACKGROUND OF THE INVENTION

Chemical amplification positive resist compositions are materials for forming patterns on substrates. Specifically, when irradiated with radiation including far ultraviolet light, such a resist composition generates an acid in the irradiated areas, and undergoes reaction utilizing the acid as a catalyst to cause a difference in solubility in a developer between the areas unirradiated and irradiated with such actinic radiation, thereby enabling pattern formation.

In the case where KrF excimer laser is an exposure light source, resins containing as their basic skeletons poly(hydroxystyrene) showing weak absorption in the region of 248 nm are used as a main component. Therefore, such resist compositions have high sensitivity and can form good-quality patterns at high resolution, compared with traditional resist compositions containing naphthoquinonediazide/navolak resin combinations.

However, when light sources of shorter wavelengths, such as ArF exceimer laser (193 nm), are used for exposure, even the chemical amplification resist compositions mentioned above are not satisfactory, because compounds having aromatic groups intrinsically show strong absorption at wavelengths around 193 nm.

Therefore, resist compositions containing resins having alicyclic hydrocarbon structures have been developed as resist adaptable for irradiation with ArF excimer laser.

Patent Document 1 (JP-A-10-254139) describes the use of a solvent mixture of a linear ketone and a solvent selected from a cyclic ketone, a propylene glycol monoalkyl ether acetate or an alkyl 2-hydroxypropionate for the purpose of providing a radiation-sensitive resin composition excelling in transparency to radiation, dry etching resistance, uniformity of film thickness, adhesiveness to substrates, sensitivity, resolution and developing suitability.

Patent Document 2 (JP-A-2002-229192) proposes the use of a specific compound having a cyclic sulfonium structure and a benzene or naphthalene ring as a radiation-sensitive acid generator for the purpose of providing a radiation-sensitive resin composition having not only high transparency to far ultraviolet rays but also high sensitivity, high resolution and excellent pattern profile.

Patent Document 3 (JP-A-2001-142212) discloses the composition containing a specific resin having an alicyclic structure and a certain solvent including propylene glycol monomethyl ether acetate as a resist composition having improvements in sensitivity, resolution, adhesiveness to substrates and pattern edge roughness.

Although various resist compositions have been proposedas mentioned above, it has been desired to further improve performance with respect to the line edge roughness and the defocus latitude common to isolated lines, dense lines and isolated trenches.

The term "line edge roughness" signifies a condition that the edges of the interface between each resist line pattern and a substrate have such a shape as to fluctuate in a direction perpendicular to the line direction owing to resist characteristics. When this line pattern is observed from the position right above, the edges look rough (to an extent of ±dozens nm). This roughness is transferred to the substrate through an etching process, and too rough edges cause impairment of electric characteristics and reduce yield. Thus, the desire to improve line edge roughness is growing as the pattern size becomes finer.

The term defocus latitude refers to the latitude in the matter of deviation from the focus at the time of exposure, and it is desired that patterns of the same size are obtained even when the focus varies to a degree. The expression "defocus latitude common to isolated lines, dense lines and isolated trenches" as used herein means the deviation from the focus that is allowable to the 3 different kinds of fine patterns at the same time, which is different from those to the individual fine patterns. Although the hitherto disclosed resist compositions can yield an improvement in performance of one or two of the foregoing patterns, it is difficult for them to extend the focus deviation allowable to the three patterns at the same time, and so it is to be desired that an improvement in defocus latitude common to isolated lines, dense lines and isolated trenches is made.

[Patent Document 1] JP-A-10-254139

[Patent Document 2] JP-A-2002-229192

[Patent Document 3] JP-A-2001-142212

SUMMARY OF THE INVENTION

Therefore, the object of the invention is to provide a positive resist composition capable of ensuring reduced line edge roughness even when fine patterns are formed and allowing wide defocus latitude in forming various types of patterns including line patterns and trench patterns, whether sparse or dense.

The following positive resist compositions are embodiments of the invention, and thereby the aforesaid aim of the invention is achieved.

(1) A positive resist composition, comprising:

(A) a resin comprising at least one kind of acrylate derivative repeating units, having a glass transition temperature in the range of 70 to 155° C. and capable of increasing its solubility in an alkali developer under action of an acid, wherein the resin has repeating units of at least one kind selected from repeating units represented by the following formula (IV) and repeating units having groups represented by the following formula (V-1), (V-2), (V-3) and (V-4); and repeating units represented by the following formula (AII), (B) a compound capable of generating an acid upon irradiation with an actinic ray or radiation, and (C) an organic solvent comprising at least one solvent selected from a propylene glycol monoalkyl ether carboxylate, an alkyl lactate and a linear ketone; and a cyclic ketone:

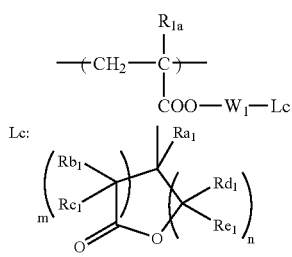

wherein $R_{1a}$ represents a hydrogen atom or a methyl group, $W_1$ represents a divalent single group selected from the class consisting of a single bond, an alkylene group, an ether group, a thioether group, a carbonyl group and an ester group, or a combination thereof, $R_{a1}$, $R_{b1}$, $R_{c1}$, $R_{d1}$ and $R_{e1}$ each independently represents a hydrogen atom or an alkyl group having 1 to 4 carbon atoms, and m and n each independently represents an integer of 0 to 3, provided that m+n is from 2 to 6:

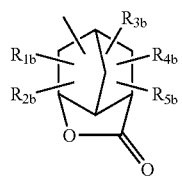

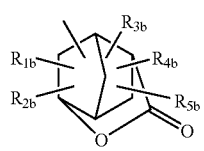

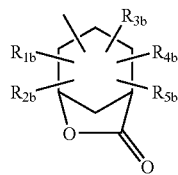

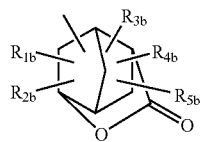

wherein $R_{1b}$ to $R_{5b}$ each independently represents a hydrogen atom, an alkyl group, a cycloalkyl group or an alkenyl group, and any two of them may be combined with each other to form a ring:

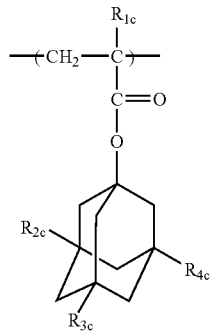

wherein $R_{1c}$ represents a hydrogen atom or a methyl group, $R_{2c}$ to $R_{4c}$ each independently represents a hydrogen atom or a hydroxyl group, provided that at least one of $R_{2c}$ to $R_{4c}$ represents a hydroxyl group.

(2) The composition according to the above (1), wherein 10 to 90 mole % of the repeating units constituting the resin (A) are derived from acrylate monomers.

(3) The composition according to the above (1), wherein 50 to 75 mole % of the repeating units constituting the resin (A) are derived from acrylate monomers.

(4) The composition according to the above (1), wherein the compound (B) is a triphenylsulfonium salt.

(5) The composition according to the above (1), wherein the compound (B) is a phenacylsulfonium salts.

(6) The composition according to the above (1), wherein the cyclic ketone is contained in an amount of 20 to 70% by weight based on the total amount of the organic solvent (C).

(7) The composition according to the above (1), wherein the cyclic ketone is contained in an amount 30 to 60% by weight based on the total amount of the organic solvent (C).

(8) The composition according to any one of claims 1 to 7, wherein the resin (A) has alkali-soluble groups protected by 1-adamantyl-1-alkyl groups.

(9) The composition according to the above (1), wherein the glass transition temperature is in the range of 70 to 150° C.

(10) The composition according to the above (9) wherein the glass transition temperature is in the range of 80 to 140° C.

(11) The composition according to the above (1) wherein the glass transition temperature is in the range of 80 to 140° C.

(12) The composition according to the above (1), wherein the content of the repeating units represented by formula (IV) is from 20 to 70 mole % based on the total repeating units in the resin.

(13) The composition according to the above (12) wherein the content of the repeating units represented by formula (IV) is from 25 to 60 mole % based on the total repeating units in the resin.

(14) The composition according to the above (1) wherein the content of the repeating units represented by formulae (V-1) to (V-4) is from 20 to 70 mole % based on the total repeating units in the resin.

(15) The composition according to the above (14), wherein the content of the repeating units represented by formulae (V-1) to (V-4) is from 25 to 60 mole % based on the total repeating units in the resin.

(16) The composition according to the above (1) further comprising a nitrogen-containing basic compound.

(17) The composition according to the above (1), further comprising at least one of fluorine-based and/or silicon-based surfactants.

(18) A method for forming a pattern, which comprises forming a resist film comprising the composition described in the above (1), exposing the resist film upon irradiation with the actinic ray or a radiation, and subsequently developing the resist film.

DETAILED DESCRIPTION OF THE INVENTION

Compounds used in the invention are illustrated below in detail.

[1] Resin Capable of Increasing its Solubility in Alkali Developer Under Action of Acid (Component (A))

The resin (A) is a resin comprising at least one kind of acrylate derivative repeating units, having a glass transition temperature in the range of 70 to 155° C. and capable of increasing its solubility in an alkali developer under action of an acid (acid-decomposable resin). And the resin is also characterized by comprising repeating units of at least one kind selected from repeating units represented by formula (IV) and repeating units having groups represented by formula (V-1), (V-2), (V-3) or (V-4); and repeating units represented by formula (AII).

Additionally, the resin (A) may comprise repeating units derived from metacrylate derivatives as far as it comprises at least one kind of acrylate derivative repeating units. Incidentally, the repeating unit derived from acrylic acid itself is included in the acrylate derivative repeating units relating to the invention.

The present acrylate derivative repeating units may be any kind of repeating units constituting the resin (A). More specifically, they may be repeating units represented by formula (IV), repeating units having groups represented by formula (V-1), (V-2), (V-3) or (V-4), or repeating units represented by formula (AII).

The resin (A) can contain repeating units having lactone structures represented by the following formula (IV):

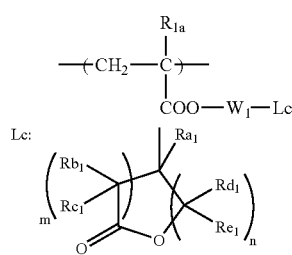

(IV)

In formula (IV), $R_{1a}$ represents a hydrogen atom or a methyl group.

$W_1$ represents a divalent single group selected from the class consisting of a single bond, an alkylene group, an ether group, a thioether group, a carbonyl group and an ester group, or a combination thereof.

The phrase "a combination thereof" means a combination of at least two divalent groups selected from the class consisting of a single bond, an alkylene group, an ether group, a thioether group, a carbonyl group and an ester group.

$R_{a1}$, $R_{b1}$, $R_{c1}$, $R_{d1}$, and $R_{e1}$ each independently represents a hydrogen atom or an alkyl group having 1 to 4 carbon atoms. m and m each independently represents an integer of 0 to 3, provided that m+n is from 2 to 6.

Examples of an alkyl group having 1 to 4 carbon atoms (an 1-4C alkyl group) represented by $R_{a1}$ to $R_{e1}$ each includes a methyl group, an ethyl group, a poropyl group, an isopropyl group, an n-butyl group, an isobutyl group, a sec-butyl group and a t-butyl group.

Examples of an alkylene group represented by $W_1$ in formula (IV) include groups represented by the following formula:

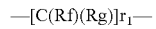

wherein Rf and Rg, which may be the same or different, each represent a hydrogen atom, an alkyl group, a substituted alkyl group, a halogen atom, a hydroxyl group or an alkoxy group. Suitable examples of such an alkyl group include lower alkyl groups, such as a methyl group, an ethyl group, a propyl group, an isopropyl group and a butyl group, but it is preferable that the alkyl group is a group chosen from a methyl group, an ethyl group, a propyl group or an isopropyl group. Examples of a substituent of the substituted alkyl group include a hydroxyl group, a halogen atom and an alkoxy group.

Examples of the alkoxy group mentioned above include 1-4C alkoxy groups such as a methoxy group, an ethoxy group, a propoxy group and a butoxy group. Examples of a halogen atom mentioned above include a chlorine atom, a bromine atom, a fluorine atom and an iodine atom. $r_1$ is an integer of 1 to 10.

Examples of a substituent the foregoing alkyl group can further have include a carboxyl group, an acyloxy group, a cyano group, an unsubstituted alkyl group, a substituted alkyl group, a halogen atom, a hydroxyl group, an alkoxy group, a substituted alkoxy group, an acetylamido group, an alkoxycarbonyl group and an acyl group.

Examples of the alkyl group mentioned above include lower alkyl groups, such as a methyl group, an ethyl group, a propyl group, an isopropyl group, a butyl group, a cyclopropyl group, a cyclobutyl group and a cyclopentyl group. Examples of a substituent of the substituted alkyl group mentioned above include a hydroxyl group, a halogen atom and alkoxy group. Examples of a substituent of the substituted alkoxy group mentioned above include alkoxy groups. Examples of such alkoxy groups include 1-4C alkoxy groups, such as a methoxy group, an ethoxy group, a propoxy group and a butoxy group. An example of the acyloxy group mentioned above is an acetoxy group. Examples of the halogen atom mentioned above include a chlorine atom, a bromine atom, a fluorine atom and an iodine atom.

Examples of a repeating unit represented by formula (IV) are illustrated below, but not be construed as being limited to these illustrated ones.

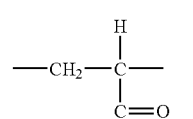

(IV-1)

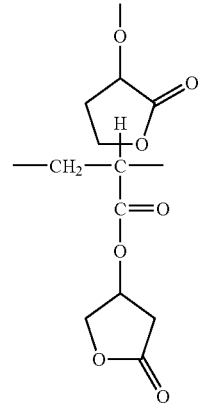

(IV-2)

(IV-3)
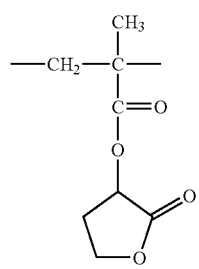
(IV-4)
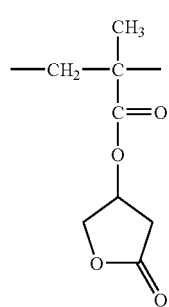
(IV-5)
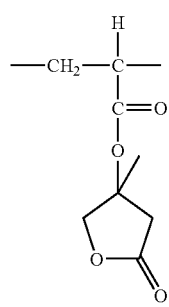
(IV-6)
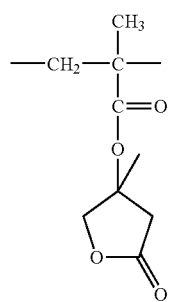
(IV-7)
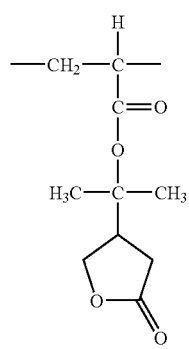
(IV-8)
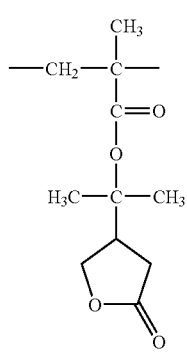
(IV-9)
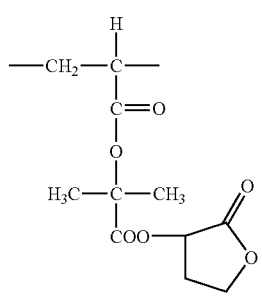
(IV-10)
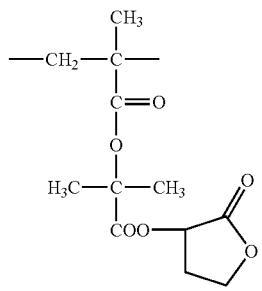
(IV-11)
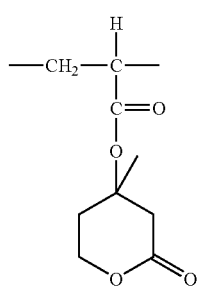
(IV-12)
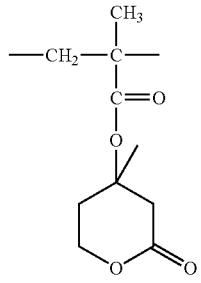

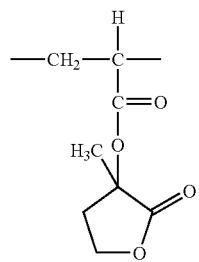
(IV-13)
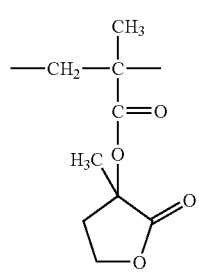
(IV-14)
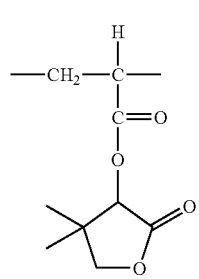
(IV-15)
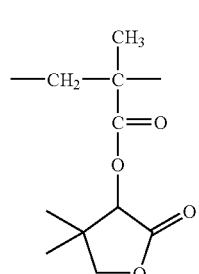
(IV-16)
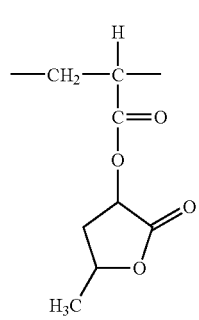
(IV-17)
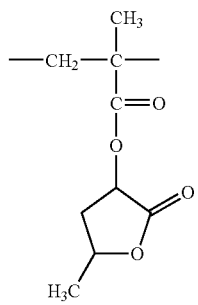
(IV-18)
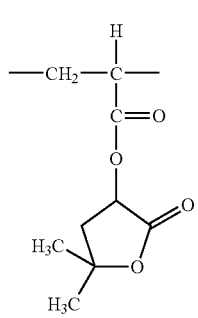
(IV-19)
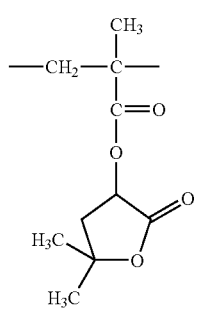
(IV-20)
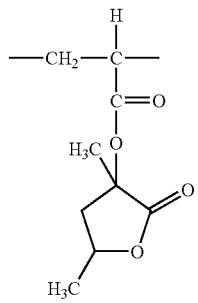
(IV-21)
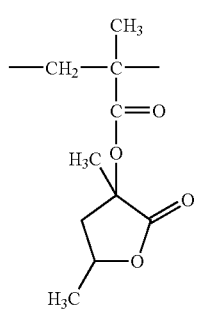
(IV-22)

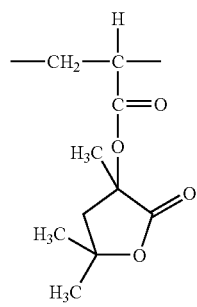 (IV-23)
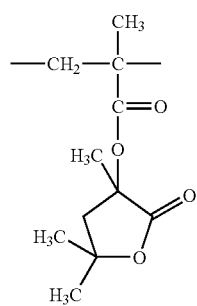 (IV-24)
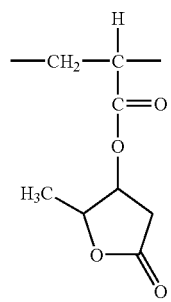 (IV-25)
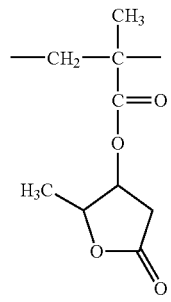 (IV-26)
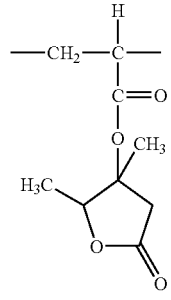 (IV-27)
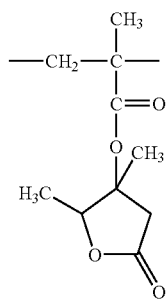 (IV-28)
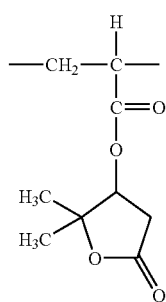 (IV-29)
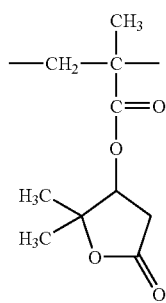 (IV-30)
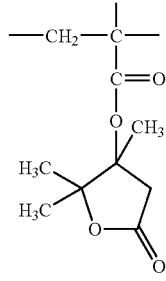 (IV-31)
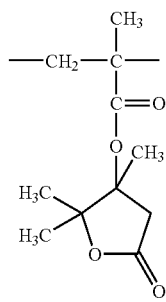 (IV-32)

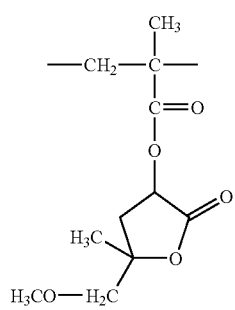
(IV-33)

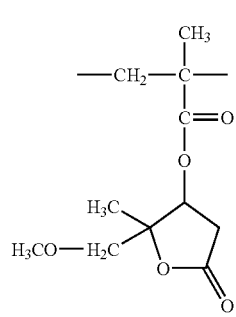
(IV-34)

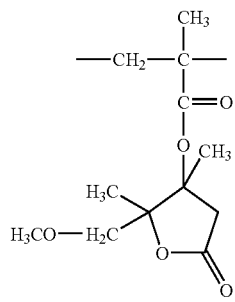
(IV-35)

(IV-36)

Among the above examples of formula (IV), the repeating units (IV-17) to (IV-36) are preferred over the others because they can provide a greater improvement in exposure margin.

Further where the structure of formula (IV) is concerned, the repeating units having acrylate structures are preferable in enabling edge roughness improvement.

Alternatively, the resin (A) can contain repeating units having groups represented by the following formula (V-1), (V-2), (V-3) or (V-4):

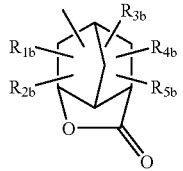
(V-1)

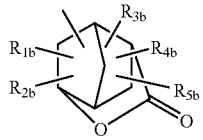
(V-2)

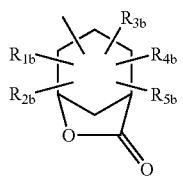
(V-3)

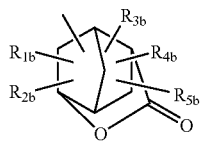
(V-4)

In the above formulae (V-1) to (V-4), $R_{1b}$ to $R_{5b}$ each independently represents a hydrogen atom, an alkyl group, a cycloalkyl group or an alkenyl group. Any two of $R_{1b}$ to $R_{5b}$ may be combined with each other to form a ring.

The alkyl group, the cycloalkyl group or the alkenyl group represented by $R_{1b}$ to $R_{5b}$ each in formulae (V-1) to (V-4) includes those having substituents, too.

The alkyl group of $R_{1b}$ to $R_{5b}$ each is a straight-chain or branched alkyl group and may have a substituent. Suitable examples of such alkyl groups include straight-chain and branched alkyl groups containing up to 12 carbon atoms, preferably those containing up to 10 carbon atoms, far preferably a methyl group, an ethyl group, a propyl group, an isopropyl group, an n-butyl group, an isobutyl group, a sec-butyl group, a t-butyl group, a pentyl group, a hexyl group, an octyl group, a nonyl group and a decyl group.

Suitable examples of a cycloalkyl group represented by $R_{1b}$ to $R_{5b}$ each include 3-8C cycloalkyl groups, such as a cyclopropyl group, a cyclopentyl group, a cyclohexyl group, a cycloheptyl group and a cyclooctyl group.

Suitable examples of an alkenyl group represented by $R_{1b}$ to $R_{5b}$ each include 2-6C alkenyl groups, such as a vinyl group, a propenyl group, a butenyl group and a hexenyl group.

Examples of a ring formed by combining any two of $R_{1b}$ to $R_{5b}$ include 3- to 8-membered rings, such as a cyclopropane ring, a cyclobutane ring, a cyclopentane ring, a cyclohexane ring and a cyclooctane ring.

Incidentally, $R_{1b}$ to $R_{5b}$ in formulae (V-1) to (V-4) each may be attached to any of carbon atoms forming the cyclic skeleton.

Suitable examples of a substituent the alkyl group, the cycloalkyl group and the alkenyl group each may have include 1-4C alkoxy groups, halogen atoms (fluorine, chlorine, bromine and iodine atoms), 2-5C acyl groups, 2-5C acyloxy groups, a cyano group, a hydroxyl group, a carboxyl group, 2-5C alkoxycarbonyl groups and a nitro group.

The repeating units having the groups represented by formulae (V-1) to (V-4) include repeating units represented by the following formula (AI):

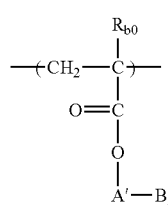

(AI)

In formula (AI), $R_{b0}$ represents a hydrogen atom, a halogen atom, or a 1-4C substituted or unsubstituted alkyl group. Suitable examples of a substituent the alkyl group of $R_{b0}$ may have include those recited above as substituents suitable for the alkyl group of $R_{1b}$ in formulae (V-1) to (V-4) each.

The halogen atom of $R_{b0}$ is a fluorine atom, a chlorine atom, a bromine atom or an iodine atom. $R_{b0}$ is preferably a hydrogen atom.

A' represents a single bond, an ether group, an ester group, a carbonyl group, an alkylene group, or a combination of two or more of these divalent groups.

$B_2$ represents a group represented by any of formulae (V-1) to (V-4).

Examples of a combination of two or more of the divalent groups include the following groups:

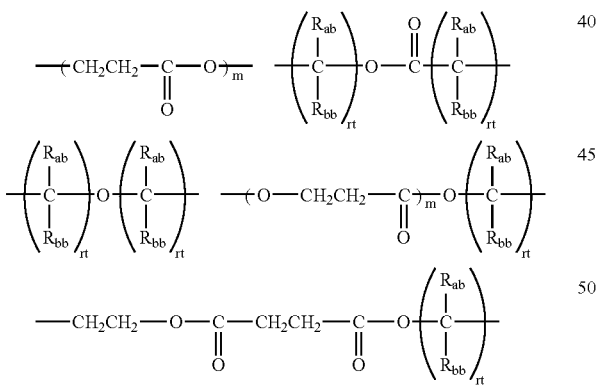

In the above formulae, $R_{ab}$ and $R_{bb}$, which may be the same or different, each represents a hydrogen atom, an alkyl group, a substituted alkyl group, a halogen atom, a hydroxyl group or an alkoxy group.

Suitable examples of such an alkyl group include lower alkyl groups, such as a methyl group, an ethyl group, a propyl group, an isopropyl group and a butyl group, but it is preferable that the alkyl group is chosen from a methyl group, an ethyl group, a propyl group or an isopropyl group. Examples of a substituent of the substituted alkyl group include a hydroxyl group, a halogen atom and 1-4C alkoxy groups. Examples of the alkoxy group include a methoxy group, an ethoxy group, a propoxy group and a butoxy group. Examples of a halogen atom mentioned above include a chlorine atom, a bromine atom, a fluorine atom and an iodine atom. r1 is an integer of 1 to 10, preferably an integer of 1 to 4. m is an integer of 1 to 3, preferably 1 or 2.

Examples of repeating units represented by formula (AI) are illustrated below, but these examples should not be construed as limiting the scope of the invention.

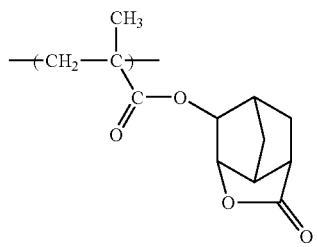

(Ib-1)

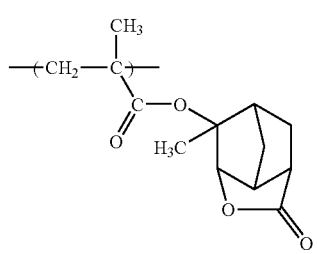

(Ib-2)

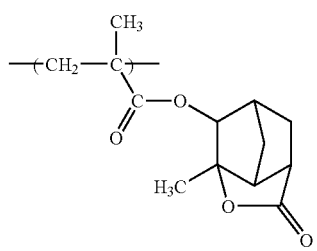

(Ib-3)

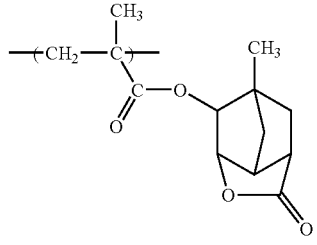

(Ib-4)

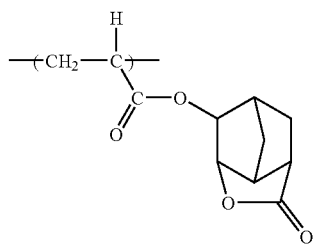

(Ib-5)

-continued
(Ib-6)
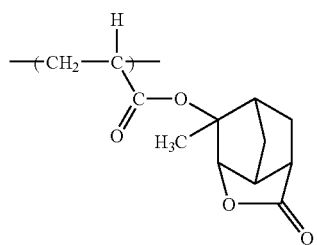
(Ib-7)
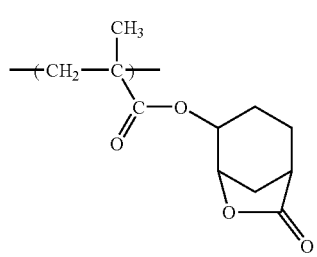
(Ib-8)
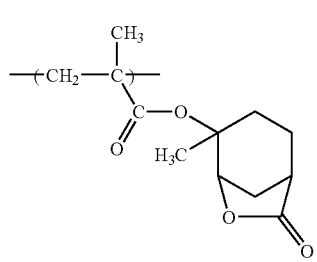
(Ib-9)
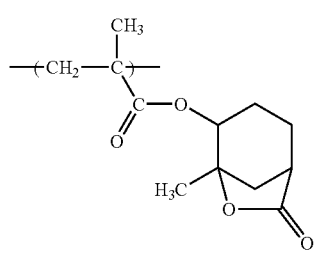
(Ib-10)
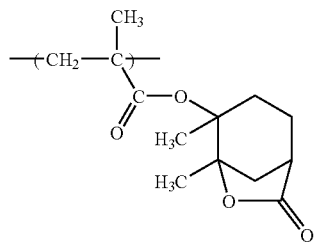
(Ib-11)
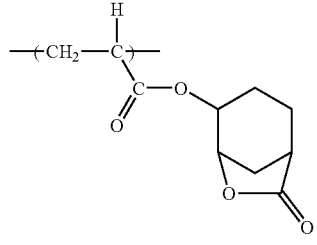
-continued
(Ib-12)
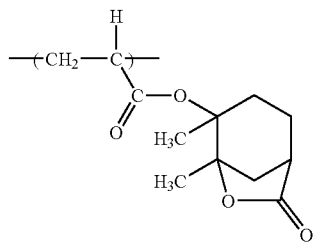
(Ib-13)
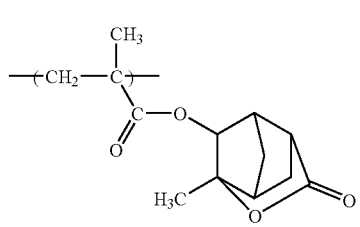
(Ib-14)
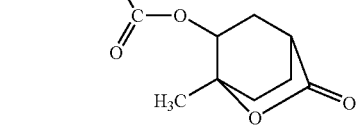
(Ib-15)
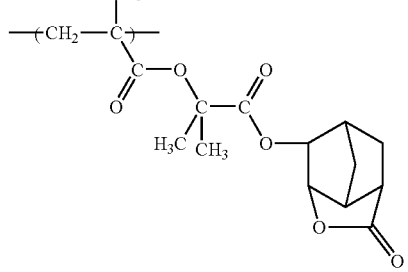
(Ib-16)
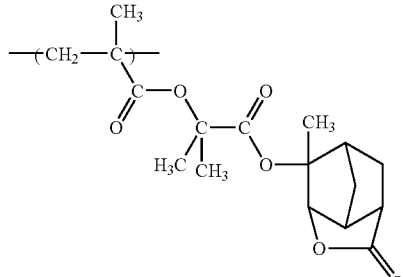
(Ib-17)
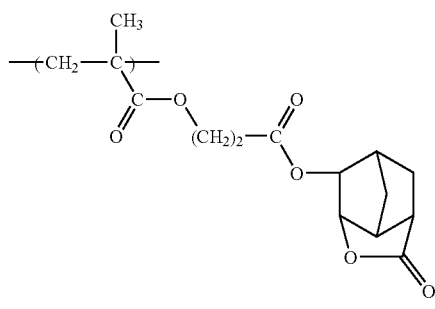

(Ib-18)
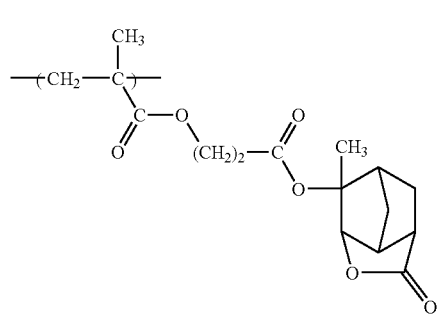
(Ib-19)
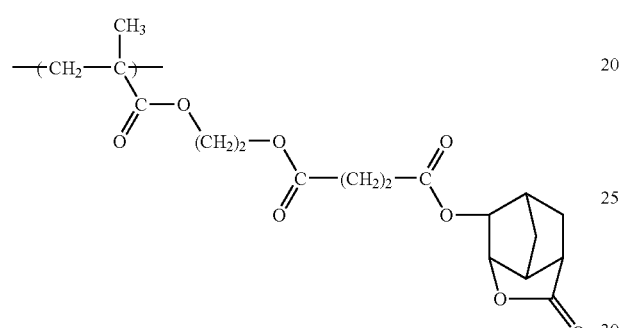
(Ib-20)
(Ib-21)
(Ib-22)
(Ib-23)
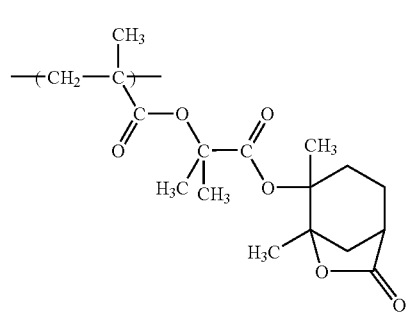
(Ib-24)
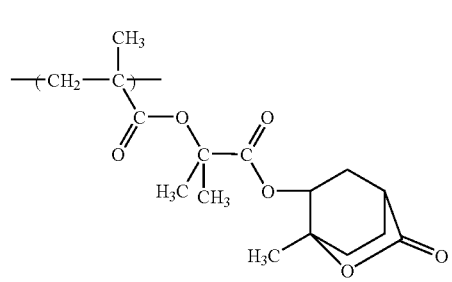
(Ib-25)
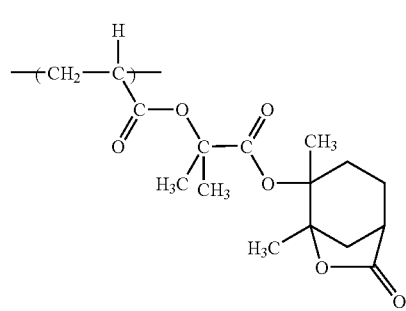
(Ib-26)
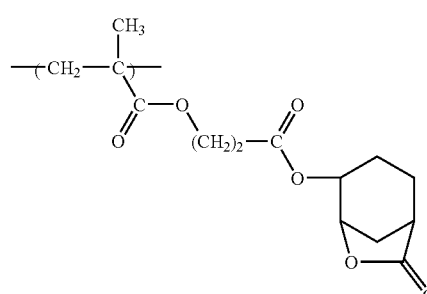
(Ib-27)
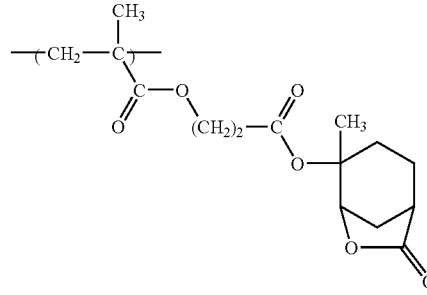

-continued (Ib-28)
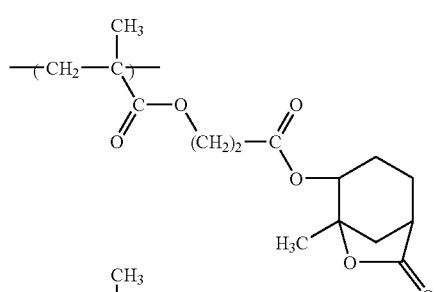

(Ib-29)
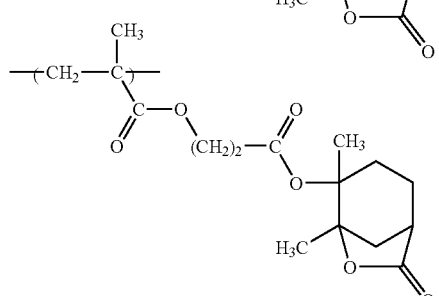

(Ib-30)
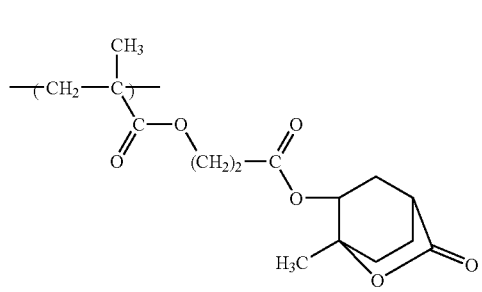

(Ib-31)
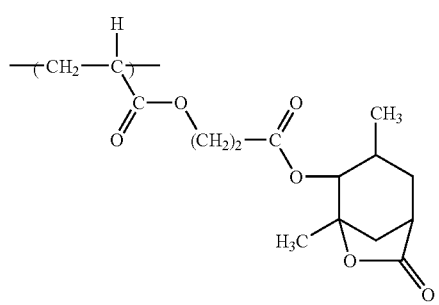

The resin (A) further contains repeating units represented by the following formula (AII):

(AII)
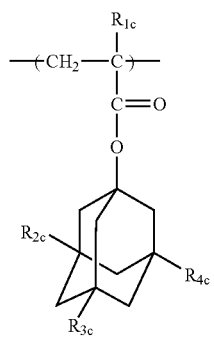

In formula (AII), $R_{1c}$ represents a hydrogen atom or a methyl group.

$R_{2c}$ to $R_{4c}$ each independently represents a hydrogen atom or a hydroxyl group. Herein, however, it is required that at least one of $R_{2c}$ to $R_{4c}$ is a hydroxyl group.

And it is preferable that any two of $R_{2c}$, $R_{3c}$ and $R_{4c}$ are hydroxyl groups.

Examples of a repeating unit having a structure represented by formula (AII) are illustrated below, but such a repeating unit should not be construed as being limited to these examples.

(1)
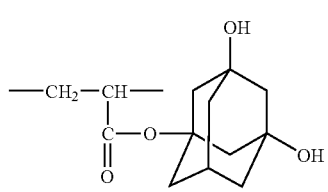

(2)
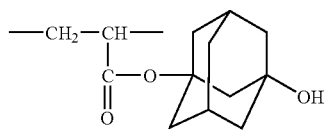

(3)
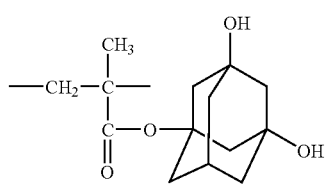

(4)
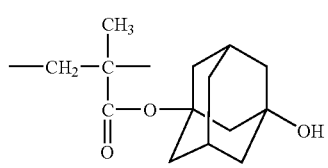

The resin (A) is a resin capable of increasing its solubility in an alkali developer under action of an acid (which is also referred to as acid-decomposable resin, hereinafter). Specifically, it is insoluble or slightly soluble in alkali developers and has repeating units containing groups capable of becoming soluble in alkali through decomposition by the action of an acid (acid-decomposable groups).

It is especially advantageous for the resin (A) to have repeating units containing acid-decomposable groups having alicyclic hydrocarbon-containing partial structures represented by the following formulae (pI) to (pVI):

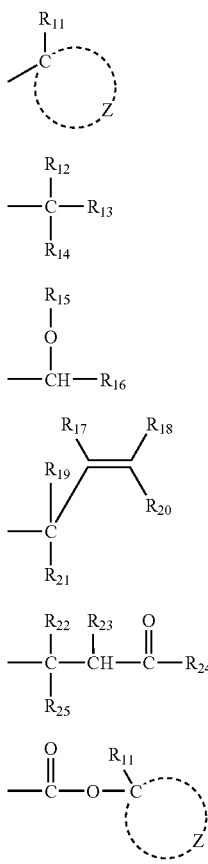

(pI)

(pII)

(pIII)

(pIV)

(pV)

(pVI)

In the above formulae, $R_{11}$ represents a methyl group, an ethyl group, a n-propyl group, an isopropyl group, a n-butyl group, an isobutyl group or a sec-butyl group. Z represents atoms forming an alicyclic hydrocarbon group together with the carbon atom. $R_{12}$ to $R_{16}$ independently represents a linear or branched alkyl group containing up to 4 carbon atoms or an alicyclic hydrocarbon group, provided that at least one of $R_{12}$, $R_{13}$ and $R_{14}$ is an alicyclic hydrocarbon group and either $R_{15}$ or $R_{16}$ is an alicyclic hydrocarbon group.

$R_{17}$ to $R_{21}$ independently represents a hydrogen atom, a linear or branched alkyl group containing up to 4 carbon atoms or an alicyclic hydrocarbon group, provided that at least one of $R_{17}$ to $R_{21}$ is an alicyclic hydrocarbon group and either $R_{19}$ or $R_{21}$ is a linear or branched alkyl group containing up to 4 carbon atoms or an alicyclic hydrocarbon group, $R_{22}$ to $R_{25}$ independently represents a linear or branched alkyl group containing up to 4 carbon atoms or an alicyclic hydrocarbon group, provided that at least one of $R_{22}$ to $R_{25}$ is an alicyclic hydrocarbon group. Moreover, $R_{23}$ and $R_{24}$ may be combined with each other to form a ring.

In formulae (pI) to (pVI), the alkyl group represented by each of $R_{12}$ to $R_{25}$ is a substituted or unsubstituted, linear or branched alkyl group containing up to 4 carbon atoms. Examples of such an alkyl group include a methyl group, an ethyl group, a n-propyl group, an isopropyl group, an n-butyl group, an isobutyl group, a sec-butyl group and a t-butyl group.

Examples of a substituent the alkyl group can further have include a 1-4C alkoxy group, a halogen atom (e.g., fluorine, chlorine, bromine, iodine), an acyl group, an acyloxy group, a cyano group, a hydroxyl group, a carboxyl group, an alkoxycarbonyl group and a nitro group.

The alicyclic hydrocarbon group represented by each of $R_{11}$ to $R_{25}$ or formed by combining Z with the carbon atoms may be monocyclic or polycyclic. Specifically, such an alicyclic hydrocarbon group may have any of monocyclic, bicyclic, tricyclic and tetracyclic structures and contain at least 5 carbon atoms. Further, it is preferable that the number of carbon atoms constituting the cyclic structure be from 6 to 30, particularly from 7 to 25. These alicyclic hydrocarbon groups may have substituents.

Structural examples of an alicyclic moiety of the aforementioned alicyclic hydrocarbon group are illustrated below.

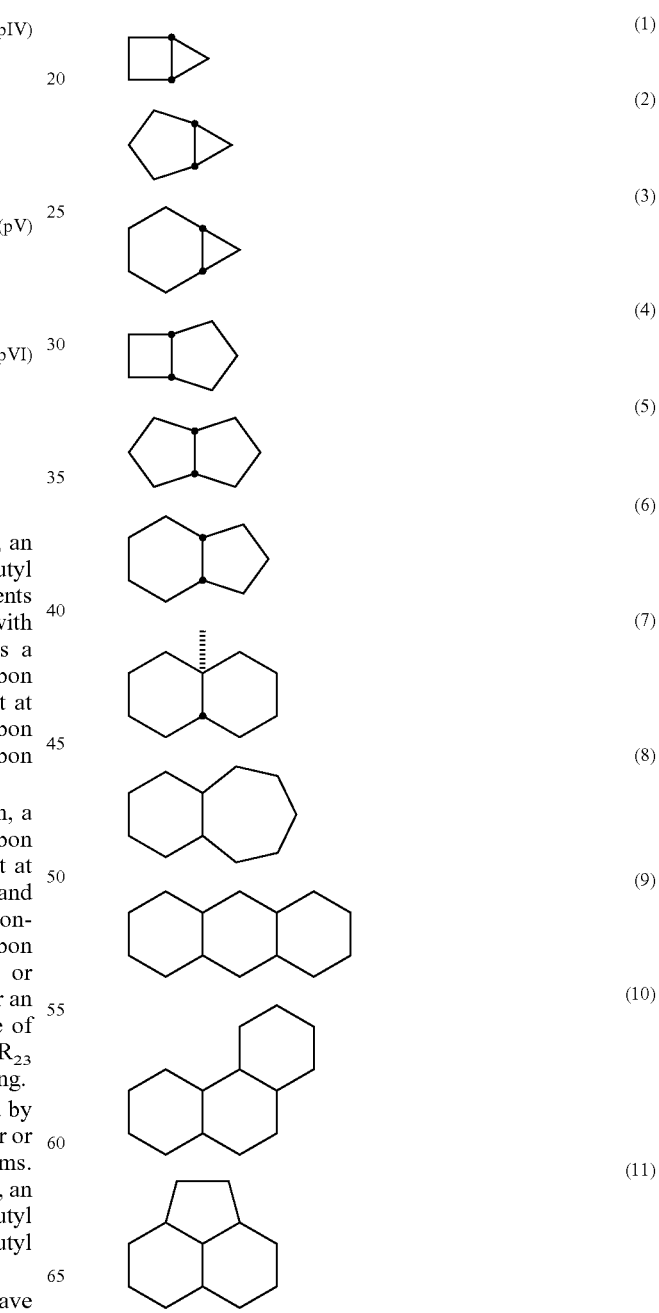

-continued
(12) 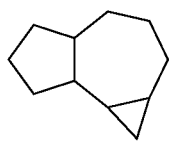
(13) 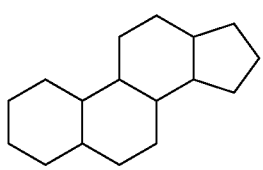
(14) 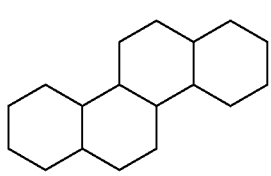
(15) 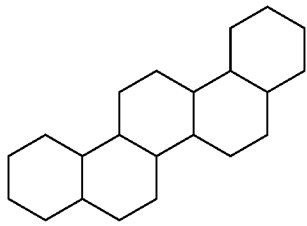
(16) 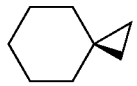
(17) 
(18) 
(19) 
(20) 
(21) 
(22) 
-continued
(23) 
(24) 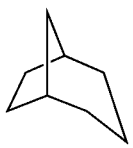
(25) 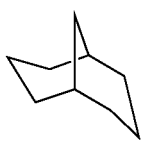
(26) 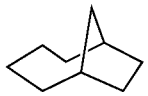
(27) 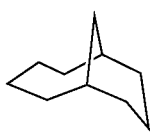
(28) 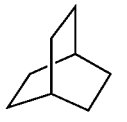
(29) 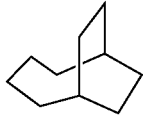
(30) 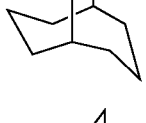
(31) 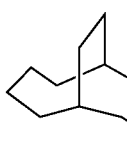
(32) 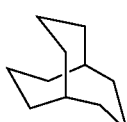
(33) 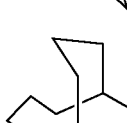
(34) 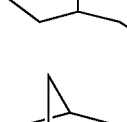

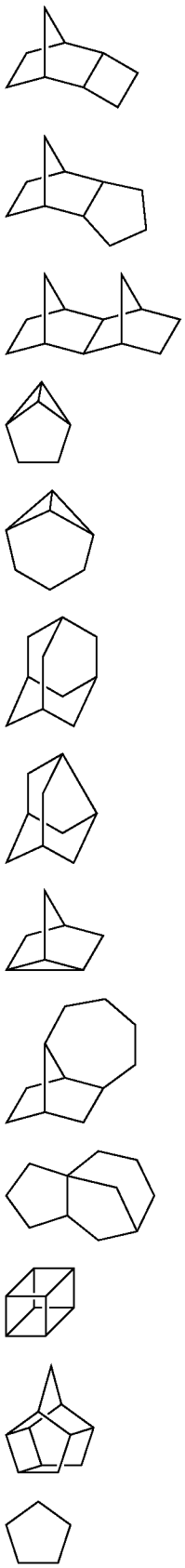

(35)
(36)
(37)
(38)
(39)
(40)
(41)
(42)
(43)
(44)
(45)
(46)
(47)

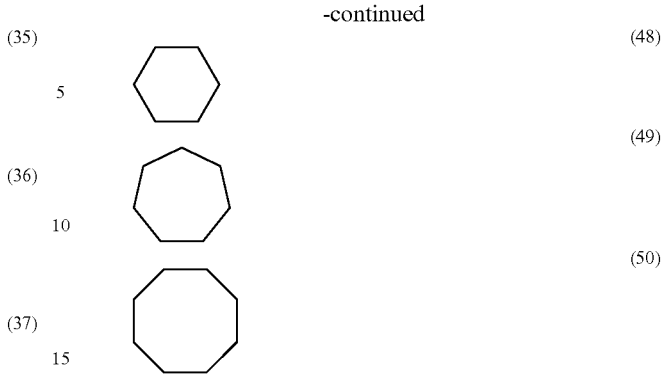

(48)
(49)
(50)

Suitable examples of an alicyclic moiety in the invention include an adamantyl group, a noradamantyl group, a decaline residue, a tricyclodecanyl group, a tetracyclododecanyl group, a norbornyl group, a sedorol group, a cyclohexyl group, a cycloheptyl group, a cyclooctyl group, a cyclodecanyl group and a cyclododecanyl group. Of these groups, an adamantyl group, a decaline residue, a norbornyl group, a sedorol group, a cyclohexyl group, a cycloheptyl group, a cyclooctyl group, a cyclodecanyl group and a cyclododecanyl group are preferred over the others.

Examples of a substituent the alicyclic hydrocarbon group as recited above may have include an alkyl group, a substituted alkyl group, a halogen atom, a hydroxyl group, an alkoxy group, a carboxyl group and an alkoxycarbonyl group. Examples of the alkyl group include lower alkyl groups such as methyl, ethyl, propyl, isopropyl and butyl groups, preferably methyl, ethyl, propyl and isopropyl groups. Examples of a substituent of the substituted alkyl group include a hydroxyl group, a halogen atom and an alkoxy group. Examples of the alkoxy group include 1-4C alkoxy groups, such as methoxy, ethoxy, propoxy and a butoxy groups.

The structures represented by formulae (pI) to (pVI) in the resin can be used for alkali-soluble group protection. Examples of an alkali-soluble group include various groups known in this technical field.

Specifically, carboxyl, sulfo, phenol and thiol groups, preferably carboxyl and sulfo groups, are examples of an alkali-soluble group.

Suitable examples of alkali-soluble groups protected by the structures represented by formulae (pI) to (pVI) include groups represented by the following formulae (pVII) to (pXI):

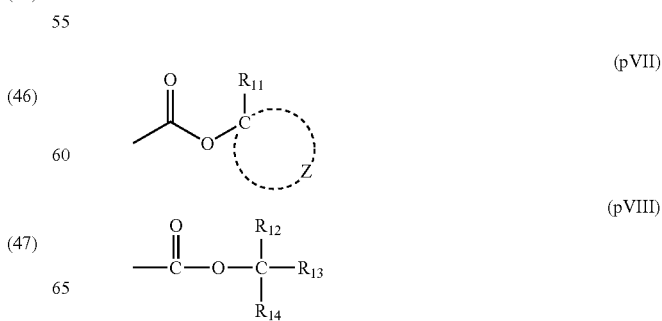

-continued

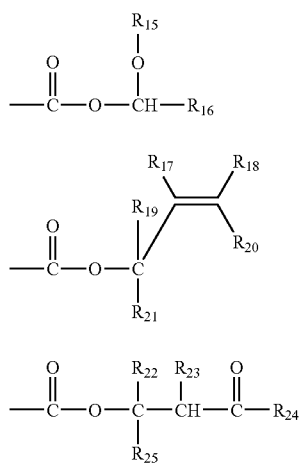

Herein, $R_{11}$ to $R_{25}$ and Z have the same meanings as defined hereinbefore, respectively.

As the repeating units having alkali-soluble groups protected by structures represented by formulae (pI) to (pVI), repeating units represented by the following formula (pA) are preferred.

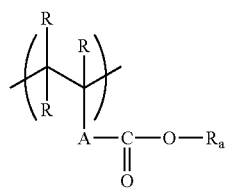

Herein, each R represents a hydrogen atom, a halogen atom, or a substituted or unsubstituted, linear or branched alkyl group containing up to 4 carbon atoms, and three R groups may be the same or different.

A represents a single group or a combination of at least two groups selected from the class consisting of a single bond, an unsubstituted alkylene group, a substituted alkylene group, an ether group, a thioether group, a carbonyl group, an ester group, an amido group, a sulfonamido group, an urethane group and an urea group.

Ra represents any of the groups represented by formulae (pI) to (pVI).

Examples of a monomer corresponding to the repeating unit represented by formulae (pA) are illustrated below.

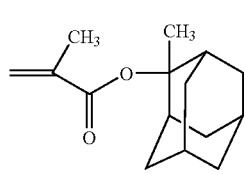

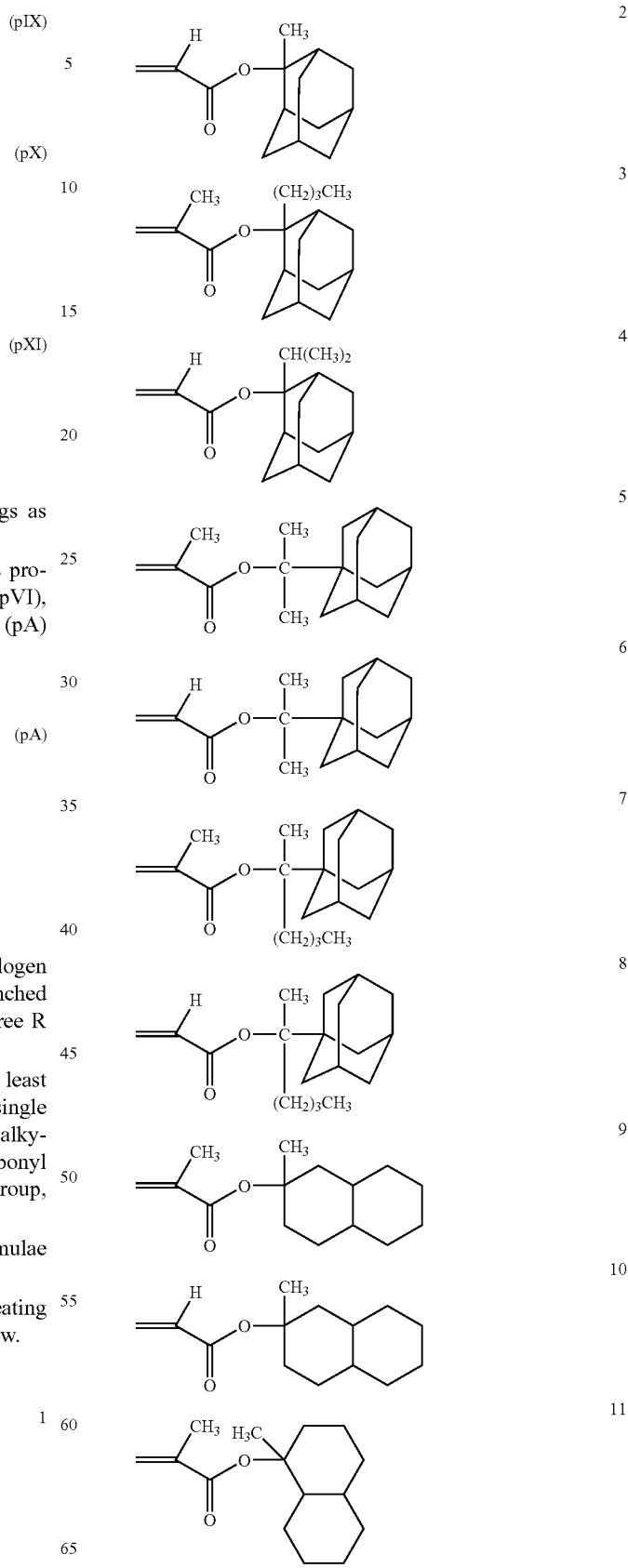

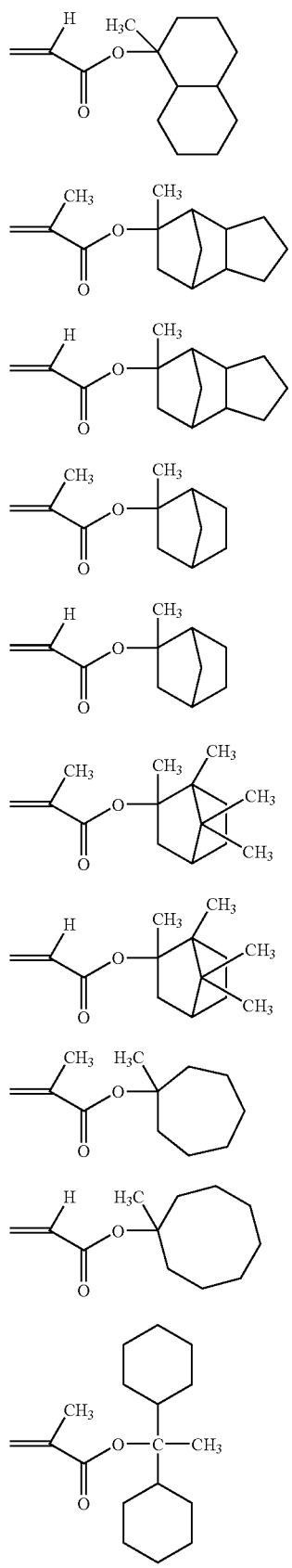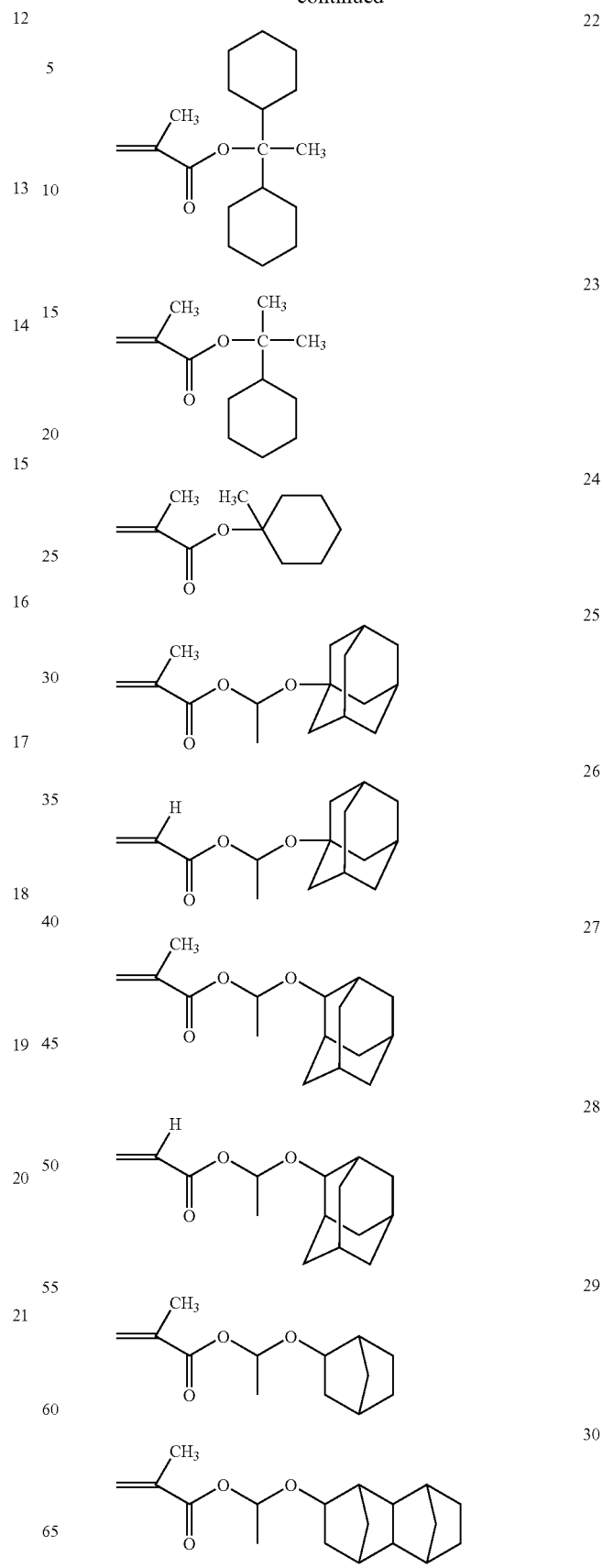

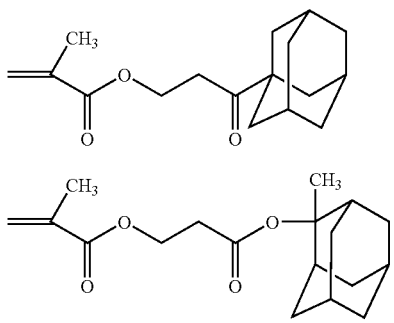

In the invention, it is appropriate in particular that the resin (A) has alkali-soluble groups protected by 2-alkyl-2-adamantyl or 1-adamantyl-1-alkyl groups, preferably alkali-soluble groups protected by 1-adamantyl-1-alkyl groups.

The resin (A) may contain acid-decomposable groups in the form of a partial structure containing an alicyclic hydrocarbon group represented by any of formulae (pI) to (pVI), or may contain them in repeating-units of at least one kind out of the repeating units derived from comonomers mentioned hereinafter.

In addition to the alkali-soluble groups (acid-decomposable groups) protected by the structures having formulae (pI) to (pVI), structures represented by —C(=O)—X$_1$—R$_0$ can be given as other examples of the structure of an acid-decomposable group.

Examples of R$_0$ in the formula include tertiary alkyl groups such as a t-butyl group and a t-amyl group, 1-alkoxyethyl groups such as an isobornyl group, a 1-ethoxyethyl group, a 1-butoxyethyl group, a 1-isobutoxyethyl group and a 1-cyclohexyloxyethyl group, alkoxymethyl groups such as a 1-methoxymethyl group and a 1-ethoxymethyl group, 3-oxoalkyl groups, a tetrahydropyranyl group, a tetrahydrofuranyl group, trialkylsilyl ester groups, a 3-oxocyclohexyl ester group, a 2-methyl-2-adamantyl group and a mevalonic lactone residue. And Xi represents —O—, —S—, —NH—, —NHSO$_2$— or —NHSO$_2$NH—.

Further, the resin (A) can contain repeating units represented by the following formula (VI):

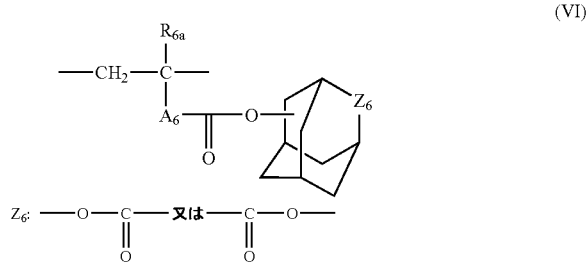
(VI)

wherein A$_6$ represents a single bond, an alkylene group, a cycloalkylene group, an ether group, a thioether group, a carbonyl group, an ester group, or a group formed by combining any two or more of these groups; and R$_{6a}$ represents a hydrogen atom, a 1-4C alkyl group, a cyano group, or a halogen atom.

Examples of an alkylene group of A$_6$ in formula (VI) include groups represented by the following formula:

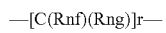

wherein Rnf and Rng each represent a hydrogen atom, an unsubstituted group, a substituted alkyl group, a halogen atom, a hydroxyl group or an alkoxy group, and they both maybe the same or different. Suitable examples of such an alkyl group include lower alkyl groups, such as methyl, ethyl, propyl, isopropyl and butyl groups, preferably methyl, ethyl, propyl and isopropyl groups. Examples of a substituent of the substituted alkyl group include a hydroxyl group, a halogen atom and an alkoxy group. Examples of the alkoxy group include 1-4C alkoxy groups, such as methoxy, ethoxy, propoxy and butoxy groups. Examples of the halogen atom include chlorine, bromine, fluorine and iodine atoms. r is an integer of 1 to 10.

Examples of a cycloalkylene group of A$_6$ in formula (VI) include those containing 3 to 10 carbon atoms, such as cyclopentylene, cyclohexylene and cyclooctylene groups.

The Z$_6$-containing bridged alicyclic ring may have a substituent. Examples of such a substituent include a halogen atom, an alkoxy group (preferably containing 1 to 4 carbon atoms), an alkoxycarbonyl group (preferably containing 1 to 5 carbon atoms), an acyl group (e.g., formyl, benzoyl), an acyloxy group (e.g., propylcarbonyloxy, benzoyloxy), an alkyl group (preferably containing 1 to 4 carbon atoms), a carboxyl group, a hydroxyl group, and an alkylsulfonylcarbamoyl group (e.g., —CONHSO$_2$CH$_3$). Additionally, the alkyl group as a substituent may further be substituted with a hydroxyl group, a halogen atom or an alkoxy group (preferably containing 1 to 4 carbon atoms).

The oxygen atom of the ester group linked to A$_6$ in formula (VI) may be attached to any of carbon atoms constituting the Z$_6$-containing bridged alicyclic ring structure.

Examples of repeating units represented by formula (VI) are illustrated below, but these examples should not be construed as limiting the scope of the invention.

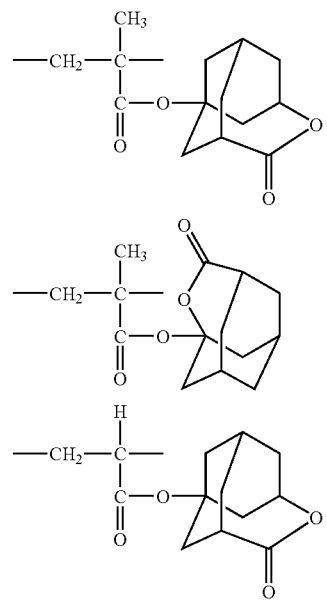

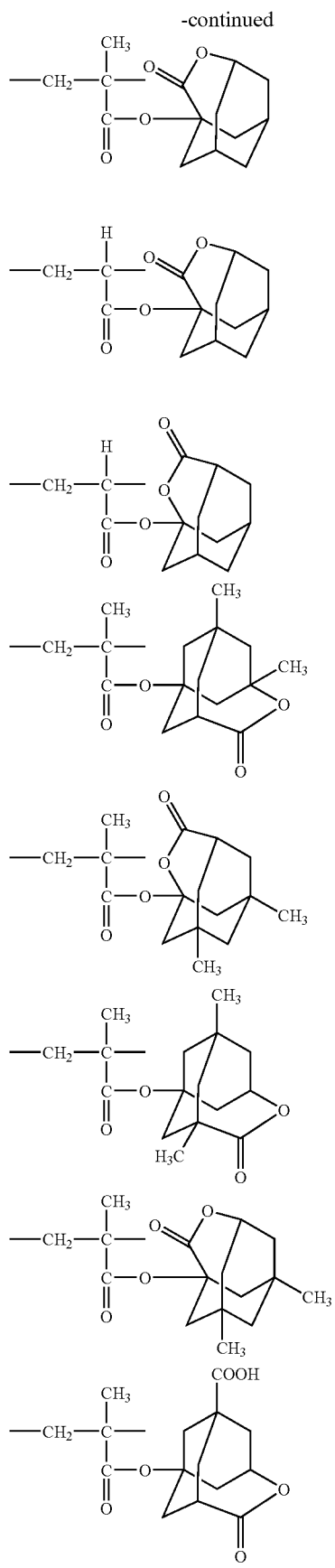
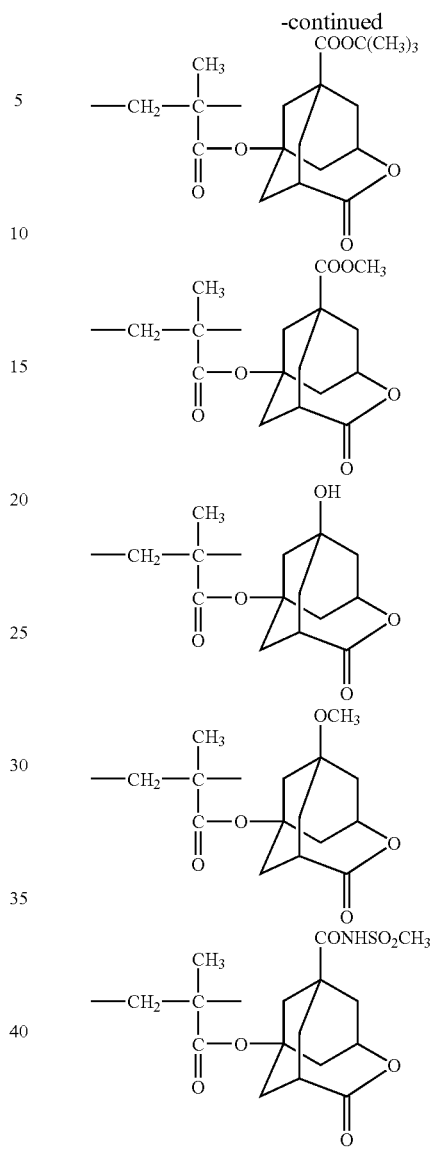

In addition to the repeating units as recited above, the resin (A) can contain various kinds of repeating units for the purposes of adjusting dry etching resistance, standard developer suitability, adhesion to substrates, resist profile and other characteristics generally required for resist, such as resolution, heat resistance and sensitivity.

Examples of repeating units that can meet those purposes include the repeating units corresponding to the monomers recited below, but these examples should not be construed as limiting the scope of the invention.

Incorporation of these repeating units enables fine adjustments of capabilities required for the resin (A) especially:
(1) Coating solvent solubility
(2) Film formability (glass transition temperature)
(3) Alkali developability
(4) Thinning of resist coating (choices of which hydrophobic group and which alkali-soluble group to introduce)
(5) Unexposed areas' adhesion to a substrate
(6) Dry etching resistance.

Examples of monomers from which those repeating units are derived include compounds having one addition-polymerizable unsaturated bond per molecule, which can be selected from acrylic acid esters, methacrylic acid esters, acrylamides, methacrylamides, allyl compounds, vinyl ethers or vinyl esters.

More specifically, those compounds include the following monomers:

Acrylic acid esters (preferably alkyl acrylates which contain 1 to 10 carbon atoms in their respective alkyl moieties), such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate;

Methacrylic acid esters (preferably alkyl methacrylates which contain 1 to 10 carbon atoms in their respective alkyl moieties), such as methyl methacrylate, ethyl methacrylate, propyl methacrylate, isopropyl methacrylate, amyl methacrylate, hexyl methacrylatae, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate;

Acrylamides, such as acrylamide, N-alkylacrylamides (the alkyl moieties of which contain 1 to 10 carbon atoms per molecule, with examples including methyl, ethyl, propyl, butyl, t-butyl, heptyl, ocltyl, cyclohexyl and hydroxyethyl groups), N,N-dialkylacrylamides (the alkyl moieties of which contain 1 to 10 carbon atoms per molecule, with examples including methyl, ethyl, butyl, isobutyl, ethylhexyl and cyclohexyl groups), N-hydroxyethyl-N-methylacrylamide and N-2-acetamidoethyl-N-acetylacrylamide;

Methacrylamides, such as methacrylamide, N-alkylmethacrylamides (the alkyl moieties of which contain 1 to 10 carbon atoms per molecule, with examples including methyl, ethyl, t-butyl, ethylhexyl, hydroxyethyl and cyclohexyl groups), N,N-dialkylmethacrylamides (the alkyl moieties of which include ethyl, propyl and butyl groups) and N-hydroxyethyl-N-methylmethacrylamide;

Allyl compounds, such as allyl esters (e.g., allyl acetate, allyl caproate, allyl caprylate, allyl laurate, allyl palmitate, allyl stearate, allyl benzoate, allyl acetoacetate and allyl lactate) and allyloxyethanol;

Vinyl ethers including alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl-ether and tetrahydrofurfuryl vinyl ether);

Vinyl esters, such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate;

Dialkyl itaconates, such as dimethyl itaconate, diethyl itaconate and dibutyl itaconate;

Dialkyl fumarates and monoalkyl fumarates, such as dibutyl fumarate; and

Other monomers including crotonic acid, itaconic acid, maleic anhydride, maleimide, acrylonitrile, methacrylonitrile and maleylonitrile.

And besides, any of addition-polymerizable unsaturated-compounds may undergo copolymerization so long as they can be copolymerized with monomers corresponding to the various repeating units recited above.

In the acid-decomposable resin, the molar ratio between repeating units of different kinds is determined appropriately for adjusting the resultant resist to have the desired dry etching resistance, standard developer suitability, adhesion to substrates and resist profile, and besides, generally required capabilities, such as resolution, heat resistance and sensitivity.

The suitable content of the repeating units represented by formula (IV) is from 20 to 70 mole %, preferably from 25 to 60 mole %, based on the total repeating units in the resin.

The suitable content of the repeating units having groups represented by formulae (V-1) to (V-4) is from 20 to 70 mole %, preferably from 25 to 60 mole %, based on the total repeating units in the resin.

The suitable content of the repeating units represented by formula (AII) is from 5 to 50 mole %, preferably from 10 to 40 mole %, based on the total repeating units in the present resin.

The content of the repeating units derived from acrylates is generally from 10 to 90 mole %, preferably from 20 to 90 mole %, far preferably from 40 to 80 mole %, particularly preferably from 50 to 75 mole %, based on the total repeating units in the resin.

The suitable content of the repeating units having acid-decomposable groups is from 20 to 60 mole %, preferably from 25 to 55 mole %, far preferably from 30 to 50 mole %, based on the total repeating units in the resin.

The suitable content of the repeating units having partial structures containing alicyclic hydrocarbon groups represented by formulae (pI) to (pVI) is from 30 to 70 mole %, preferably from 35 to 65 mole %, far preferably from 40 to 60 mole %, based on the total repeating units in the resin.

When the present composition is intended for ArF exposure, it is preferable in point of transparency to ArF light that the resin used therein has no aromatic group.

Resins used in the invention can be synthesized in accordance with conventional methods (e.g., radical polymerization). In a general synthesis method, for instance, monomer species are placed in a reaction vessel collectively, or intermittently during the course of reaction, dissolved and homogenized, if needed, in a reaction solvent, e.g., an ether such as tetrahydrofuran, 1,4-dioxane or diisopropyl ether, a ketone such as methyl ethyl ketone or methyl isobutyl ketone, an ester solvent such as ethyl acetate, or a solvent used for dissolving the present composition, such as propylene glycol monomethyl ether acetate, which is mentioned later, and then the polymerization thereof is initiated by use of a commercially available radical initiator (e.g., an initiator of azo type, peroxide) in an atmosphere of inert gas such as nitrogen or argon and, if needed, under heating. The additional initiator is added by the lump or in several portions, if required. At the conclusion of the reaction, the reaction mixture is poured into a solvent, from which the intended polymer is recovered by a powder or solid recovery method.

The concentration of the reaction solution is at least 20% by weight, preferably at least 30% by weight, particularly preferably at least 40% by weight. The reaction temperature is from 10° C. to 150° C., preferably from 30° C. to 120° C., particularly preferably from 50° C. to 100° C.

Each group of the repeating units whose examples are recited above may be used alone or as a mixture of two or more members thereof.

In the invention, one kind of resin may be used, or two or more kinds of resins may be used in combination.

The suitable weight average molecular weight of resins relating to the invention is from 1,000 to 200,000, preferably 3,000 to 20,000, as measured by GPC and calculated in terms of polystyrene. It is not much desirable for those resins to have weight average molecular weight lower than 1,000, because deterioration of thermal resistance and dry etching resistance is observed in the resultant resist. When the resins have weight average molecular weight higher than 200,000, they are responsible for not very good results including decline in developability and lowering of film formability due to their too high viscosities.

The dispersion degree (Nw/Mn) of resin is generally from 1 to 10, preferably from 1 to 5, far preferably from 1 to 4. The smaller dispersion degree enables the higher resolution, the better resist profile, the smoother side wall of the resist pattern and the less edge roughness.

Each resin used in the invention contains the repeating units specified above and has its glass transition temperature in the range of 70 to 155° C., preferably 70 to 150° C., more preferably 80 to 140° C., far preferably 100 to 130° C.

Glass transition temperature (Tg) measurements can be made by scanning calorimetry (with a differential scanning calorimeter).

For synthesizing resins containing the repeating units as specified above and having their glass transition temperatures in the range of 70 to 155° C., the following methods can be adopted.

For controlling the glass transition temperature of resin to the above-specified range, it is required not only to introduce repeating units having the alicyclic structures specified above into the resin but also to control the molecular weight and the dispersion degree (Mw/Mn) of the resin.

It is appropriate that the weight average molecular weight of the resin (A) be generally from 5,000 to 30,000, preferably from 6,000 to 25,000, far preferably from 7,000 to 20,000.

The dispersion degree of the resin (A) is generally 3.5 or below, preferably 3.0 or below, and far preferably 2.5 or below.

When the weight average molecular weight is lower than 5,000 and the dispersion degree is greater than 3.5, there sometimes arises not only a lowering of Tg but also performance deterioration in regard to pitch dependency and side lobe margin.

In order to control the weight average molecular weight and the dispersion degree, the reaction conditions as mentioned above are chosen, and besides, it is preferable to adopt a dropping polymerization method wherein a solution of reactant monomers and a solution of radical polymerization initiator are added dropwise or intermittently in fractional amounts into a solvent heated at a certain temperature.

Further, it is possible to enhance the present effects by removing a low molecular weight portion of resin obtained by polymerization in accordance with a fractional reprecipitation method. The fractional reprecipitation method is a method in which a resin solution is charged into a poor solvent to the resin, or a poor solvent to the resin is poured into a resin solution, thereby removing lower molecular weight oligomers by taking advantage of their high solubility in the solvent.

Examples of a poor solvent to the resin (A) include hydrocarbon solvents, such as n-hexane, n-heptane and toluene, mixtures of hydrocarbon solvents with ester solvents, distilled water, alcohol solvents such as methanol and ethanol, and mixtures of two or more of the solvents recited above.

On the other hand, examples of a solvent in which the resin can dissolve include the reaction solvents recited hereinbefore. The term "low molecular weight oligomers" as used herein is intended to include polymerized substances having weight average molecular weight of, e.g., 4,000 or below.

In the present positive resist composition, it is appropriate that all the resins relating to the invention be mixed in a proportion of 40 to 99.99% by weight, preferably 50 to 99.97% by weight, based on the total solids in the resist.

[2] Compound Capable of Generating Acid Upon Exposure to Actinic Ray or Radiation (Component (B))

The present composition comprises a compound capable of generating an acid upon exposure to an actinic ray or radiation (a photo-acid generator).

Such a photo-acid generator can be selected appropriately from photo-initiators for cationic photo-polymerization, photo-initiators for radical photo-polymerization, photo-decoloring agents for dyes, photo-discoloring agents, known compounds capable of generating acids when irradiated with actinic rays or radiation, such as KrF excimer laser (248 nm), ArF excimer laser (193 nm), $F_2$ excimer laser (157 nm), X-rays or electron beams, which are used in micro resist, or mixtures of two or more thereof.

Examples of a photo-acid generator usable in the invention include onium salts, such as diazonium salts, ammonium salts, phosphonium salts, iodonium salts, sulfonium salts, selenonium salts and arsonium salts; organic halogen compounds; organometallic/halogenated organic compounds; photo-acid generators having protective groups of o-nitrobenzyl type; compounds generating sulfonic acid by photolysis, typically iminosulfonate; and disulfone compounds.

In addition, it is also possible to use polymers having main or side chains in which are introduced the groups or compounds capable of generating acids when irradiated with actinic rays or radiation. Examples of such polymers include the compounds disclosed in U.S. Pat. No. 3,849,137, German Patent No. 3,914,407, JP-A-63-26653, JP-A-55-164824, JP-A-62-69263, JP-A-63-146038, JP-A-63-163452, JP-A-62-153853 and JP-A-63-146029.

Further, the compounds capable of generating acids upon exposure to light as disclosed in U.S. Pat. No. 3,779,778 and European Patent No. 126,712 can be employed.

More specifically, the following compounds are examples of the foregoing photo-acid generators.

(1) Iodonium Salts Represented by the Following Formula (PAG1) or Sulfonium Salts Represented by the Following Formula (PAG2):

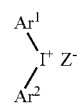

(PAG1)

-continued

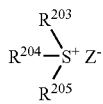
(PAG2)

In the above formula, Ar¹ and Ar² each independently represents a substituted or unsubstituted aryl group. Suitable examples of a substituent of the substituted aryl group include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

$R^{203}$, $R^{204}$ and $R^{205}$ each independently represents a substituted or unsubstituted alkyl or aryl group. Each of them is preferably a 6-14C aryl group, a 1-8C alkyl group or a substituted derivative thereof.

As a substituent the aryl group can have, a 1-8C alkoxy group, a 1-8C alkyl group, a nitro group, a carboxyl group, a hydroxyl group and a halogen atom are suitable. As a substituent the alkyl group can have, a 1-8C alkoxy group, a carboxyl group and an alkoxycarbonyl group are suitable.

$Z^-$ represents a counter anion, with examples including $BF_4^-$, $AsF_6^-$, $PF_6^-$, $SbF_6^-$, $SiF_6^{2-}$, $ClO_4^-$, perfluoroalkanesulfonic acid anions such as $CF_3SO_3^-$, pentafluorobenzenesulfonic acid anion, condensed polynuclear aromatic sulfonic acid anions such as naphthalene-1-sulfonic acid anion, anthraquinonesulfonic acid anion, and dyes containing sulfonic acid groups. However, the counter anion of $Z^-$ should not be construed as being limited to those examples.

In addition, any two of $R^{203}$, $R^{204}$ and $R^{205}$, and Ar¹ and Ar² maybe combined with each other via their respective single bonds or substituent groups.

Examples of those onium salts are illustrated below, but the compounds illustrated below should not be construed as limiting the scope of photo-acid generators usable in the invention.

(PAG1-1)

(PAG1-2)

(PAG1-3)

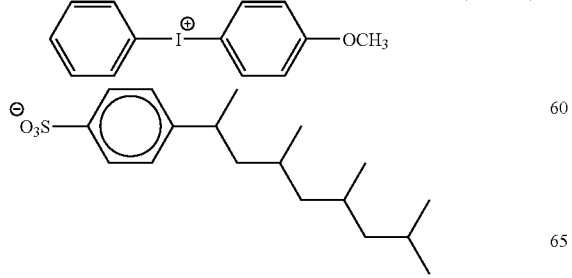

(PAG1-4)

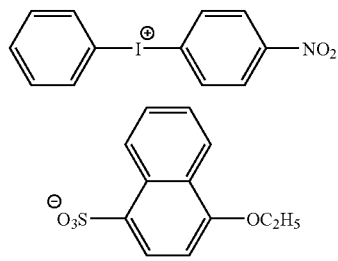

(PAG1-5)

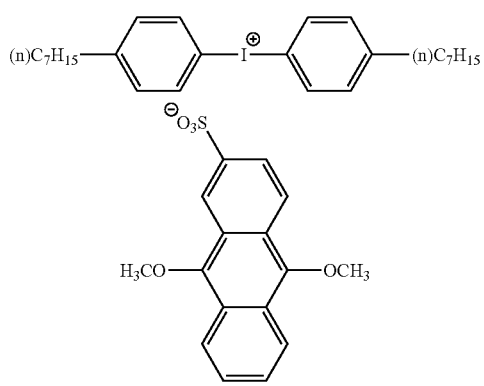

(PAG1-6)

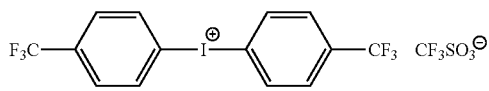

(PAG1-7)

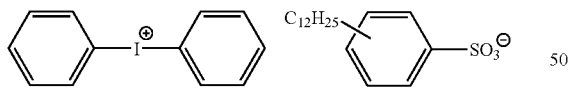

(PAG1-8)

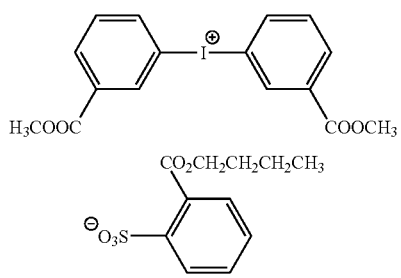

(PAG1-9)

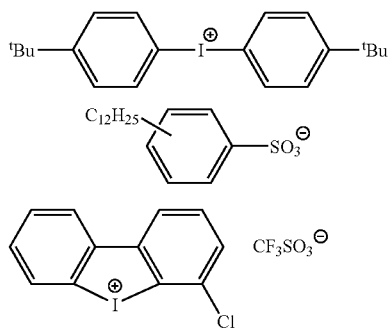

-continued
(PAG1-10)
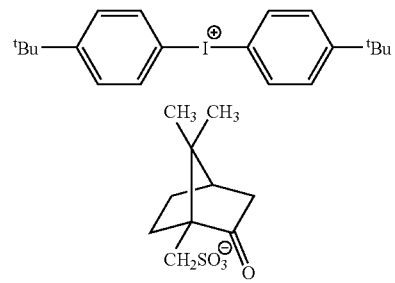
(PAG1-11)
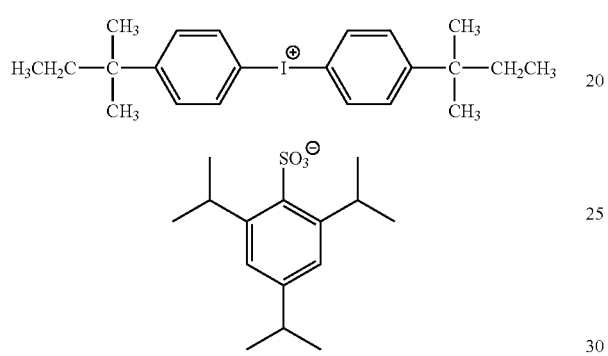
(PAG1-12)
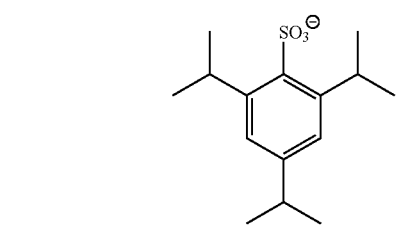
(PAG1-13)
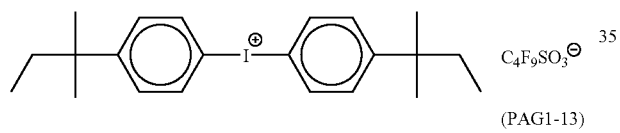
(PAG1-14)
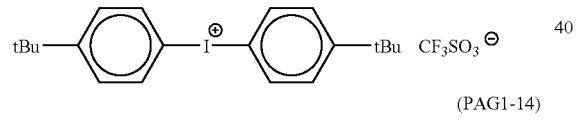
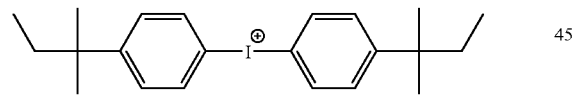
(PAG2-1)
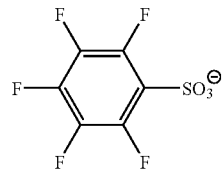
(PAG2-2)
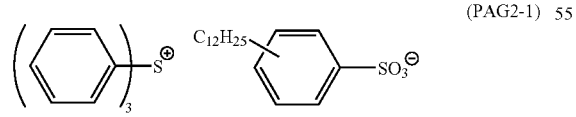
-continued
(PAG2-3)
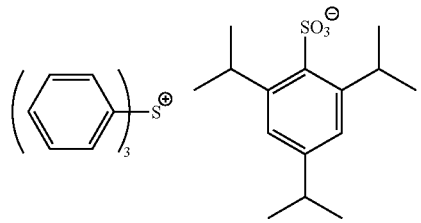
(PAG2-4)
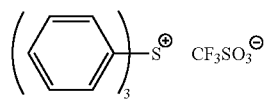
(PAG2-5)
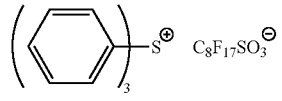
(PAG2-6)
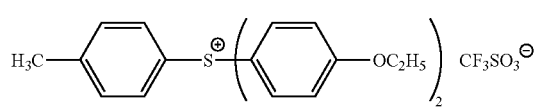
(PAG2-7)
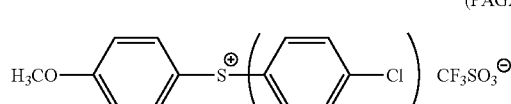
(PAG2-8)
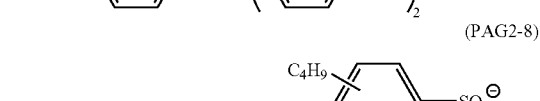
(PAG2-9)
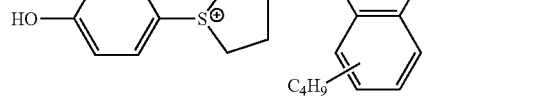
(PAG2-10)
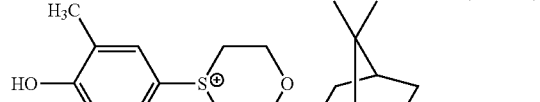
(PAG2-11)

-continued
(PAG2-12)
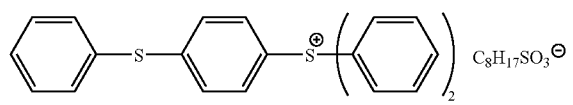
(PAG2-13)
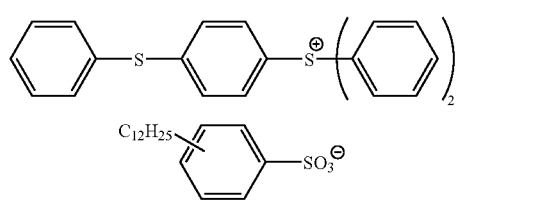
(PAG2-14)
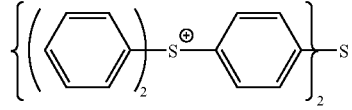
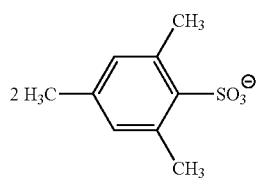
(PAG2-15)
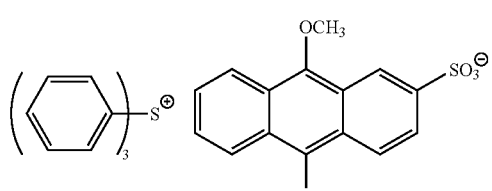
(PAG2-16)
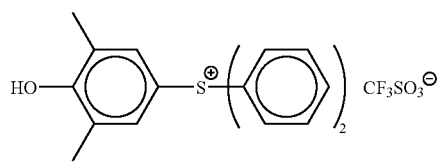
(PAG2-17)
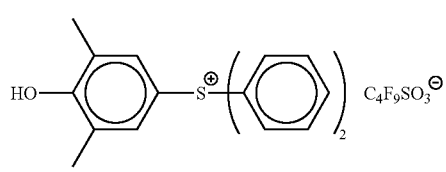
-continued
(PAG2-18)
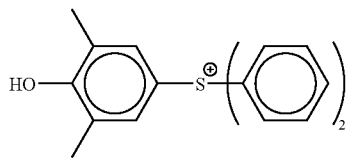
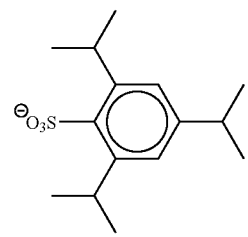
(PAG2-19)
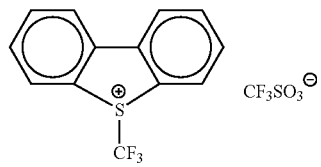
(PAG2-20)
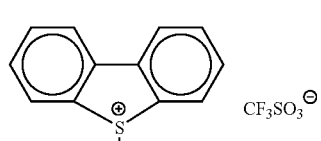
(PAG2-21)
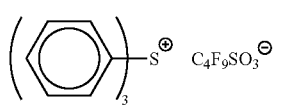
(PAG2-22)
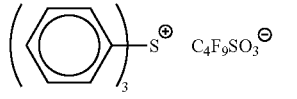
(PAG2-23)
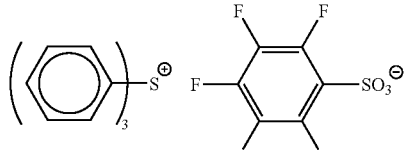
(PAG2-24)
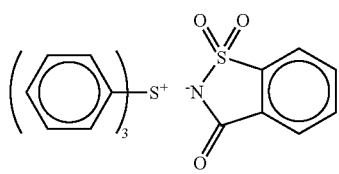

-continued (PAG2-25)

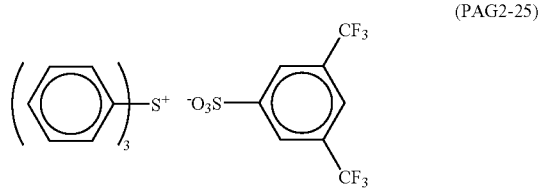

The onium salts represented by formulae (PAG1) and (PAG2) respectively are known compounds and can be synthesized using the methods as disclosed in U.S. Pat. Nos. 2,807,648 and 4,247,473, and JP-A-53-101331.

(2) Disulfone Derivatives Represented by the Following Formula (PAG3) or Iminosulfonate Derivatives Represented by the Following Formula (PAG4):

(PAG3)

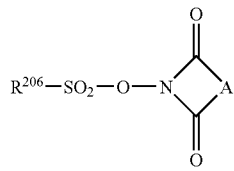
(PAG4)

In the above formulae, $Ar^3$ and $Ar^4$ each independently represents a substituted or unsubstituted aryl group, $R^{206}$ represents a substituted or unsubstituted alkyl or aryl group, and A represents a substituted or unsubstituted alkylene, alkenylene or arylene group.

The compounds illustrated below are examples of those derivatives, but these compounds should not be construed as limiting the scope of photo-acid generators usable in the invention.

(PAG3-1)
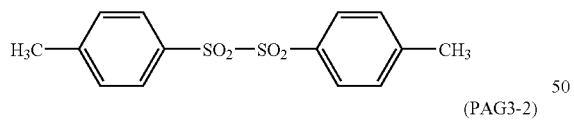

(PAG3-2)
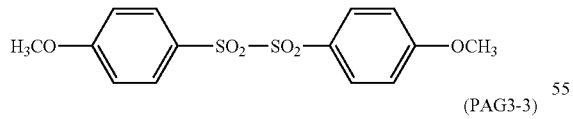

(PAG3-3)
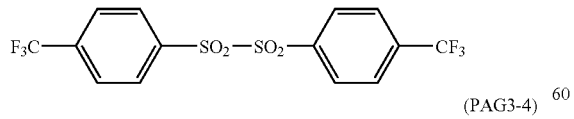

(PAG3-4)
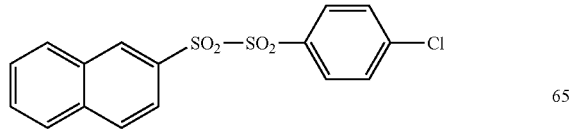

-continued (PAG3-5)
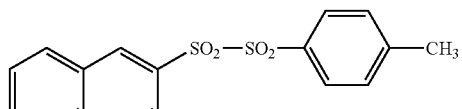

(PAG3-6)
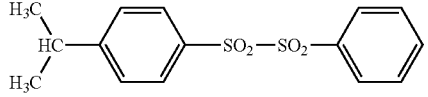

(PAG3-7)
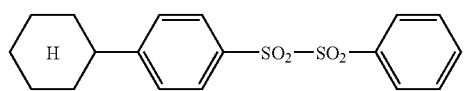

(PAG4-1)
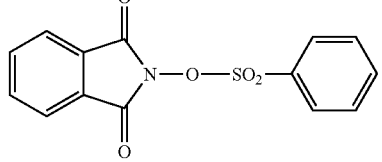

(PAG4-2)
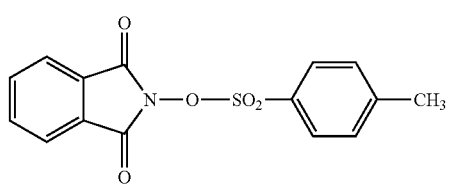

(PAG4-3)
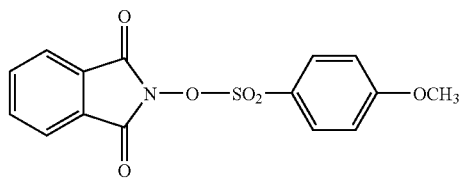

(PAG4-4)
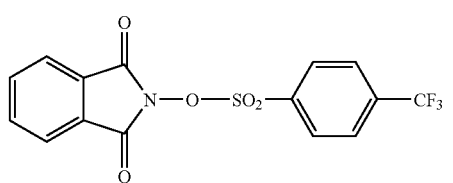

(PAG4-5)
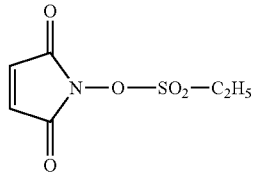

(PAG4-6)
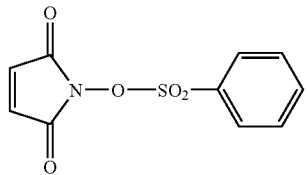

-continued

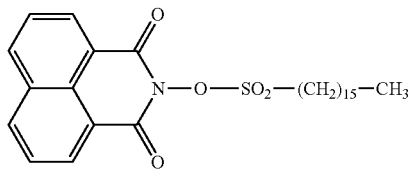
(PAG4-7)

(3) Diazodisulfoen Derivatives Represented by the Following Formula (PAG5):

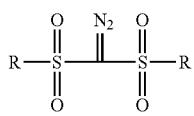
(PAG5)

Herein, R represents a straight-chain, branched or cyclic alkyl group, or an unsubstituted or substituted aryl group.

The following compounds are examples of those derivatives, but these compounds should not be construed as limiting the scope of photo-acid generators usable in the invention.

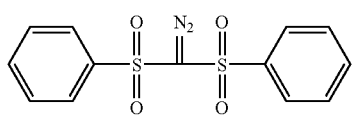
(PAG5-1)

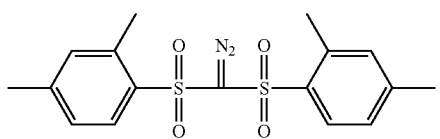
(PAG5-2)

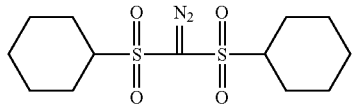
(PAG5-3)

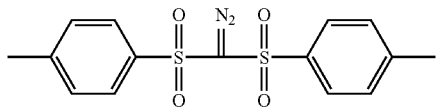
(PAG5-4)

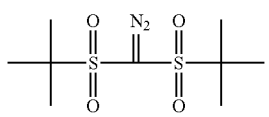
(PAG5-5)

(B1) Triarylsulfonium Salt:

In the invention, a triarylsulfonium salt (B1 Component) in particular is suitable as a photo-acid generator.

The triarylsulfonium salt is defined as the salt having a triarylsulfonium as a cation.

Suitable examples of an aryl group of the triarylsulfonium cation include a phenyl group and a naphthyl group, preferably a phenyl group. Three aryl groups the triarylsulfonium cation has may be the same or different.

Each aryl group may have as a substituent an alkyl group (containing, e.g., 1-15 carbon atoms), an alkoxy group (containing, e.g., 1-15 carbon atoms), a halogen atom, a hydroxyl group or a phenylthio group. Of these substituents, 1-8C alkyl groups, especially a methyl group, an n-butyl group and a t-butyl group, and 1-8C alkoxy groups, especially 1-4C alkoxy groups, are preferred over the others. Alternatively, such a substituent may be attached to any one alone or all of the three aryl groups. Additionally, it is preferable that each substituent is situated at the p-position of each aryl group.

Examples of anions of the triarylsulfonium salts include sulfonic acid anions, preferably alkanesulfonic acid anions substituted with fluorine atoms at their respective 1-positions and benzenesulfonic acid anions substituted with electron attracting groups, far preferably 1-8C perfluoroalkanesulfonic acid anions, particularly preferably perfluorobutanesulfonic acid anion and perfluorooctanesulfonic acid anion. By using these anions, decomposition speeds of the acid-decomposable groups are increased to result in improved sensitivity, and besides, diffusibilities of the acids generated are controlled to result in enhancement of resolution.

In the triarylsulfonium structure may also be present a plurality of triarylsulfonium structures combined with each other via a linkage group such as —S—.

Examples of the foregoing electron attracting groups include a fluorine atom, a chlorine atom, a bromine atom, a nitro group, a cyano group, an alkoxycarbonyl group, an acyloxy group and an acyl group.

Examples of a triarylsulfonium salt usable in the invention are illustrated below, but these examples should not be construed as limiting the scope of the invention.

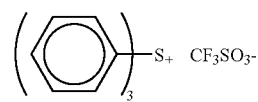
(I-1)

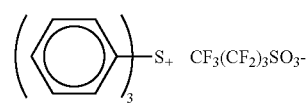
(I-2)

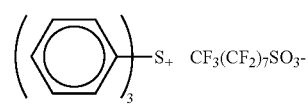
(I-3)

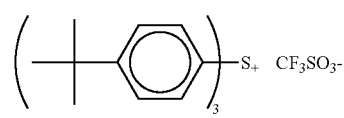
(I-4)

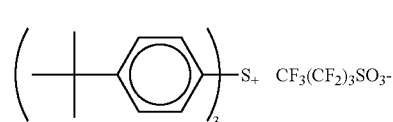
(I-5)

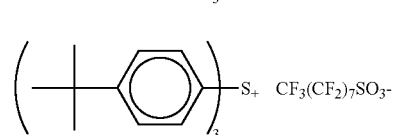
(I-6)

-continued
(I-7)
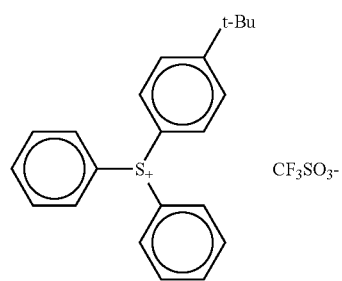 CF₃SO₃⁻
(I-8)
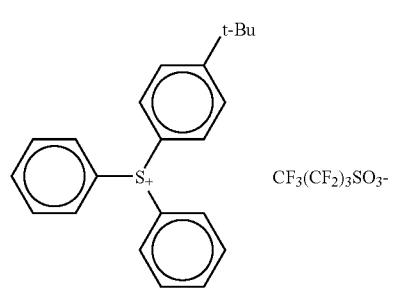 CF₃(CF₂)₃SO₃⁻
(I-9)
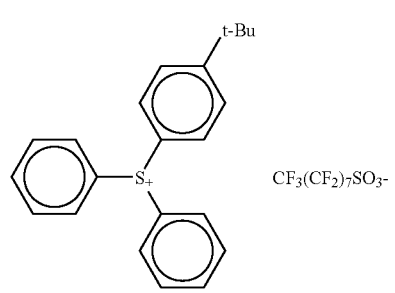 CF₃(CF₂)₇SO₃⁻
(I-10)
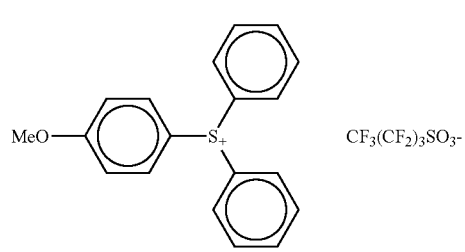 CF₃(CF₂)₃SO₃⁻
(I-11)
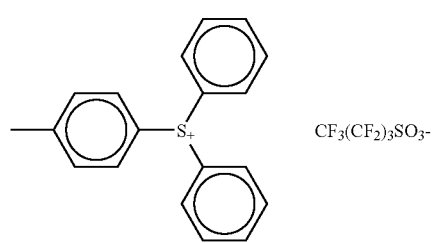 CF₃(CF₂)₃SO₃⁻
(I-12)
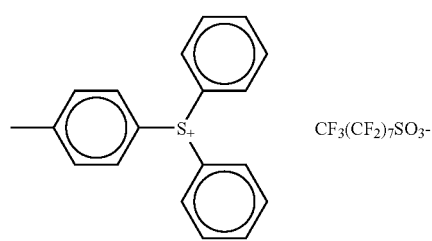 CF₃(CF₂)₇SO₃⁻
-continued
(I-13)
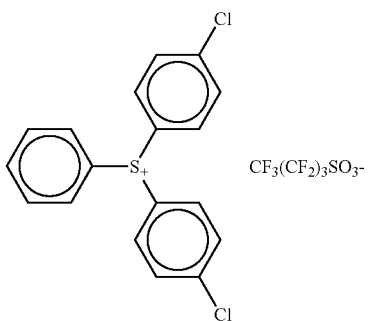 CF₃(CF₂)₃SO₃⁻
(I-14)
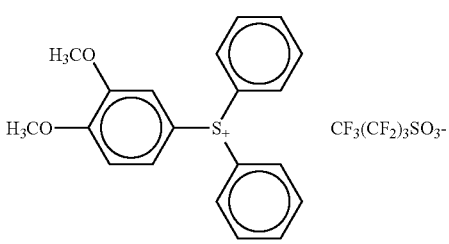 CF₃(CF₂)₃SO₃⁻
(I-15)
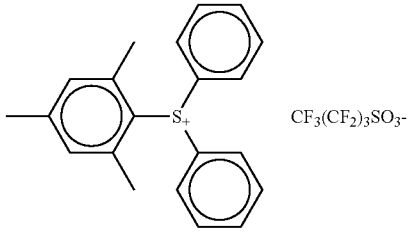 CF₃(CF₂)₃SO₃⁻
(I-16)
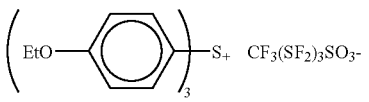 CF₃(SF₂)₃SO₃⁻
(I-17)
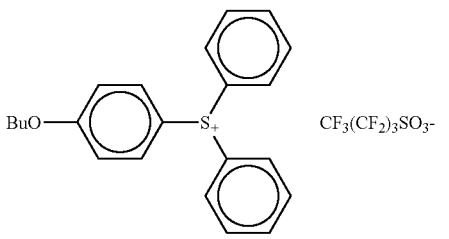 CF₃(CF₂)₃SO₃⁻
(I-18)
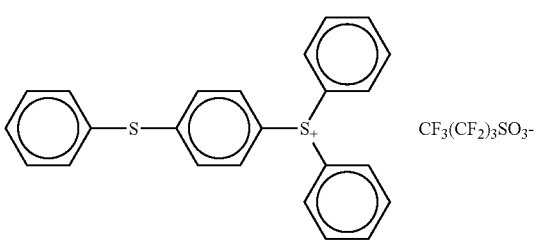 CF₃(CF₂)₃SO₃⁻

-continued
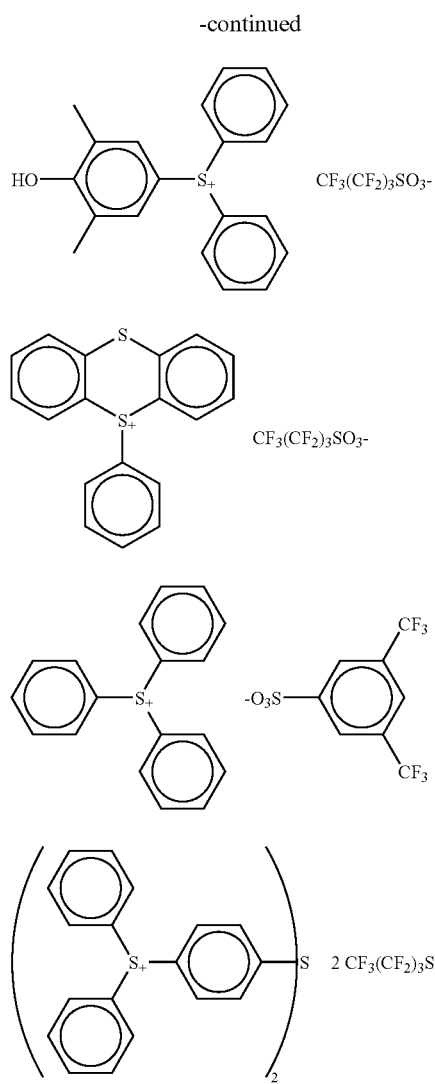
Further, the following compounds are also usable in the invention.
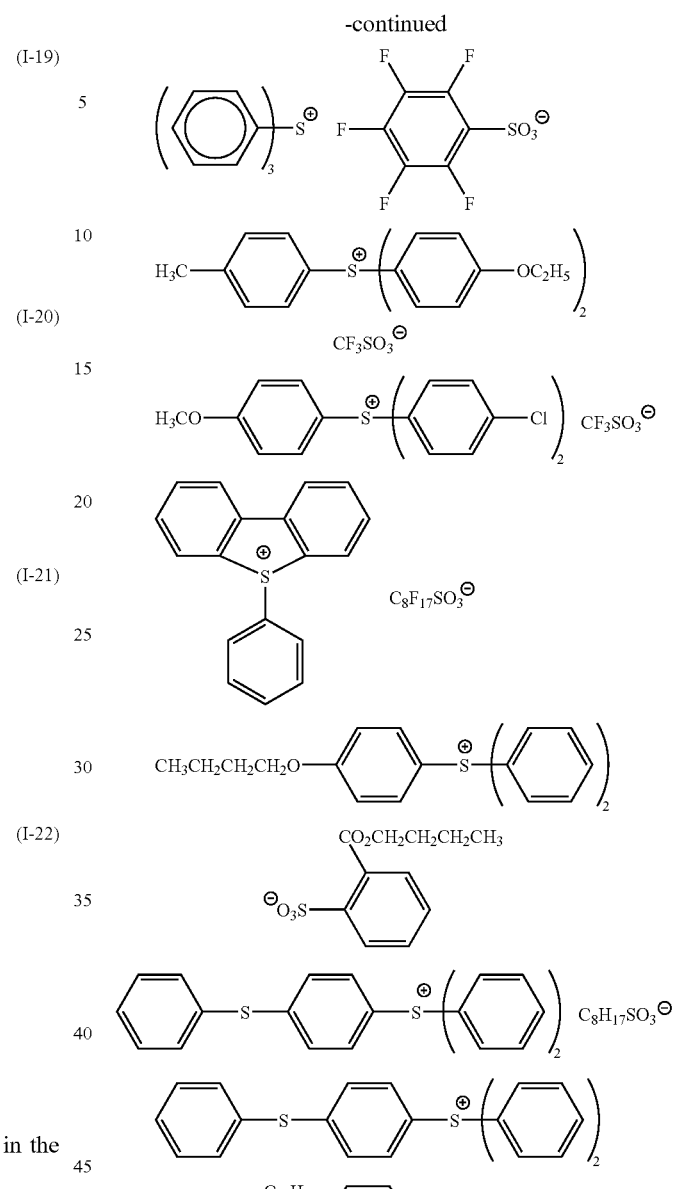
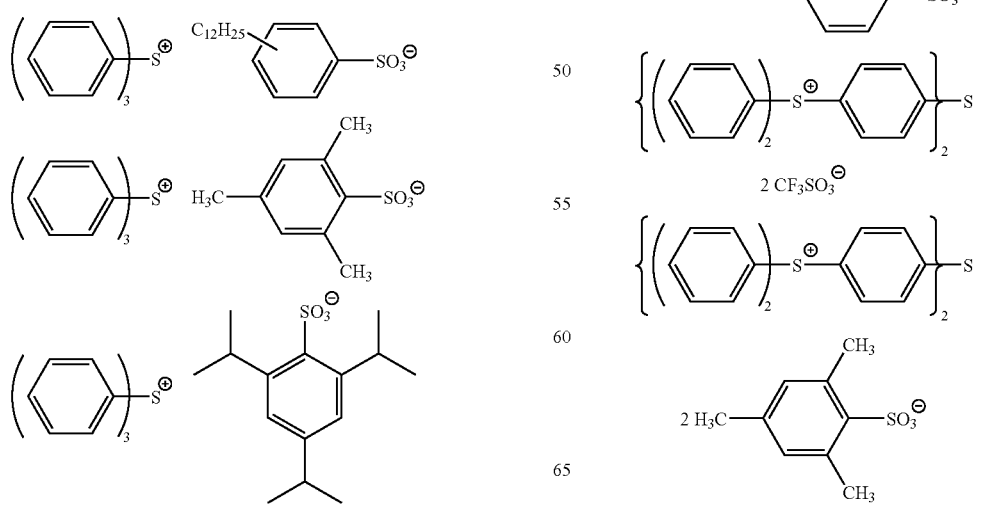

-continued
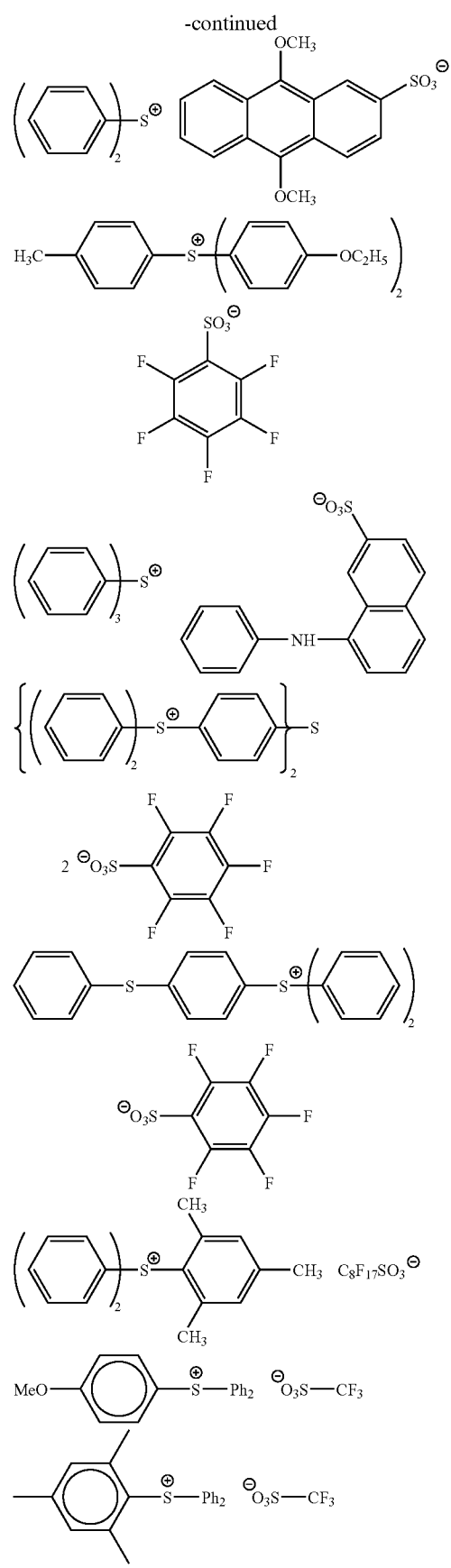
-continued
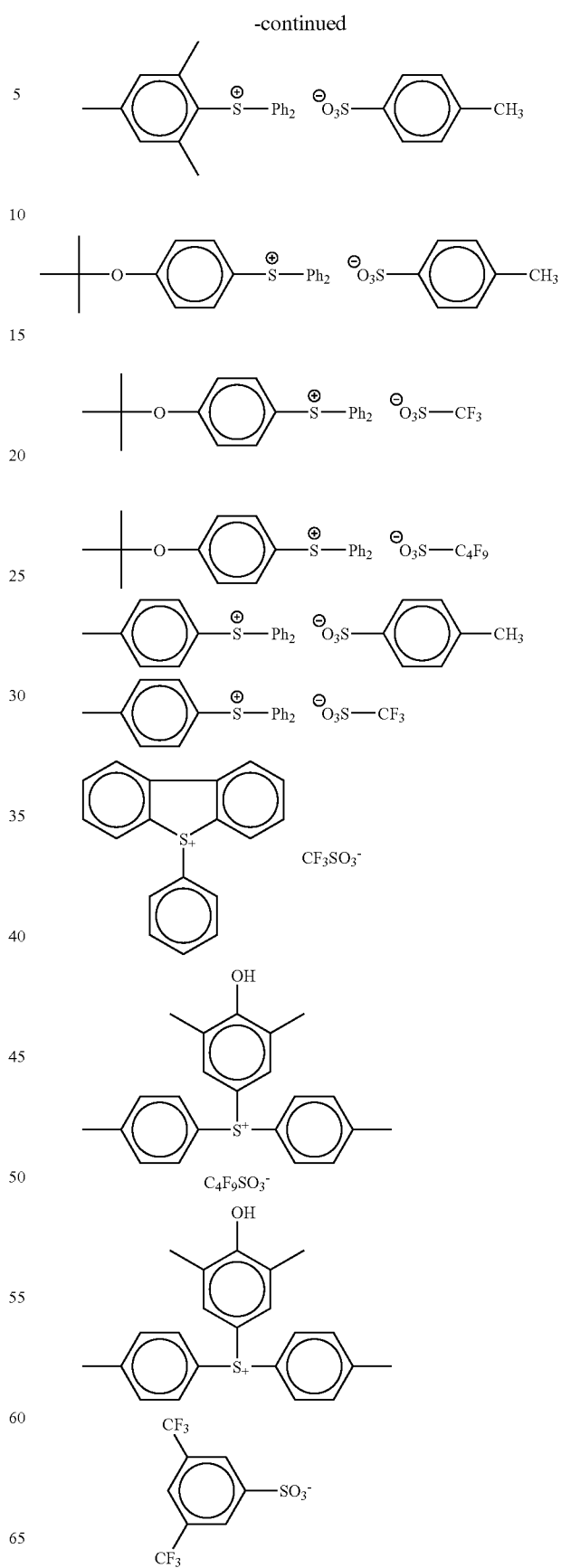

-continued
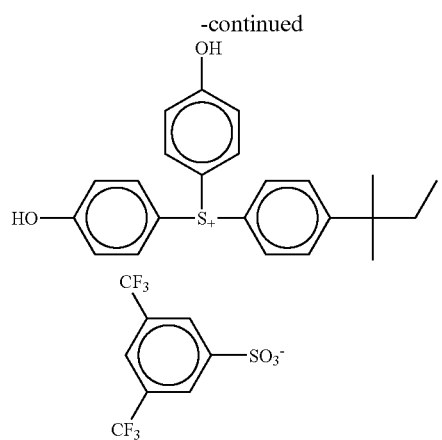
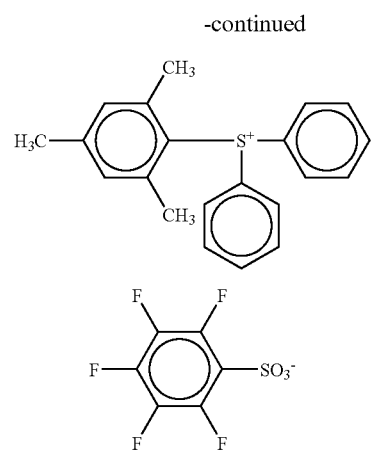
[sI-1]
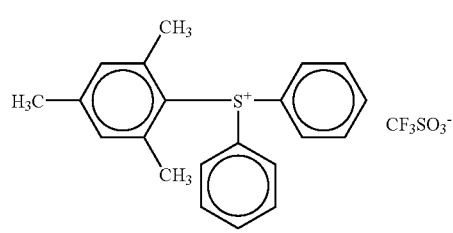
[sI-6]
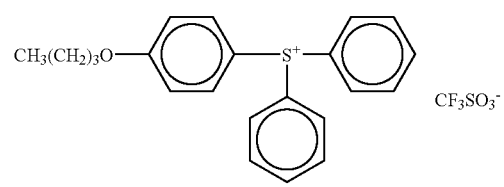
[sI-2]
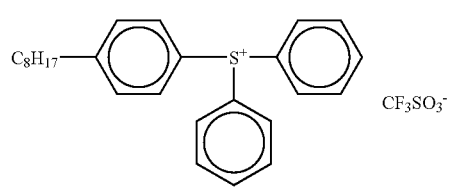
[sI-7]
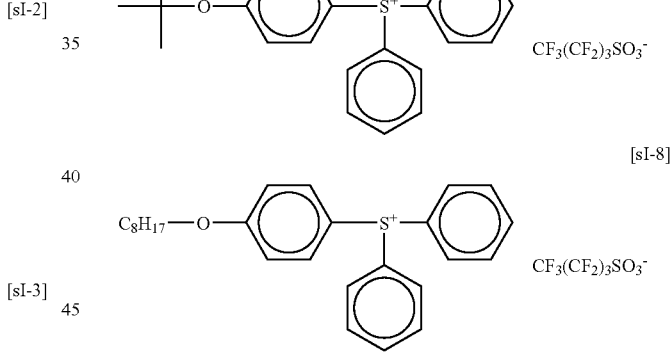
[sI-3]
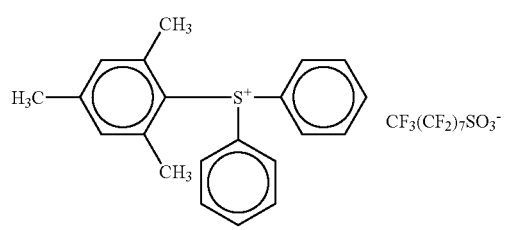
[sI-9]
[sI-8]
[sI-4]
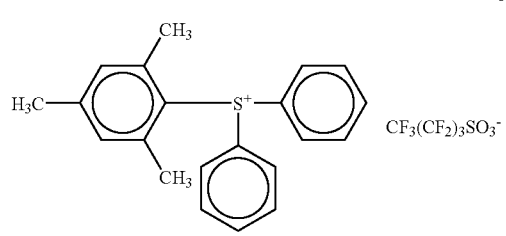
[sI-10]
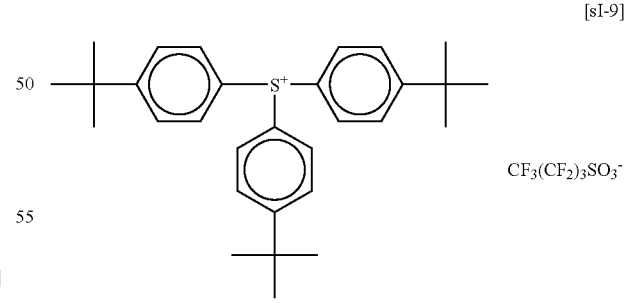

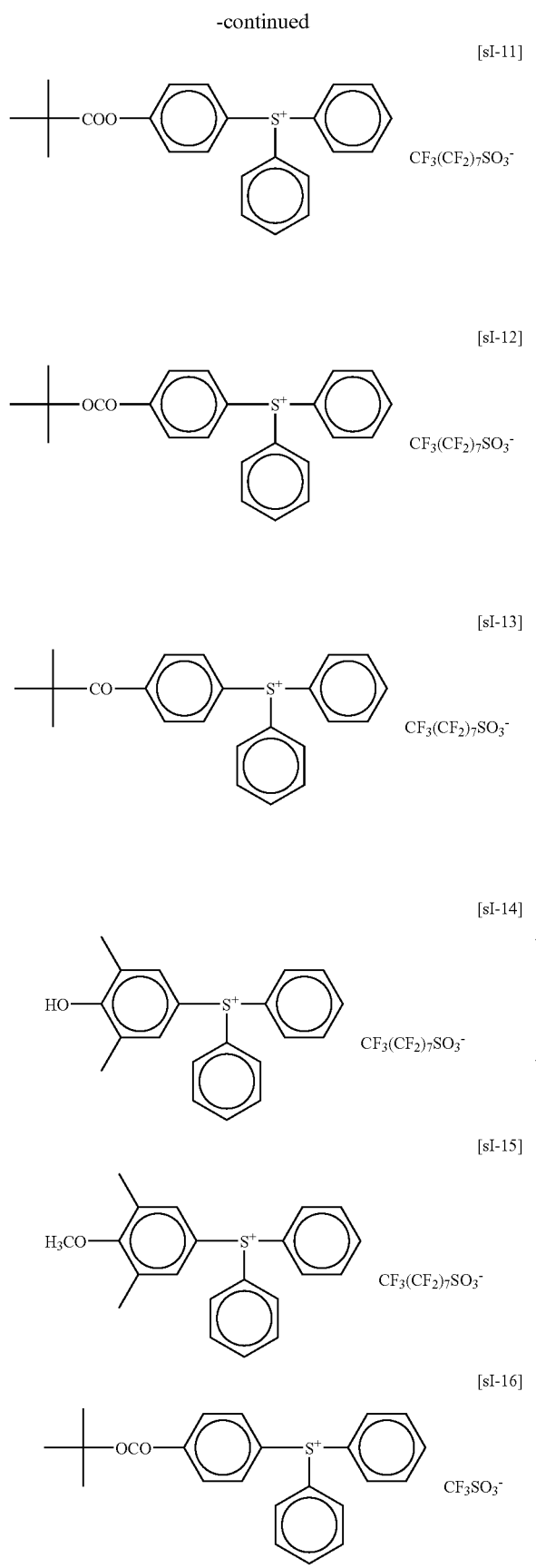
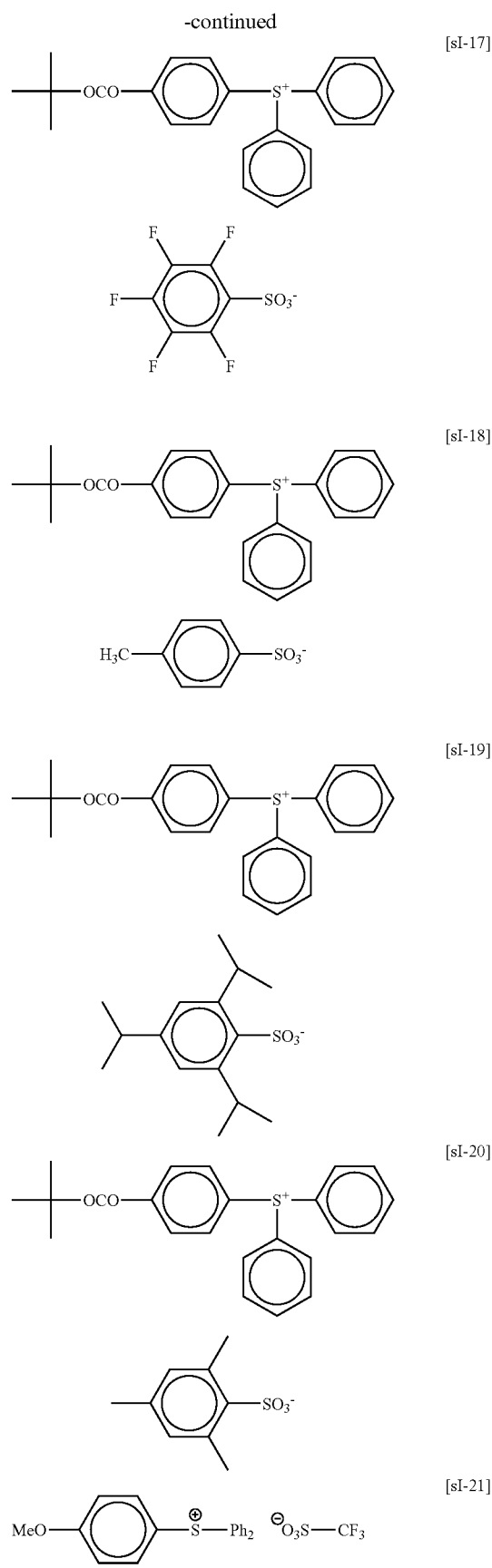

-continued

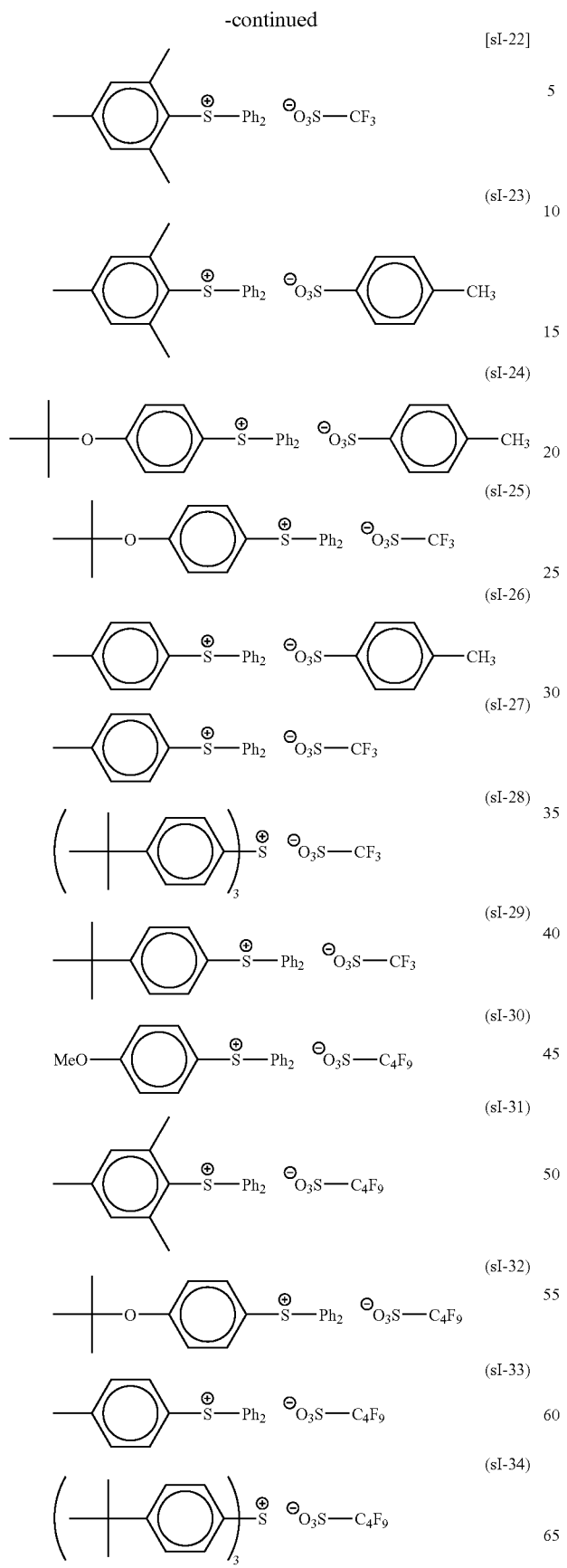

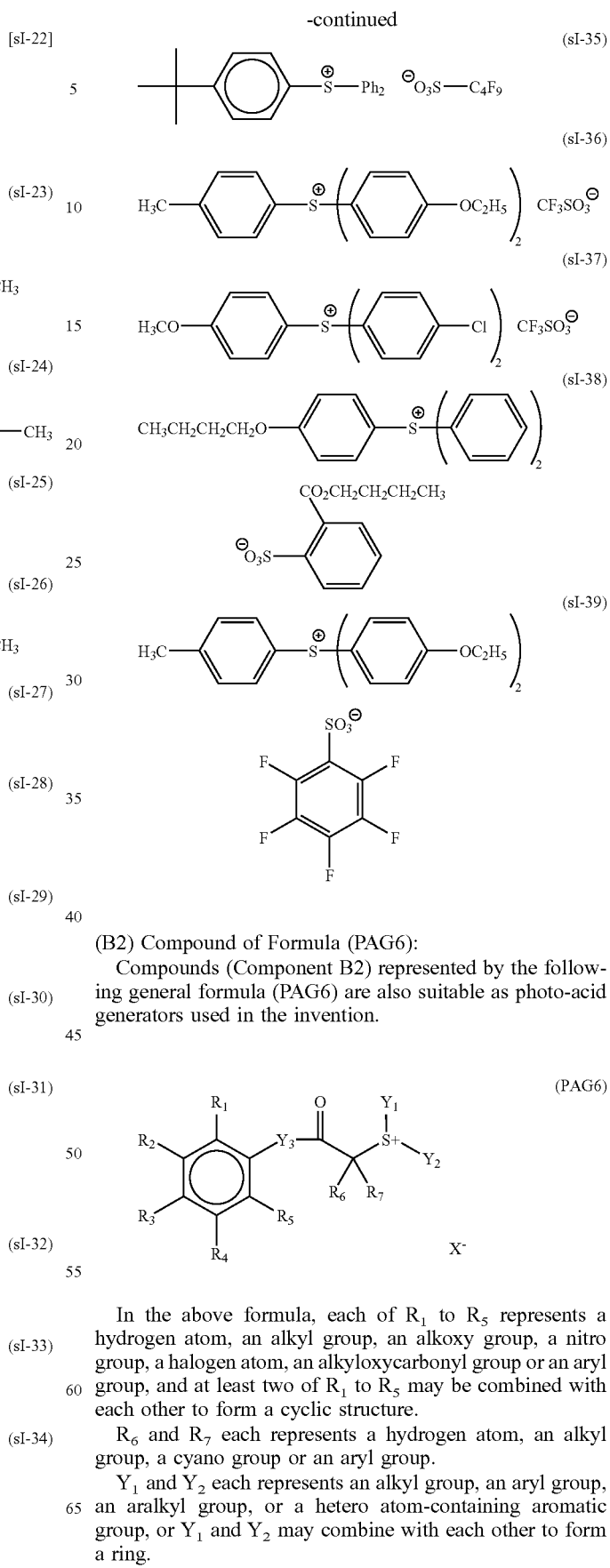

(B2) Compound of Formula (PAG6):

Compounds (Component B2) represented by the following general formula (PAG6) are also suitable as photo-acid generators used in the invention.

In the above formula, each of $R_1$ to $R_5$ represents a hydrogen atom, an alkyl group, an alkoxy group, a nitro group, a halogen atom, an alkyloxycarbonyl group or an aryl group, and at least two of $R_1$ to $R_5$ may be combined with each other to form a cyclic structure.

$R_6$ and $R_7$ each represents a hydrogen atom, an alkyl group, a cyano group or an aryl group.

$Y_1$ and $Y_2$ each represents an alkyl group, an aryl group, an aralkyl group, or a hetero atom-containing aromatic group, or $Y_1$ and $Y_2$ may combine with each other to form a ring.

$Y_3$ represents a single bond or a divalent linkage group.

$X^-$ represents a non-nucleophilic anion.

Therein, however, it is required that at least one of $R_1$ to $R_5$ and at least either $Y_1$ or $Y_2$ are combined with each other to form a ring, or it is required that at least one of $R_1$ to $R_5$ and at least either $R_6$ or $R_7$ are combined with each other to form a ring.

Additionally, the compound of Component B2 may be a compound formed by combining at least two structures as represented by formula (PAG6) via a linkage group at the position of any of $R_1$ to $R_7$ or either $Y_1$ or $Y_2$ in each structure.

The alkyl group represented by each of $R_1$ to $R_7$ is a substituted or unsubstituted alkyl group, preferably a 1-5C alkyl group. Examples of such an unsubstituted alkyl group include methyl, ethyl, propyl, n-butyl, sec-butyl and t-butyl groups.

The alkoxy group represented by each of $R_1$ to $R_5$ or the alkoxy moiety of alkyloxycarbonyl group represented by each of $R_1$ to $R_5$ is a substituted or unsubstituted alkoxy group, preferably a 1-5C alkoxy group. Examples of such an unsubstituted alkoxy group include methoxy, ethoxy, propoxy and butoxy groups.

The aryl group represented by each of $R_1$ to $R_7$, $Y_1$ and $Y_2$ is a substituted or unsubstituted aryl group, preferably a 6-14C aryl group. Examples of such an unsubstituted aryl group include phenyl, tolyl and naphthyl groups.

The halogen atom represented by each of $R_1$ to $R_5$ is a fluorine, chlorine, bromine or iodine atom.

The alkyl group represented by each of $Y_1$ and $Y_2$ is a substituted or unsubstituted alkyl group, preferably a 1-30C alkyl group. Examples of such an unsubstitued alkyl group include linear and branched alkyl groups, such as methyl, ethyl, propyl, n-butyl, sec-butyl and t-butyl groups, and cyclic alkyl groups, such as cyclopropyl, cyclopentyl, cyclohexyl, adamantyl, norbornyl and bornyl groups.

The aralkyl group represented by each of $Y_1$ and $Y_2$ is a substituted or unsubstituted aralkyl group, preferably a 7-12C aralkyl group. Examples of such an unsubstituted aralkyl group include benzyl, phenetyl and cumyl groups.

The hetero atom-containing aromatic group is intended to include 6-14C aryl groups containing hetero atoms, such as nitrogen, oxygen and sulfur atoms, in their respective aromatic rings.

The hetero atom-containing aromatic group represented by each of $Y_1$ and $Y_2$ is a substituted or unsubstituted aromatic group containing a hetero atom or hetero atoms. Examples of such an unsubstituted aromatic group include heterocyclic aromatic hydrocarbon groups, such as furanyl, thiophenyl, pyrrolyl, pyridyl and indolyl groups.

$Y_1$ and $Y_2$ may be combined with each other and form a ring together with the $S^+$ in formula (PAG6) In this case, the group formed by combining $Y_1$ and $Y_2$ is, e.g., a 4-10C alkylene group, preferably a butylene, pentylene or hexylene group, particularly preferably a butylene or pentylene group.

Further, the ring formed of the $Y_1$-$Y_2$ combination and the $S^+$ in formula (PAG6) may contain a hetero atom or hetero atoms.

Each of the alkyl, alkoxy, alkoxycarbonyl, aryl and aralkyl groups as recited above may have a substituent group, such as a nitro group, a halogen atom, a carboxyl group, a hydroxyl group, an amino group, a cyano group, an alkoxy group (preferably containing 1 to 5 carbon atoms) Further, the aryl and aralkyl groups each may be substituted with an alkyl group (preferably containing 1 to 5 carbon atoms).

As substituents the alkyl group can have, halogen atoms are suitable.

$Y_3$ represents a single bond or a divalent linkage group. Suitable examples of such a divalent linkage group include alkylene and arylene groups which may have substituents, —O—, —S—, —CO—, —CONR— (wherein R is a hydrogen atom, an alkyl group or an acyl group), and linkage groups formed by combining at least two of the groups recited above.

The non-nucleophilic anion represented by $X^-$ is a sulfonic acid anion or a carboxylic acid anion.

The non-nucleophilic anion refers to the anion that has very low capability to cause nucleophilic reaction and can inhibit the compound from decomposing through intramolecular nucleophilic reaction with the lapse of time. By this anion, the storage stability of the resist is enhanced.

Examples of a sulfonic acid anion include alkylsulfonic acid anions, arylsulfonic acid anions and camphorsulfonic acid anions.

Examples of a carboxylic acid anion include alkylcarboxylic acid anions, arylcarboxylic acid anions and aralkylcarboxylic acid anions.

Suitable examples of an alkyl moiety in each of the alkylsulfonic acid anions include 1-30C alkyl groups, such as a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

Suitable examples of an aryl moiety in each of the arylsulfonic acid anions include 6-14C aryl groups, such as a phenyl group, a tolyl group and a naphthyl group.

The alkyl moieties in the alkylsulfonic acid anions and the aryl moieties in the arylsulfonic acid anions may have substituents.

Examples of such substituents include halogen atoms, alkyl groups, alkoxy groups and alkylthio groups.

Examples of such halogen atoms include chlorine, bromine, fluorine and iodine atoms.

Examples of such alkyl groups include, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecy group, a tetradecyl group, a pentadecyl group, a hexadecyl group, a heptadecyl group, an octadecyl group, a nonadecyl and an eicosyl group, preferably 1-15C alkyl groups.

Suitable examples of such alkoxy groups include 1-5C alkoxy groups, such as methoxy, ethoxy, propoxy and butoxy groups.

Examples of such alkylthio groups include a methylthio group, an ethylthio group, a propylthio group, an isopropylthio group, an n-butylthio group, an isobutylthio group, a sec-butylthio group, a pentylthio group, a neopentylthio group, a hexylthio group, a heptylthio group, an octylthio group, a nonylthio group, a decylthio group, an undecyltho group, a dodecylthio group, a tridecylthio group, a tetradecylthio group, a pentadecylthio group, a hexadecylthio group, a heptadecylthio group, an octadecylthio group, a nonadecylthio group and an eicosylthio group, preferably 1-15C alkylthio groups. Additionally, the alkyl groups, the alkoxy groups and the alkylthio groups as recited above may further be substituted with halogen atoms (preferably fluorine atoms).

Examples of alkyl moieties in the alkylcarboxylic acid anions include the same alkyl groups as recited in regard to the alkylsulfonic acid anions.

Examples of aryl moieties in the arylcarboxylic acid anions include the same aryl groups as recited in regard to the arylsulfonic acid anions.

Suitable examples of aralkyl moieties in the aralkylcarboxylic acid anions include 6-12C aralkyl groups, such as a benzyl group, a phenetyl group, a naphthylmethyl group and a naphthylethyl group.

The alkyl, aryl and aralkyl moieties present in the alkylcarboxylic, arylcarboxylic and aralkylcarboxylic acid anions respectively may have substituents. Examples of such substituents include the same halogen atoms, alkyl groups, alkoxy groups and alkylthio groups as in the case of the arylsulfonic acid anions.

Examples of other non-nucleophilic anions include $PF_6^-$, $BF_4^-$ and $SbF_6^-$.

In the present formula (PAG6), a ring is formed by combining at least one of $R_1$ to $R_5$ with at least either $Y_1$ or $Y_2$, or by combining at least one of $R_1$ to $R_5$ with at least either $R_7$ or $R_8$. By forming the ring, the three-dimensional structure of the compound of formula (PAG6) is made fast, and the light resolution is enhanced.

Also, the compound may contain at least two structures as represented by formula (PAG6) which are combined with each other via a linkage group at the position of any of $R_1$ to $R_7$ or either $Y_1$ or $Y_2$ in each structure.

Examples of the compound represented by formula (PAG6) are illustrated below, but these examples should not be construed as limiting the scope of the invention.

(PAG6A-1)

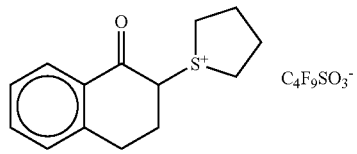

(PAG6A-2)

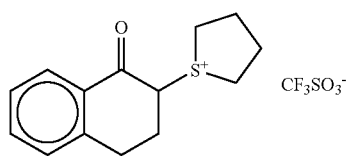

(PAG6A-3)

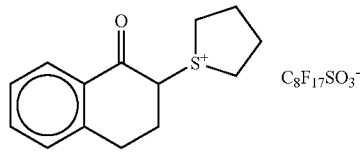

(PAG6A-4)

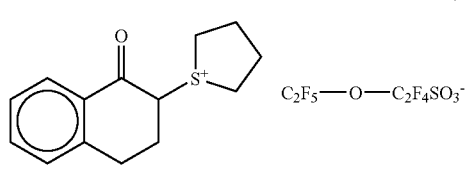

-continued (PAG6A-5)

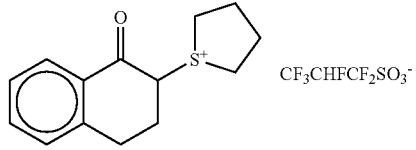

(PAG6A-7)

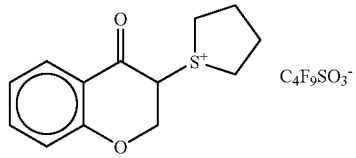

(PAG6A-10)

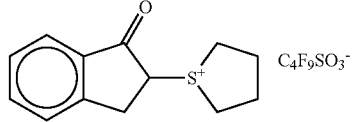

(PAG6A-13)

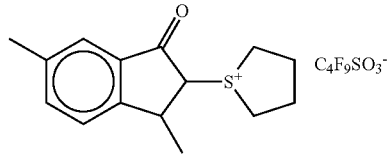

(PAG6A-17)

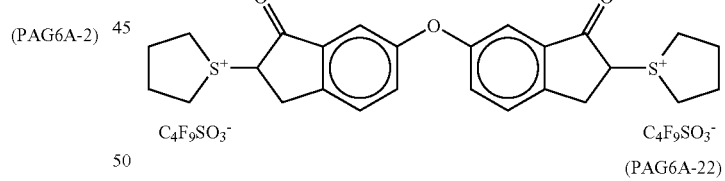

(PAG6A-22)

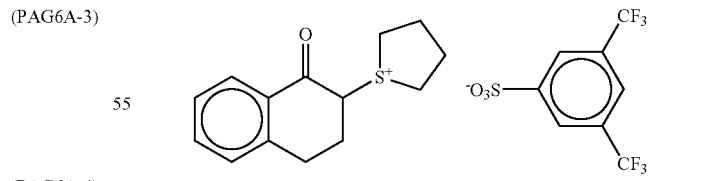

(PAG6A-23)

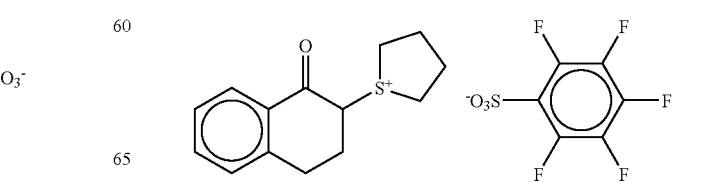

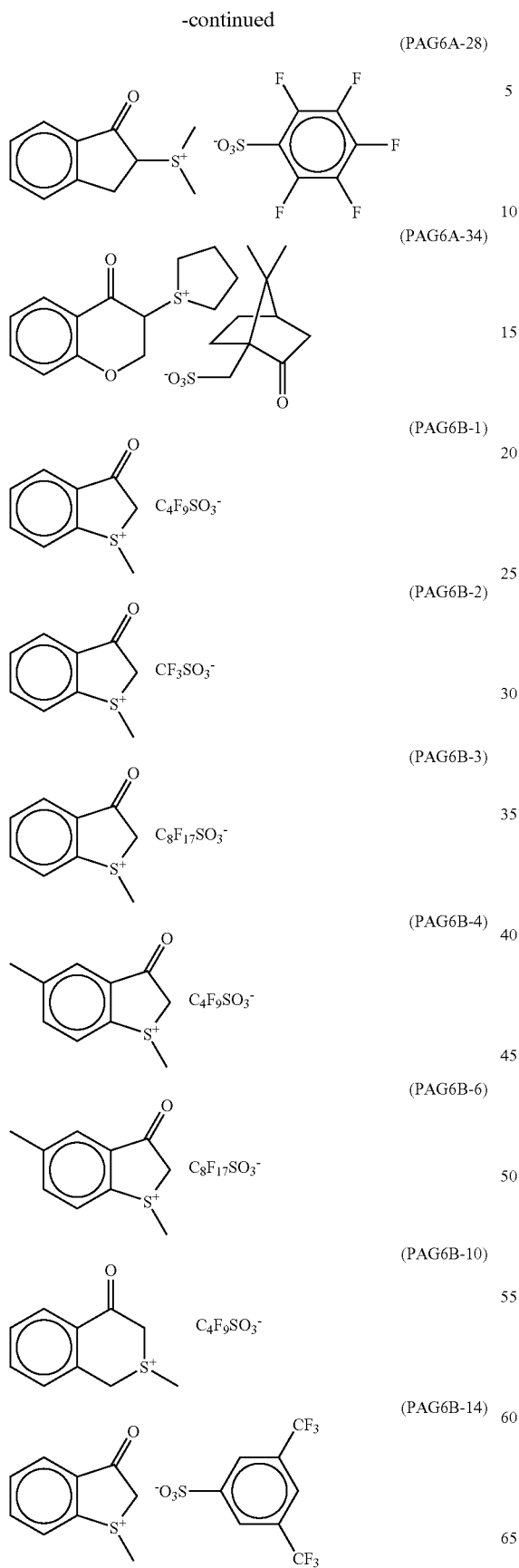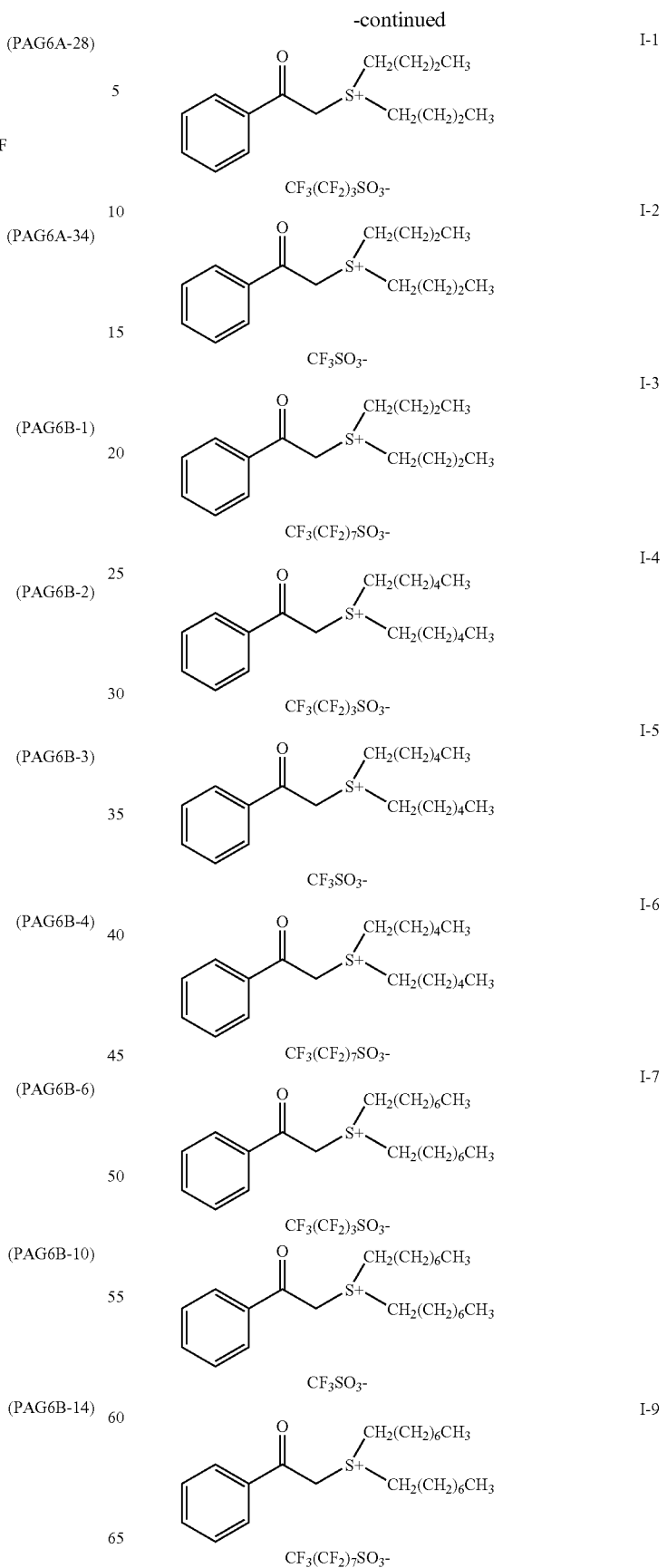

-continued
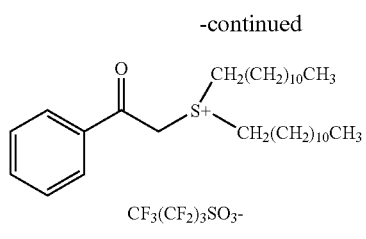
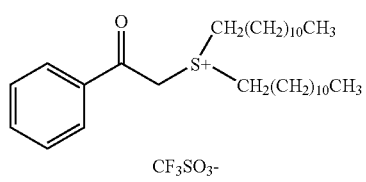
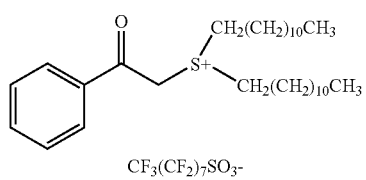
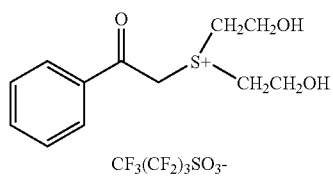
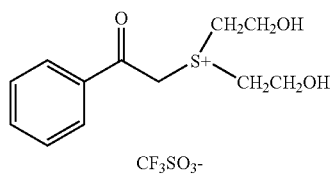
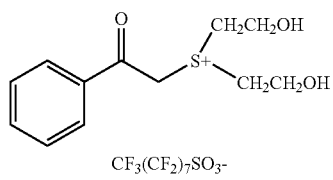
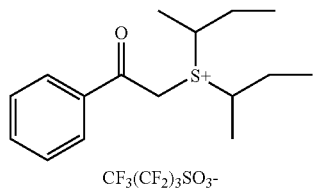
-continued
I-10
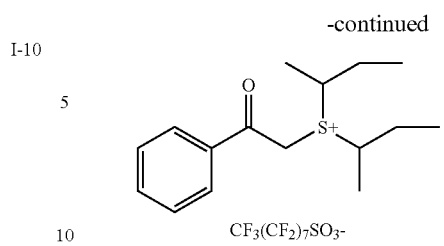
I-11
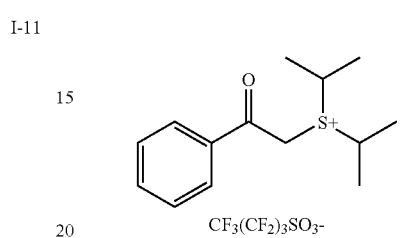
I-12
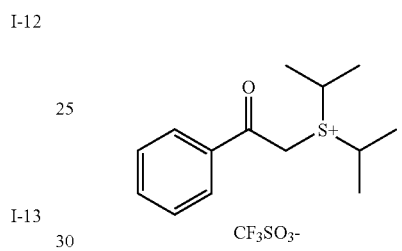
I-13
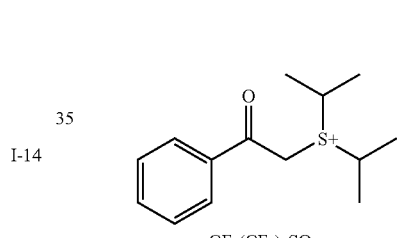
I-14
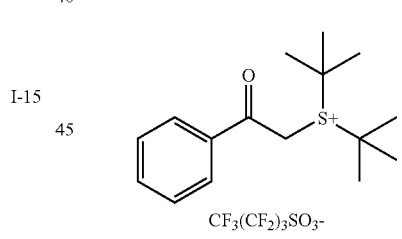
I-15
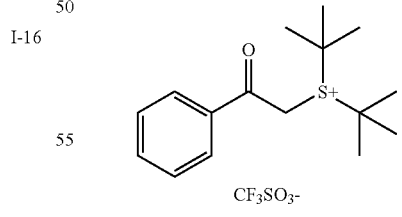
I-16
I-17
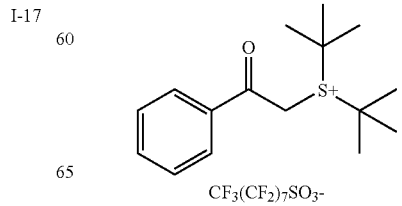
I-18
I-19
I-20
I-21
I-22
I-23
I-24

-continued
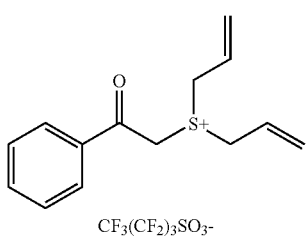
CF₃(CF₂)₃SO₃⁻
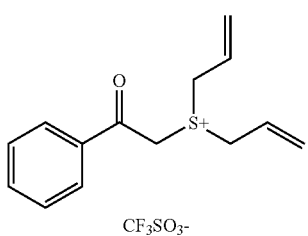
CF₃SO₃⁻
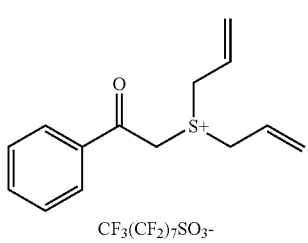
CF₃(CF₂)₇SO₃⁻
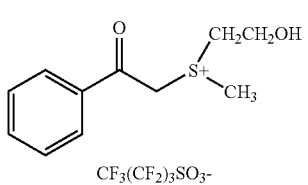
CF₃(CF₂)₃SO₃⁻
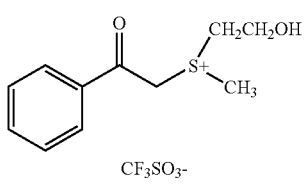
CF₃SO₃⁻
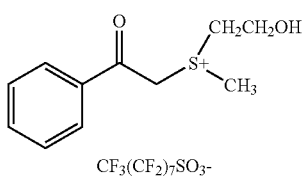
CF₃(CF₂)₇SO₃⁻
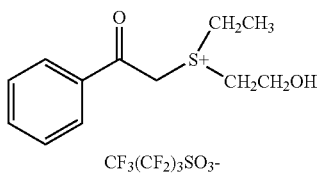
CF₃(CF₂)₃SO₃⁻
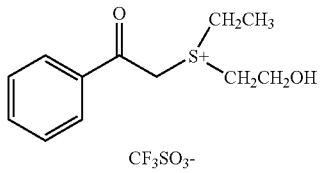
CF₃SO₃⁻
-continued
I-25
I-26
I-27
I-28
I-29
I-30
I-31
I-32
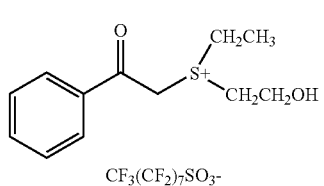
CF₃(CF₂)₇SO₃⁻
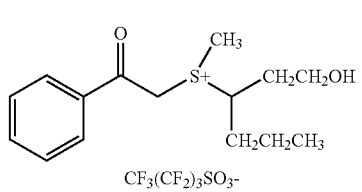
CF₃(CF₂)₃SO₃⁻
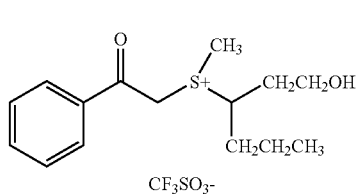
CF₃SO₃⁻
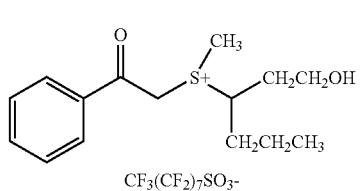
CF₃(CF₂)₇SO₃⁻
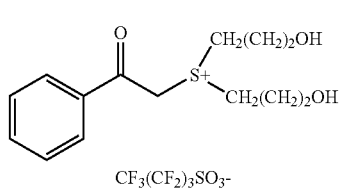
CF₃(CF₂)₃SO₃⁻
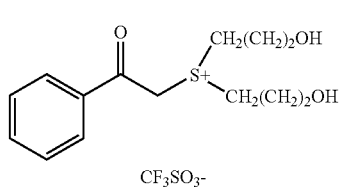
CF₃SO₃⁻
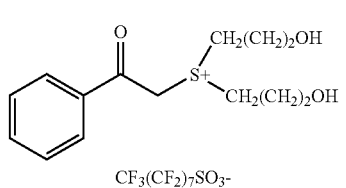
CF₃(CF₂)₇SO₃⁻
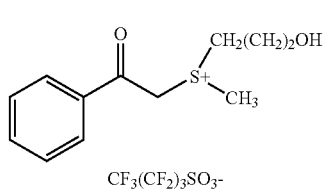
CF₃(CF₂)₃SO₃⁻
I-33
I-34
I-35
I-36
I-37
I-38
I-39
I-40

-continued
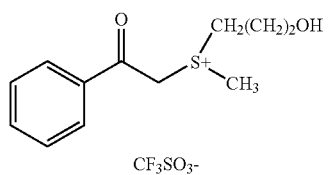
CF₃SO₃⁻
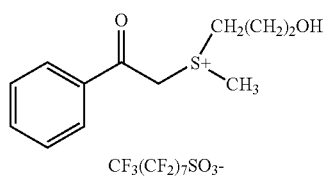
CF₃(CF₂)₇SO₃⁻
I-43
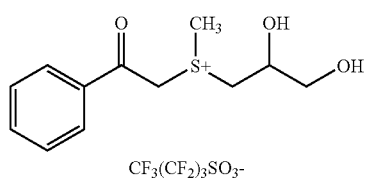
CF₃(CF₂)₃SO₃⁻
I-44
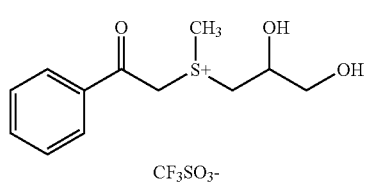
CF₃SO₃⁻
I-45
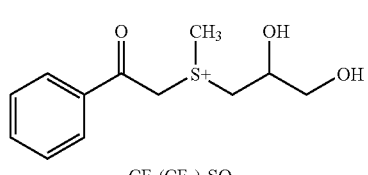
CF₃(CF₂)₇SO₃⁻
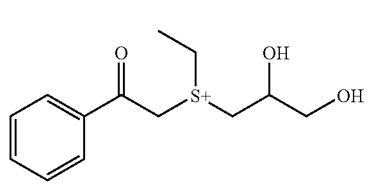
CF₃(CF₂)₃SO₃⁻
I-47
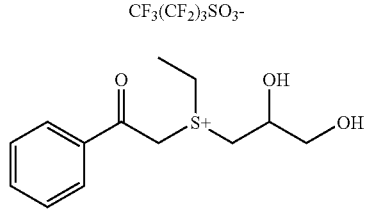
CF₃SO₃⁻
I-48
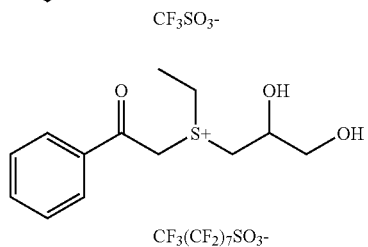
CF₃(CF₂)₇SO₃⁻
-continued
I-41
I-42
I-49
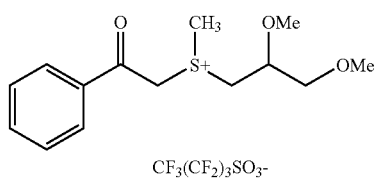
CF₃(CF₂)₃SO₃⁻
I-50
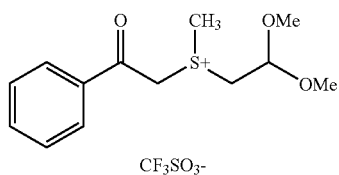
CF₃SO₃⁻
I-51
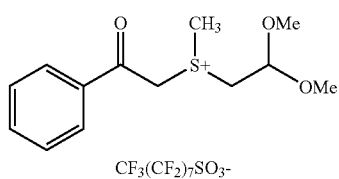
CF₃(CF₂)₇SO₃⁻
I-52
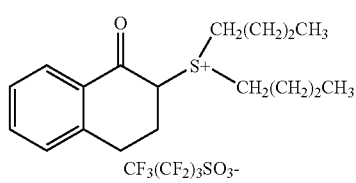
CF₃(CF₂)₃SO₃⁻
I-53
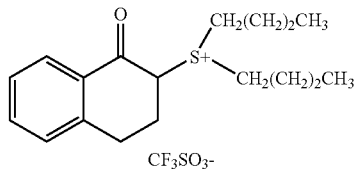
CF₃SO₃⁻
I-54
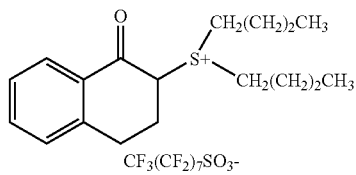
CF₃(CF₂)₇SO₃⁻
I-55
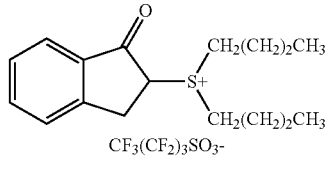
CF₃(CF₂)₃SO₃⁻
I-56
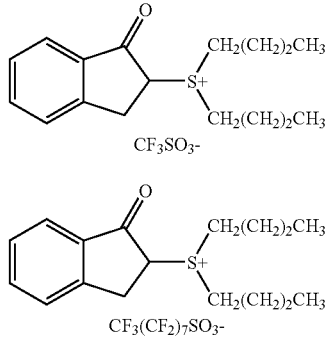
CF₃SO₃⁻
I-57
CF₃(CF₂)₇SO₃⁻

-continued
I-58 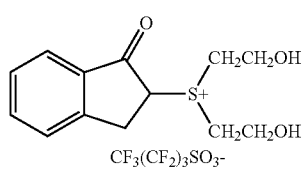
I-59 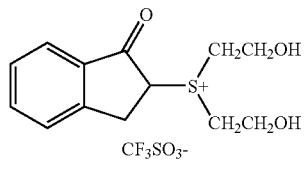
I-60 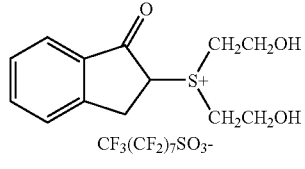
I-61 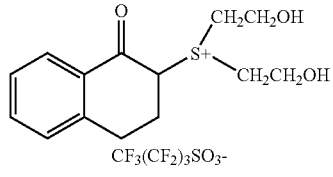
I-62 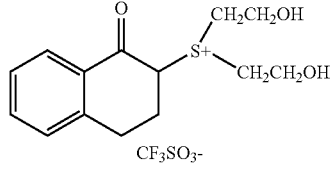
I-63 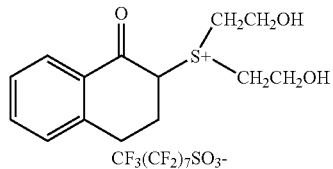
I-64 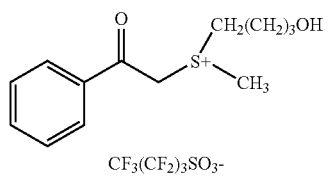
I-65 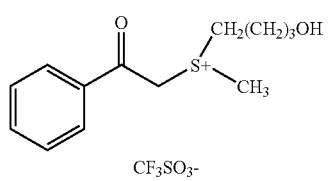
I-66 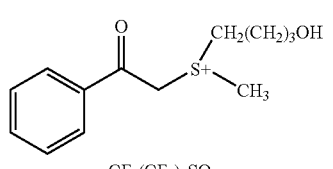
-continued
I-67 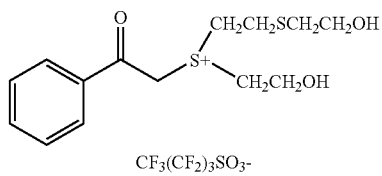
I-68 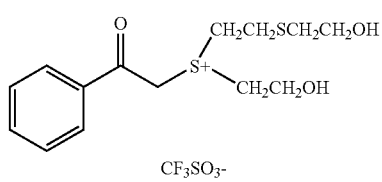
I-69 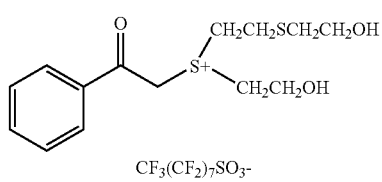
I-70 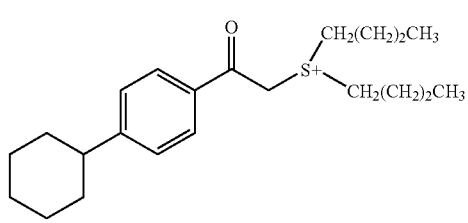
I-71 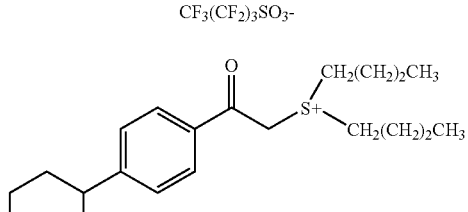
I-72 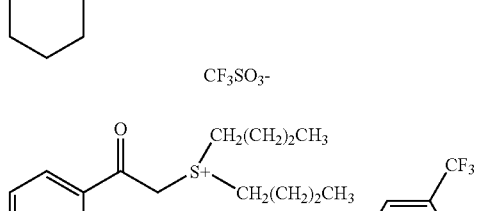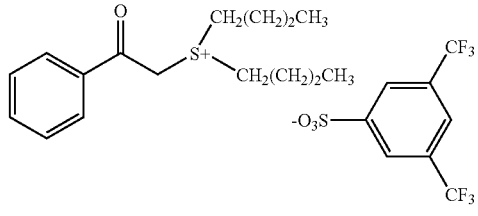
I-73 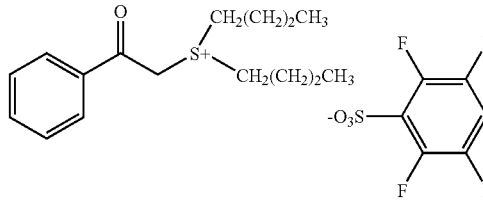

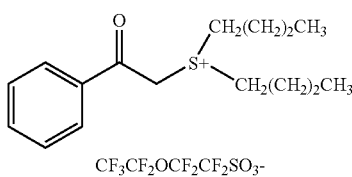

I-74

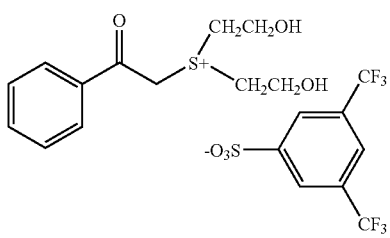

I-75

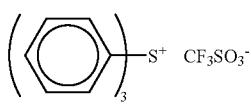

(z1)

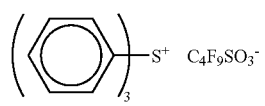

(z2)

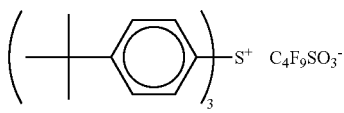

(z3)

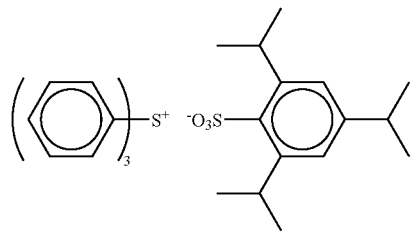

(z4)

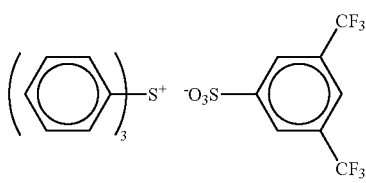

(z5)

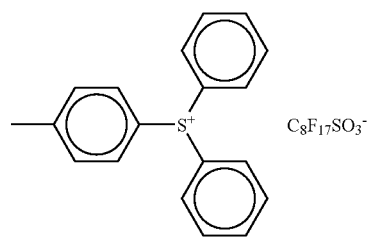

(z6)

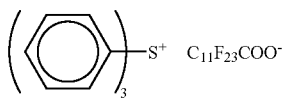

(z7)

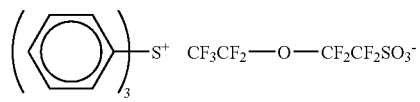

(z8)

Of these examples of acid generators represented by formula (PAG6), (PAG6A-1) to (PAG6A-30) and (PAG6B-1) to (PAG6B-12) are preferred over the others.

Combined use of Component (B1) and Component (B2) is advantageous in particular. In this case, the suitable (B1)/(B2) ratio by weight is from 97/3 to 5/95, preferably from 90/10 to 10/90, particularly preferably from 30/70 to 70/30.

Examples of acid generators especially preferred in the invention are illustrated below:

-continued
(z9)
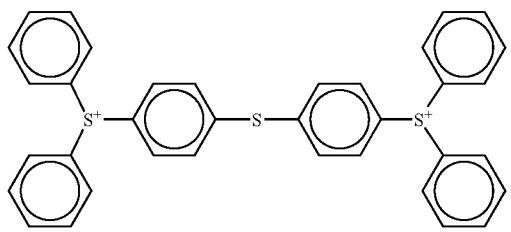
(z10)
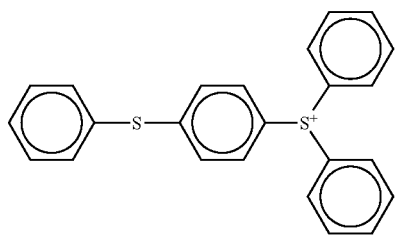
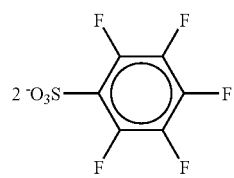
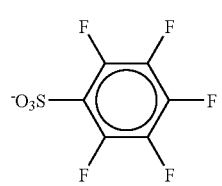
(z11)
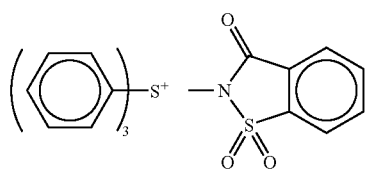
(z12)
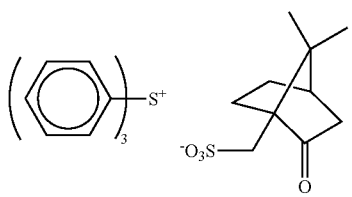
(z13)
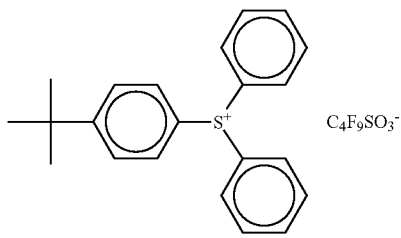
(z14)
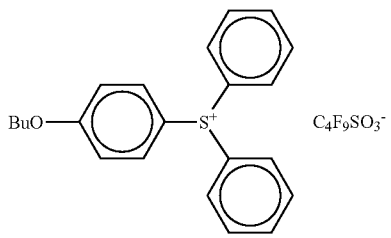
(z15)
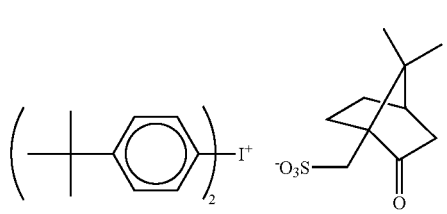
(z16)
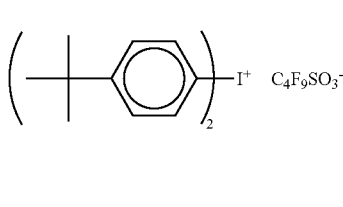
(z17)
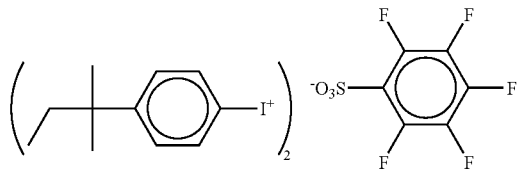
(z18)
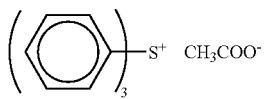
(z19)
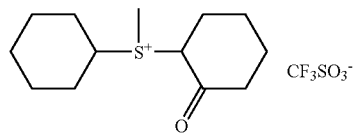
(z20)
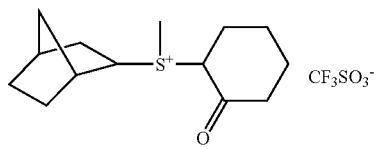
(z21)
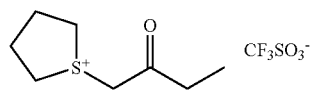
(z22)
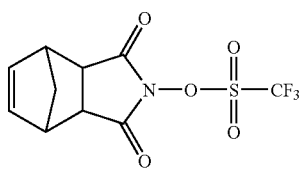

-continued
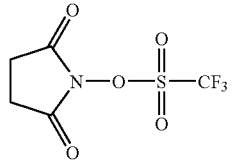 (z23)
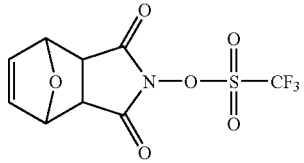 (z24)
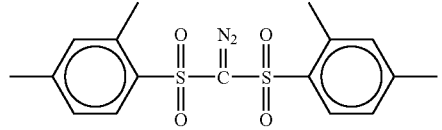 (z25)
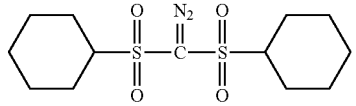 (z26)
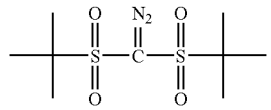 (z27)
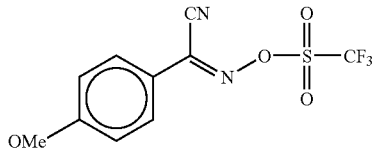 (z28)
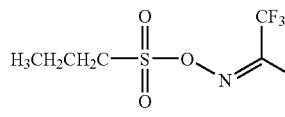 (z29)
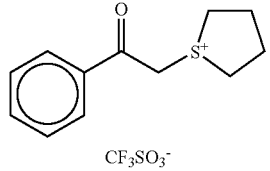 (z30)
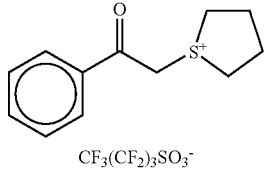 (z31)
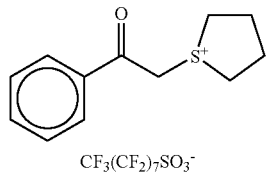 (z32)
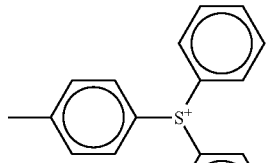 (z33)
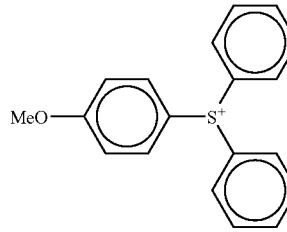 (z34)
 (z35)
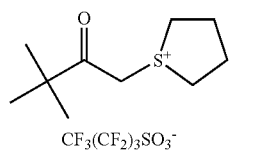 (z36)
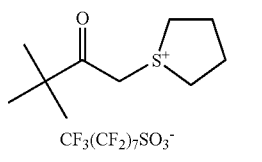 (z37)
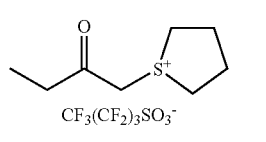 (z38)
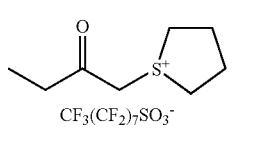 (z39)

-continued

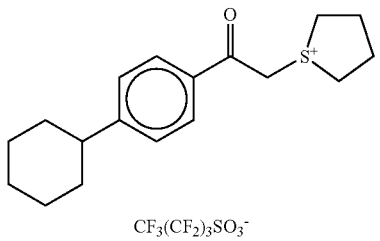 (z40)

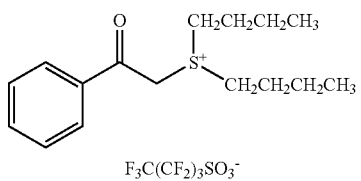 (z41)

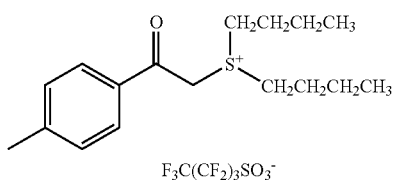 (z42)

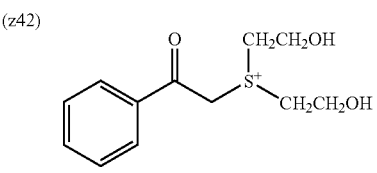 (z43)

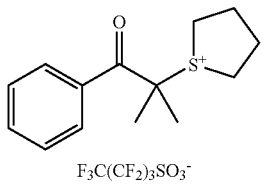 (z44)

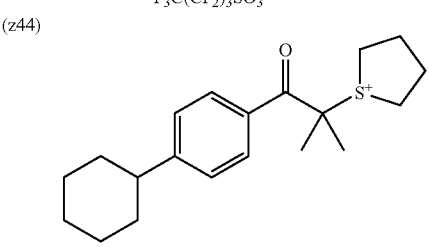 (z45)

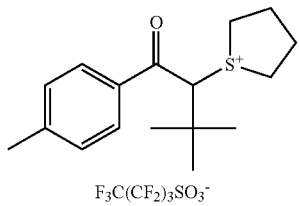 (z46)

 (z47)

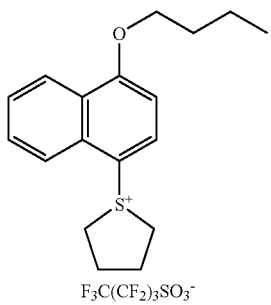 (z48)

In the invention, the compounds generating perfluorobutanesulfonic acid or perfluorooctanesulfonic acid are used to particular advantage as photo-acid generators.

The photo-acid generators can be used alone or as combinations of two or more thereof.

The appropriate total content of photo-acid generators in the present positive resist composition is from 0.1 to 20% by weight, preferably from 0.5 to 20% by weight, more preferably from 1 to 15% by weight, based on the solid content in the composition.

[3] Organic Solvent (Component (C))

The present resist composition is in a state that the foregoing ingredients are dissolved in a certain organic solvent.

The organic solvent used in the invention is an admixture of at least one organic solvent selected from propylene glycol monoalkyl ether carboxylates, alkyl lactates or straight-chain ketones with a cyclic ketone.

The suitable ratio (by weight) of at least one organic solvent selected from propylene glycol monoalkyl ether carboxylates, alkyl lactates or straight-chain ketones to a cyclic ketone is from 10/90 to 90/10, preferably from 20/80 to 80/20, far preferably from 30/70 to 70/30.

The appropriate content of the cyclic ketone is from 20 to 70% by weight, preferably from 30 to 60% by weight, based on the total amount of the solvent.

Suitable examples of propylene glycol monoalkyl ether carboxylates include propylene glycol monomethyl ether acetate, propylene glycol monomethyl ether propionate, propylene glycol monoethyl ether acetate and propylene glycol monoethyl ether propionate. Of these carboxylates, propylene glycol monoethyl ether acetate is preferred in particular.

Suitable examples of alkyl lactates include methyl lactate and ethyl lactate.

Examples of straight-chain ketones include methyl ethyl ketone, 2-heptanone, 3-heptanone and 4-heptanone. Of these ketones, 2-heptanone is preferred over the others.

Examples of cyclic ketones include cyclopentanone, 3-methylcyclopentanone, cyclohexanone, 2-methylcyclohexanone, 2,6-dimethylcyclohexanone, isophorone, cycloheptanone, 1,3-cycloheptanedione and γ-butyrolactone. Of these ketones, cyclopentanone, 3-methylcyclopentanone, cyclohexanone and cycloheptanone are preferred over the others, and cyclopentanone and cyclohexanone in particular are used to advantage.

Further, other organic solvents may generally be used together with the specific mixed solvent (the organic solvent) mentioned above so far as the proportion of the former to the latter is 10% by weight or below.

Examples of solvents other than the specific one include ethylene carbonate, propylene carbonate, ethylene dichloride, ethylene glycol monomethyl ether, ethylene glycol monoethyl ether, 2-methoxyethyl acetate, ethylene glycol monoethyl ether acetate, propylene glycol monomethyl ether, toluene, ethyl acetate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran.

By using such a mixed solvent is prepared a resist composition having a solids concentration of generally 3 to 25% by weight, preferably 5 to 22% by weight, more preferably 7 to 20% by weight.

It is preferable that the present positive resist composition further contains a nitrogen-containing basic compound.

As the nitrogen-containing basic compound, organic amines, basic ammonium salts and basic sulfonium salts can be used so far as they cause no deterioration in sublimation and resist performance.

Of those nitrogen-containing basic compounds, organic amines are preferred over the others, because they can ensure excellent image properties. Examples of such organic amines include the basic compounds disclosed in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a published Japanese translation of a PCT patent application), and U.S. Pat. Nos. 5,525,453, 5,629,134 and 5,667,938.

Specifically, these nitrogen-containing basic compounds have any of the following structural formulae (A) to (E).

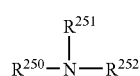

(A)

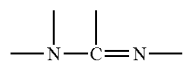

(B)

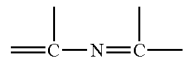

(C)

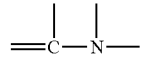

(D)

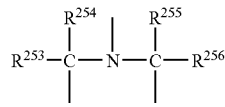

(E)

Herein, $R^{250}$, $R^{251}$ and $R^{252}$, which may be the same or different, each represents a hydrogen atom, a 1-20C alkyl group, a 1-20C aminoalkyl group, a 1-20C hydroxyalkyl group, or a substituted or unsubstituted 6-20C aryl group. Further, $R^{251}$ and $R^{252}$ may be combined with each other to form a ring.

$R^{253}$, $R^{254}$, $R^{255}$ and $R^{256}$ may be the same or different, and they each represents a 1-10C alkyl group.

More appropriate compounds are nitrogen-containing basic compounds which each have at least two nitrogen atoms of different chemical environments, or aliphatic tertiary amines.

Suitable examples of nitrogen-containing basic compounds include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidines, hexamethylenetetramine, imidazoles, hydroxypyridines, pyridines, anilines, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, tri-i-octylamine, tris(ethylhexyl)amine, tridecylamine and tridodecylamine.

Of these compounds, organic amines including 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazoles, hydroxypyridines, pyridines, 4,4'-diaminodiphenyl ether, and organic amines, such as triethylamine, tributylamine, tripentylamine, tri-n-octylamine, tris(ethylhexyl)amine, tridecylamine, N,N-dihydroxyethylamine and N-hydroxyethyl-N-ethylaniline, are preferred in particular.

The ratio of acid generators to nitrogen-containing basic compounds (the acid generator/nitrogen-containing basic compound ratio by mole) in the positive resist composition is generally from 2.5 to 300, preferably from 5.0 to 200, far preferably from 7.0 to 150.

In addition to the foregoing ingredients, the present positive resist composition can contain a low molecular acid-decomposable compound, a surfactant, a compound capable of promoting dissolution in a developer, an anti-halation agent, a plasticizer, a photosensitizer, an adhesion aid, a cross-linking agent and photo-base generator, if needed.

The low molecular acid-decomposable compound added to the present positive resist composition as required is a compound having molecular weight of 2,000 or below and containing groups capable of decomposing by action of an acid and increasing alkali solubility.

Specifically, acid-decomposable group-containing alicyclic compounds, such as those derived from cholic acid, dehydrocholic acid, deoxycholic acid, lithocholic acid, ursocholic acid and abietic acid, respectively, and acid decomposable group-containing aromatic compounds including those derived from naphthalene compounds, as described in *Proc. SPIE*, 2724, 355 (1996) JP-A-8-15865, U.S. Pat. Nos. 5,310,619 and 5,372,912, and *J. Photopolym. Sci. Tech.*, Vol. 10, No.3, 511 (1997), can be used as the low molecular acid-decomposable compound defined above.

Further, the low molecular acid-decomposable dissolution-inhibiting compounds disclosed in JP-A-6-51519 can be used at a level of addition amount where no deterioration of 220 nm transparency is caused, and 1,2-naphthoquinonediazide compounds can be used as well.

More specifically, the low molecular acid-decomposable dissolution-inhibiting compounds are used in proportions of generally 0.5 to 50 parts by weight, preferably 0.5 to 40 parts by weight, particularly preferably 0.5 to 20.0 parts by weight, per 100 parts by weight of total solids in the present resist composition.

The addition of these low molecular acid-decomposable dissolution-inhibiting compounds enables further improvement in development defect and enhancement of dry etching resistance.

Examples of dissolution-promoting compounds usable in the invention include the low molecular compounds having molecular weight of 1,000 or below disclosed in JP-A-3-206458, such as compounds having at least two per molecular of phenolic hydroxyl groups, the naphthols such as 1-naphthol, the compounds containing at least one per molecular of carboxyl group, carboxylic acid anhydrides, sulfonamide compounds and sulfonylimido compounds.

The suitable amount of these dissolution-promoting compounds mixed in the present composition is at most 30% by weight, preferably at most 20% by weight, based on the total weight (solids) of the composition.

As anti-halation agents, compounds capable of absorbing the irradiated radiation with efficiency are suitable, with examples including substituted benzenes, such as fluorenone, 9-fluorenone and benzophenone; and polycyclic aromatic compounds, such as anthracene, anthracene-9-methanol, anthracene-9-carboxyethyl, phenanthrene, perylene and azulene. Of these compounds, the polycyclic aromatic compounds are preferred in particular. These anti-halation agents reduce light reflected from a substrate and lessen the influence of multiple reflection inside the resist film, thereby producing effect of standing wave improvement.

In addition, photosensitizers can be added for the purpose of enhancing the rate of acid generation by exposure. Suitable examples thereof include benzophenone, p,p'-tetramethyldiaminobenzophenone, 2-chlorothioxanthone, anthrone, 9-ethoxyanthracene, pyrene, phenothiazine, benzil, benzoflavin, acetophenone, phenathrene, benzoquinone, anthraquinone, and 1,2-naphthoquinone, but photosensitizers usable in the invention are not limited to these examples. Those photosensitizers can also be used as the foregoing anti-halation agents.

It is preferable that the present positive resist composition further comprises at least one of fluorine-based and/or silicon-based surfactants (namely, surfactants containing fluorine atoms, surfactants containing silicon atoms, and surfactants containing both atoms).

By containing such a surfactant or surfactants, the present positive resist composition can provide resist patterns reduced in stickiness and development defects at satisfactory sensitivity and resolution when a source of exposure light with wavelengths of 250 nm or below, especially 220 nm or below, is used.

Examples of those fluorine-based and/or silicon-based surfactants include the surfactants as disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable as fluorine-based or silicone-based surfactants include Eftop EF301 and EF303 (manufactured by Shin-Akita Kasei K. K.), Florad FC430 and FC431 (manufactured by Sumitomo 3M, Inc.), Megafac F171, F173, F176, F189 and R08 (manufactured by Dainippon Ink & Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industries, Inc.). Further, organosiloxane polymer KP-341 (manufactured by Shin-Etsu Chemical Co., Ltd.) can be used as a silicon-containing surfactant.

In addition to known surfactants as recited above, specific polymers containing fluorinated aliphatic groups can be used as fluorine-based surfactants. Such polymers contain fluorinated aliphatic groups derived from fluorinated aliphatic compounds synthesized by a telomerization method (telomer method) or an oligomerization method (oligomer method). And these fluorinated aliphatic compounds can be synthesized by the methods disclosed in JP-A-2002-90991.

The polymers suitable as the polymers containing fluorinated aliphatic groups are copolymers of fluorinated aliphatic group-containing monomers and poly(oxyalkylene) acrylates and/or poly(oxyalkylene)methacrylates, wherein the fluorinated aliphatic group-containing units may be distributed randomly or in blocks. Examples of those poly(oxyalkylene) groups include a poly(oxyethylene) group, a poly(oxypropylene) group and a poly(oxybutylene) group. In addition, the poly(oxyalkylene) groups may be units containing alkylene groups differing in chain length in their respective oxyalkylene chains, such as poly(oxyethylene block-oxypropylene block-oxyethylene block combination) groups and poly(oxyethylene block-oxypropylene block combination) groups. Further, the copolymers of fluorinated aliphatic group-containing monomers and poly(oxyalkylene)acrylates (or methacrylates) may be binary copolymers or at least ternary copolymers prepared by copolymerizing at least two different kinds of fluorinated aliphatic group-containing monomers and at least two different kinds of poly(oxyalkylene)acrylates (or methacrylates) at a time.

Examples of fluorinated aliphatic group-containing polymers as commercially available surfactants include Megafac F178, F-470, F-473, F-475, F-476 and F-472 (manufactured by Dainippon Ink & Chemicals, Inc.). Additional examples of fluorinated aliphatic group-containing polymers include a copolymer of $C_6F_{13}$ group-containing acrylate (or methacrylate) and poly(oxyalkylene) acrylate (or methacrylate), a terpolymer of $C_6F_{13}$ group-containing acrylate (or methacrylate), poly(oxyethylene)acrylate (or methacrylate) and poly(oxypropylene)acrylate (or methacrylate), a copolymer of $C_8F_{17}$ group-containing acrylate (or methacrylate) and poly(oxyalkylene)acrylate (or methacrylate), and a terpolymer of $C_8F_{17}$ group-containing acrylate (or methacrylate), poly(oxyethylene)acrylate (or methacrylate) and poly(oxypropylene)acrylate (or methacrylate).

The appropriate amount of the surfactants used is from 0.0001 to 2% by weight, preferably from 0.001 to 1% by weight, based on the total weight (excepting the solvent) of the positive resist composition.

<<Way of Using Resist Composition>>

The present positive resist composition prepared by dissolving the foregoing ingredients in a solvent, preferably the mixed solvent as defined above, is used in a form that it is coated on a substrate as mentioned below.

More specifically, the positive resist composition is coated on a substrate for production of precision integrated circuit elements (e.g., silicon/silicon dioxide coating) in accordance with an appropriate coating method, e.g., a method of using a spinner or a coater.

After coating, the resist composition is exposed to light via the desired mask, baked, and then developed. Thus, resist patterns of good quality can be obtained. As the exposure light source used herein, far ultraviolet rays having wavelengths of 250 nm or below, especially 220 nm or below, are suitable. Examples of exposure light usable herein include KrF excimer laser (248 nm), ArF excimer laser (193 nm), $F_2$ excimer laser (157 nm), X-rays and electron beams.

Examples of an alkali developer usable for the present positive resist composition include aqueous alkaline solutions (whose concentrations are generally from 0.1 to 10 mass %) containing, e.g., inorganic alkalis (such as sodium hydroxide, potassium hydroxide, sodium carbonate, sodium silicate, sodium metasilicate and aqueous ammonia), primary amines (such as ethylamine and n-propylamine), secondary amines (such as diethylamine and di-n-butylamine), tertiary amines (such as triethylamine and methyldiethylamine), alcoholamines (such as dimethylethanolamine and triethanolamine), quaternary ammonium salts (such as tetramethylammonium hydroxide and tetraethylammonium hydroxide), or cyclic amines (such as pyrrole and piperidine).

The aqueous alkaline solutions to which alcohol and surfactants are further added in appropriate amounts can also be used.

EXAMPLES

The invention will now be illustrated in greater detail by reference to the following examples, but these examples should not be construed as limiting the scope of the invention.

Additionally, all proportions (or ratios) and percentages in the following synthesis examples are by weight unless otherwise indicated.

Synthesis Example 1

Synthesis of Resin (1-1)

In a reaction vessel, 2-norbornyl-2-propyl methacrylate, 3,5-dihydoxy-1-adamantyl methacrylate and cyclohexane lactone acrylate were placed in proportions of 40:20:40 and dissolved in a 60:40 mixture of propylene glycol monomethyl ether acetate and propylene glycol monomethyl ether, thereby preparing 450 g of a solution having a solids concentration of 22%. This solution was mixed with 1 mole % of V-601 produced by Wako Pure Chemical Industries, Ltd., and then added dropwise to 50 g of a 60:40 mixture of propylene glycol monomethyl ether acetate and propylene glycol monomethyl ether heated to 100° C. over a period of 6 hours in an atmosphere of nitrogen.

After the completion of the addition, the reaction solution was stirred for additional 2 hours. At the conclusion of the reaction, the resultant solution was cooled to room temperature, and poured into 5 liters of a 9:1 mixture of hexane and ethyl acetate. A white powdery matter thus deposited was recovered by filtration as the intended Resin (1-1).

The ratio (by mole) of the repeating units a, b and c (illustrated hereinafter) in the resin was a:b:c=43:19:38 as determined by $C^{13}$-NMR. The weight average molecular weight and the dispersion degree of the resin were 9,200 and 2.1, respectively, as measured by GPC and calculated in terms of standard polystyrene. As a result of measurement with a differential scanning calorimeter (DSC), the glass transition temperature of Resin (3-1) was found to be 148° C.

Synthesis Example 2

Synthesis of Resin (2-1)

Polymerization was carried out using the same method as in Synthesis Example 1, and the intended Resin (2-1) was obtained.

The ratio (by mole) of the repeating units a, b and c (illustrated hereinafter) in the resin was a:b:c=38:22:40 as determined by $C^{13}$-NMR. The weight average molecular weight and the dispersion degree of the resin were 8,330 and 2.1, respectively, as measured by GPC and calculated in terms of standard polystyrene. As a result of DSC measurement, the glass transition temperature of Resin (2-1) was found to be 131° C.

Synthesis Example 3

Synthesis of Resin (3-1)

In a reaction vessel, 2-adamantyl-2-propyl methacrylate, dihydoxyadamantyl methacrylate and norbornane lactone acrylate were placed in proportions of 40:20:40 and dissolved in a 60:40 mixture of propylene glycol monomethyl ether acetate and 3-methoxy-1-butanol, thereby preparing 450 g of a solution having a solids concentration of 22%. This solution was mixed with 8 mole % of V-601 produced by Wako Pure Chemical Industries, Ltd., and then added dropwise to 50 g of a 60:40 mixture of propylene glycol monomethyl ether acetate and 3-methoxy-1-butanol heated to 120° C. over a period of 6 hours in an atmosphere of nitrogen. After the completion of the addition, the reaction solution was stirred for additional 2 hours. At the conclusion of the reaction, the resultant solution was cooled to room temperature, and poured into 5 liters of a 9:1 mixture of hexane and ethyl acetate. A white powdery matter thus deposited was recovered by filtration as the intended Resin (3-1).

The ratio (by mole) of the repeating units a, b and c (illustrated hereinafter) in the resin was a:b:c=36:23:41 as determined by $C^{13}$-NMR. The weight average molecular weight and the dispersion degree of the resin were 3,270 and 1.5, respectively, as measured by GPC and calculated in terms of standard polystyrene. As a result of measurement with a differential scanning calorimeter (DSC), the glass transition temperature of Resin (3-1) was found to be 119° C.

Synthesis Example 4

Synthesis of Resin (3-2)

In a reaction vessel, 2-adamantyl-2-propyl methacrylate, dihydoxyadamantyl methacrylate and norbornane lactone acrylate were placed in proportions of 40:20:40 and dissolved in a 60:40 mixture of propylene glycol monomethyl ether acetate and 3-methoxy-1-butanol, thereby preparing 450 g of a solution having a solids concentration of 22%. This solution was mixed with 6 mole % of V-601 produced by Wako Pure Chemical Industries, Ltd., and then added dropwise to 50 g of a 60:40 mixture of propylene glycol monomethyl ether acetate and 3-methoxy-1-butanol heated to 120° C. over a period of 6 hours in an atmosphere of nitrogen.

After the completion of the addition, the reaction solution was stirred for additional 2 hours. At the conclusion of the reaction, the resultant solution was cooled to room temperature, and poured into 5 liters of a 9:1 mixture of hexane and ethyl acetate. A white powdery matter thus deposited was recovered by filtration as the intended Resin (3-2).

The ratio (by mole) of the repeating units a, b and c (illustrated hereinafter) in the resin was a:b:c=36:23:41 as determined by $C^{13}$-NMR. The weight average molecular weight and the dispersion degree of the resin were 4,100 and 1.6, respectively, as measured by GPC and calculated in terms of standard polystyrene. As a result of measurement with a differential scanning calorimeter (DSC), the glass transition temperature of Resin (3-2) was found to be 139° C.

Synthesis Example 5

Synthesis of Resin (4-1)

Polymerization was carried out using the same method as in Synthesis Example 1, and the intended Resin (4-1) was obtained.

The ratio (by mole) of the repeating units a, b and c (illustrated hereinafter) in the resin was a:b:c=37:22:41 as determined by $C^{13}$-NMR. The weight average molecular weight and the dispersion degree of the resin were 7,760 and 2.3, respectively, as measured by GPC and calculated in terms of standard polystyrene. As a result of DSC measurement, the glass transition temperature of Resin (4-1) was found to be 133° C.

Synthesis Example 6

Synthesis of Resin (5-1)

Polymerization was carried out using the same method as in Synthesis Example 1, and the intended Resin (5-1) was obtained.

The ratio (by mole) of the repeating units a, b and c (illustrated hereinafter) in the resin was a:b:c=35:32:33 as determined by $C^{13}$-NMR. The weight average molecular weight and the dispersion degree of the resin were 9,910 and 2.2, respectively, as measured by GPC and calculated in terms of standard polystyrene. As a result of DSC measurement, the glass transition temperature of Resin (5-1) was found to be 122° C.

Synthesis Example 7

Synthesis of Resin (6-1)

Polymerization was carried out using the same method as in Synthesis Example 4, and the intended Resin (6-1) was obtained.

The ratio (by mole) of the repeating units a, b, c and d (illustrated hereinafter) in the resin was a:b:c:d=30:22:39:9 as determined by $C^{13}$-NMR. The weight average molecular weight and the dispersion degree of the resin were 3,890 and 1.61, respectively, as measured by GPC and calculated in terms of standard polystyrene. As a result of DSC measurement, the glass transition temperature of Resin (6-1) was found to be 134° C.

Synthesis Example 8

Synthesis of Resin (7-1)

In a reaction vessel, 2-adamantyl-2-propyl methacrylate, 2-adamantyl-2-propyl acrylate, dihydoxyadamantyl methacrylate and norbornane lactone acrylate were placed in proportions of 20:20:20:40 and dissolved in a 60:40 mixture of propylene glycol monomethyl ether acetate and propylene glycol monomethyl ether, thereby preparing 450 g of a solution having a solids concentration of 22%. This solution was mixed with 9 mole % of V-601 produced by Wako Pure Chemical Industries, Ltd., and then added dropwise to 50 g of a 60:40 mixture of propylene glycol monomethyl ether acetate and propylene glycol monomethyl ether heated to 80° C. over a period of 6 hours in an atmosphere of nitrogen.

After the completion of the addition, the reaction solution was stirred for additional 2 hours. At the conclusion of the reaction, the resultant solution was cooled to room temperature, and poured into 5 liters of a 9:1 mixture of hexane and ethyl acetate. A white powdery matter thus deposited was recovered by filtration as the intended Resin (7-1).

The ratio (by mole) of the repeating units a, b, c and d (illustrated hereinafter) in the resin was a:b:c:d=20:20:21:39 as determined by $C^{13}$-NMR. The weight average molecular weight and the dispersion degree of the resin were 7,980 and 2.3, respectively, as measured by GPC and calculated in terms of standard polystyrene. As a result of measurement with a differential scanning calorimeter (DSC), the glass transition temperature of Resin (7-1) was found to be 155° C.

Synthesis Example 9

Synthesis of Resin (7-2)

In a reaction vessel, 2-adamantyl-2-propyl methacrylate, 2-adamantyl-2-propyl acrylate, dihydoxyadamantyl methacrylate and norbornane lactone acrylate were placed in proportions of 20:20:20:40 and dissolved in a 60:40 mixture of propylene glycol monomethyl ether acetate and propylene glycol monomethyl ether, thereby preparing 450 g of a solution having a solids concentration of 22%. This solution was mixed with 5 mole % of V-601 produced by Wako Pure Chemical Industries, Ltd., and then added dropwise to 50 g of a 60:40 mixture of propylene glycol monomethyl ether acetate and propylene glycol monomethyl ether heated to 80° C. over a period of 6 hours in an atmosphere of nitrogen.

After the completion of the addition, the reaction solution was stirred for additional 2 hours. At the conclusion of the reaction, the resultant solution was cooled to room temperature, and poured into 5 liters of a 9:1 mixture of hexane and ethyl acetate. A white powdery matter thus deposited was recovered by filtration as the intended Resin (7-2).

The ratio (by mole) of the repeating units a, b, c and d (illustrated hereinafter) in the resin was a:b:c:d=20:20:21:39 as determined by $C^{13}$-NMR. The weight average molecular weight and the dispersion degree of the resin were 9,370 and 2.2, respectively, as measured by GPC and calculated in terms of standard polystyrene. As a result of measurement with a differential scanning calorimeter (DSC), the glass transition temperature of Resin (7-2) was found to be 161° C.

Synthesis Example 10

Synthesis of Resin (8-1)

In a reaction vessel, methacrylic acid ester of t-butyl hydroxytetracyclododecanylcarboxylate, dihydroxyadamantyl methacrylate and norbornane lactone acrylate were placed in proportions of 44:6:50 and dissolved in a 60:40 mixture of propylene glycol monomethyl ether acetate and propylene glycol monomethyl ether, thereby preparing 450 g of a solution having a solids concentration of 22%. This solution was mixed with 2.5 mole % of V-601 produced by Wako Pure Chemical Industries, Ltd., and then added dropwise to 50 g of a 60:40 mixture of propylene glycol monomethyl ether acetate and propylene glycol monomethyl ether heated to 80° C. over a period of 6 hours in an atmosphere of nitrogen.

After the completion of the addition, the reaction solution was stirred for additional 2 hours. At the conclusion of the reaction, the resultant solution was cooled to room temperature, and poured into 5 liters of a 9:1 mixture of hexane and ethyl acetate. A white powdery matter thus deposited was recovered by filtration as the intended Resin (8-1).

The ratio (by mole) of the repeating units a, b and c (illustrated hereinafter) in the resin was a:b:c=45:7:48 as determined by $C^{13}$-NMR. The weight average molecular weight and the dispersion degree of the resin were 10,370 and 2.2, respectively, as measured by GPC and calculated in terms of standard polystyrene. As a result of measurement with a differential scanning calorimeter (DSC), the glass transition temperature of Resin (8-1) was found to be 136° C.

Synthesis Example 11

Synthesis of Resin (9-1)

Polymerization was carried out using the same method as in Synthesis Example 1, and the intended Resin (9-1) was obtained.

The ratio (by mole) of the repeating units a, b and c (illustrated hereinafter) in the resin was a:b:c=45:28:27 as determined by $C^{13}$-NMR. The weight average molecular weight and the dispersion degree of the resin were 10,180 and 2.31, respectively, as measured by GPC and calculated in terms of standard polystyrene. As a result of DSC measurement, the glass transition temperature of Resin (9-1) was found to be 144° C.

Synthesis Example 12

Synthesis of Resin (10-1)

Polymerization was carried out using the same method as in Synthesis Example 1, and the intended Resin (10-1) was obtained.

The ratio (by mole) of the repeating units a, b, c and d (illustrated hereinafter) in the resin was a:b:c:d=35:19:5:41 as determined by $C^{13}$-NMR. The weight average molecular weight and the dispersion degree of the resin were 7,630 and 2.0, respectively, as measured by GPC and calculated in terms of standard polystyrene. As a result of DSC measurement, the glass transition temperature of Resin (10-1) was found to be 139° C.

Synthesis Example 13

Synthesis of Resin (11-1)

Polymerization was carried out using the same method as in Synthesis Example 1, and the intended Resin (11-1) was obtained.

The ratio (by mole) of the repeating units a, b, c and d (illustrated hereinafter) in the resin was a:b:c:d=37:19:39:5 as determined by $C^{13}$-NMR. The weight average molecular weight and the dispersion degree of the resin were 7,560 and 1.9, respectively, as measured by GPC and calculated in terms of standard polystyrene. As a result of DSC measurement, the glass transition temperature of Resin (11-1) was found to be 139° C.

Synthesis Example 14

Synthesis of Resin (12-1)

Polymerization was carried out using the same method as in Synthesis Example 1, and the intended Resin (12-1) was obtained.

The ratio (by mole) of the repeating units a, b, c and d (illustrated hereinafter) in the resin was a:b:c:d=39:16:40:5 as determined by $C^{13}$-NMR. The weight average molecular weight and the dispersion degree of the resin were 8,670 and 2.2, respectively, as measured by GPC and calculated in terms of standard polystyrene. As a result of DSC measurement, the glass transition temperature of Resin (12-1) was found to be 147° C.

TABLE 1

| Resin | Structural Formula | Compositional Ratio (by mole) | | | | Tg | Molecular Weight | Dispersion Degree |
| --- | --- | --- | --- | --- | --- | --- | --- | --- |
| | | a | b | c | d | | | |
| 1-1 | (1) | 43 | 19 | 38 | — | 148° C. | 9,200 | 2.1 |
| 2-1 | (2) | 38 | 22 | 40 | — | 131° C. | 8,330 | 2.1 |
| 3-1 | (3) | 36 | 23 | 41 | — | 119° C. | 3,270 | 1.5 |
| 3-2 | (3) | 36 | 23 | 41 | — | 139° C. | 4,100 | 1.6 |
| 4-1 | (4) | 37 | 22 | 41 | — | 133° C. | 7,760 | 2.3 |
| 5-1 | (5) | 35 | 32 | 33 | — | 122° C. | 9,910 | 2.2 |
| 6-1 | (6) | 30 | 22 | 39 | 9 | 134° C. | 3,890 | 1.6 |
| 7-1 | (7) | 20 | 20 | 21 | 39 | 155° C. | 7,980 | 2.3 |
| 7-2 | (7) | 20 | 20 | 21 | 39 | 161° C. | 9,370 | 2.2 |
| 8-1 | (8) | 45 | 7 | 48 | — | 136° C. | 10,370 | 2.2 |
| 9-1 | (9) | 45 | 27 | 28 | — | 144° C. | 19,180 | 2.3 |
| 10-1 | (10) | 35 | 19 | 5 | 41 | 139° C. | 7,630 | 2.0 |
| 11-1 | (11) | 37 | 19 | 39 | 5 | 139° C. | 7,560 | 1.9 |
| 12-1 | (12) | 39 | 16 | 5 | 40 | 147° C. | 3,670 | 2.2 |

TABLE 1-continued
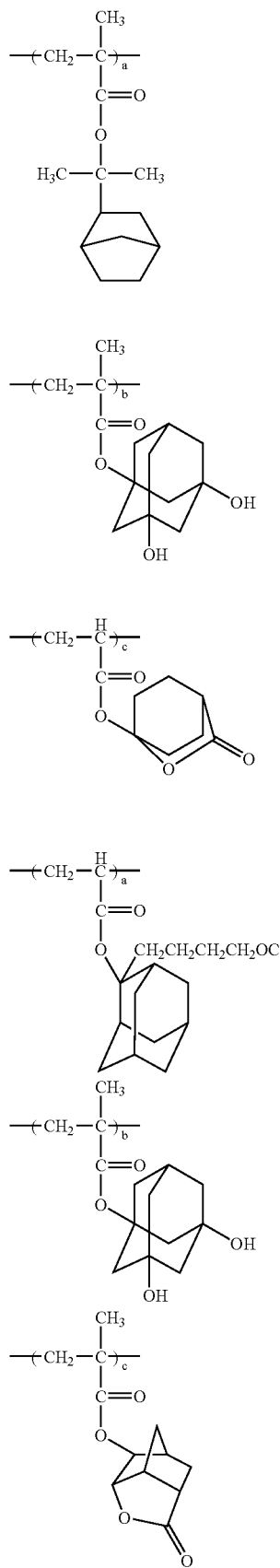
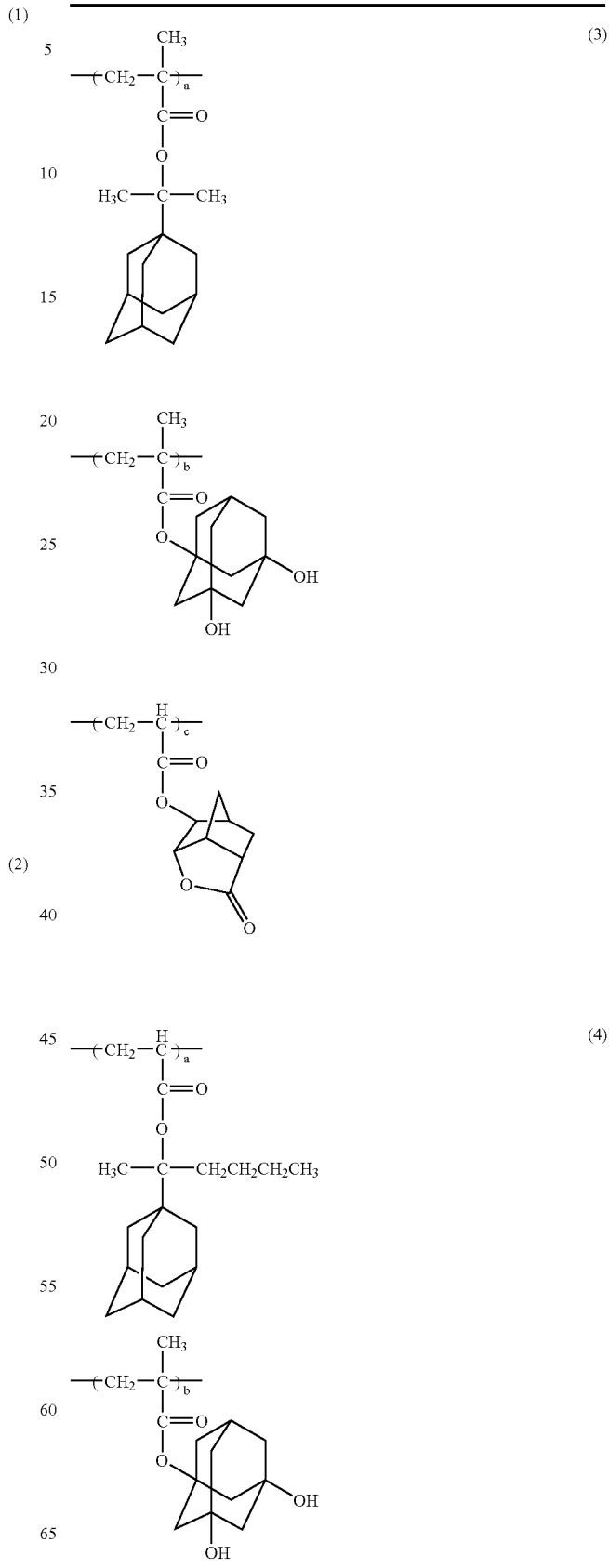

TABLE 1-continued
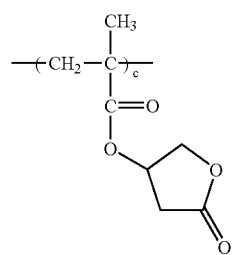
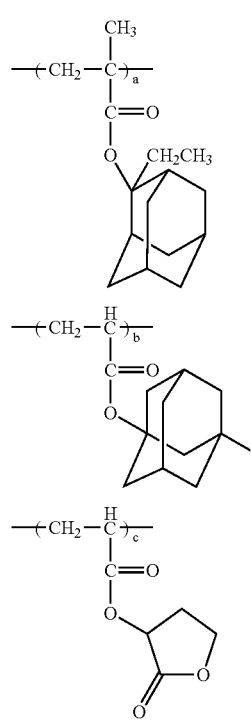
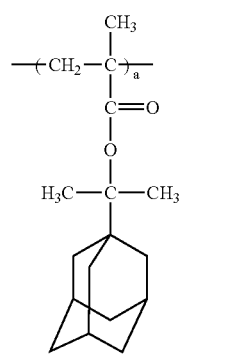
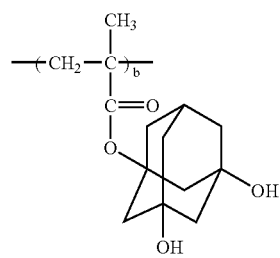
TABLE 1-continued
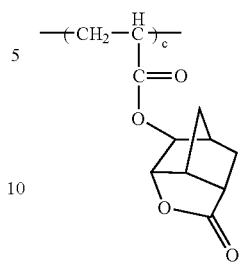
(5)
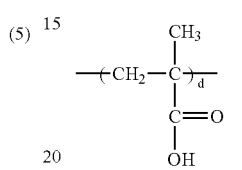
(7)
(6)

TABLE 1-continued
(8)
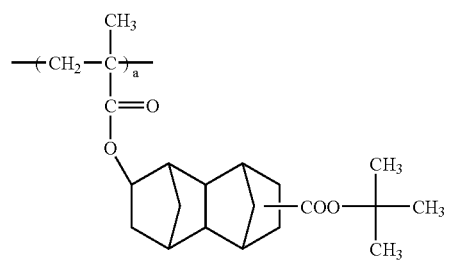
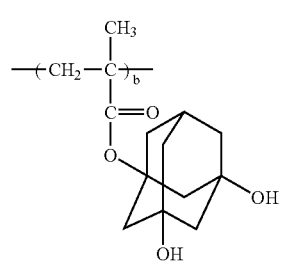
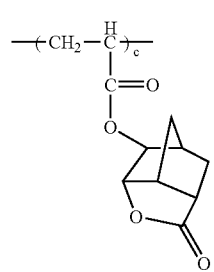
(9)
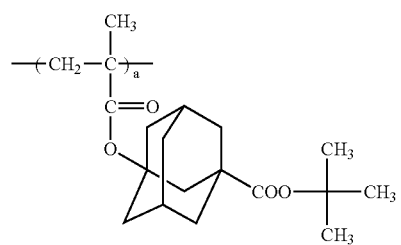
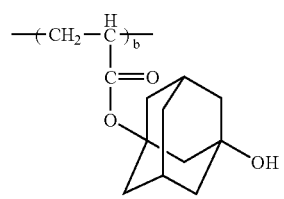
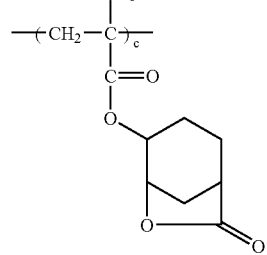
TABLE 1-continued
(10)
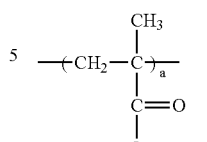
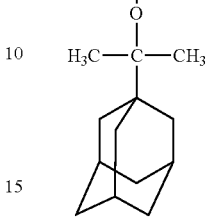
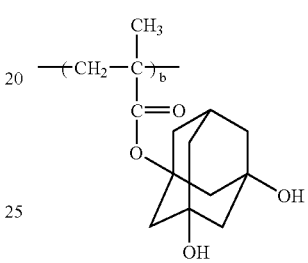
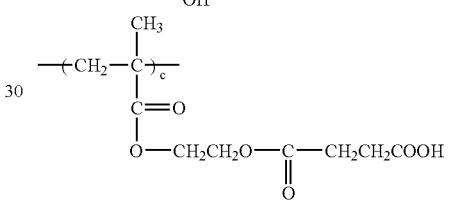
(11)
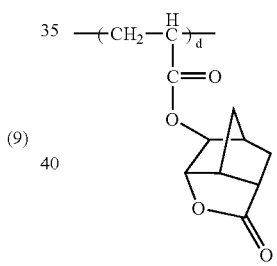
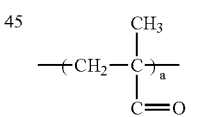
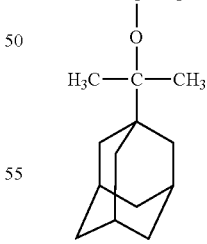
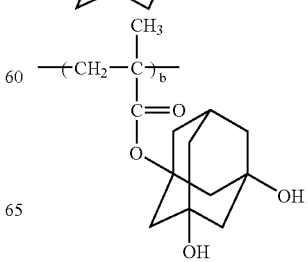

TABLE 1-continued

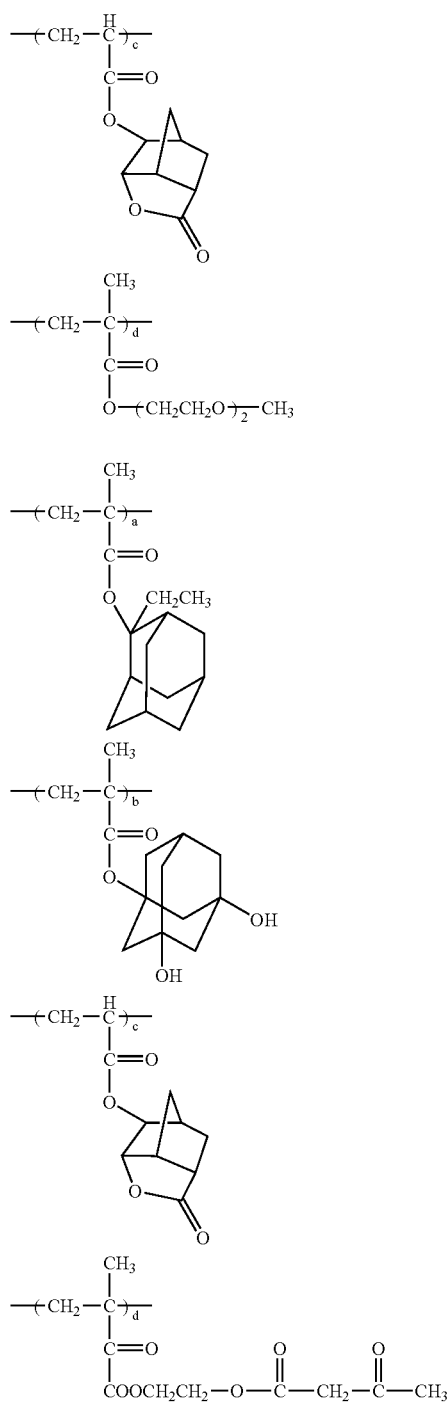

Synthesis Example 15

Synthesis of Resin (R1)

In a reaction vessel, 2-ethyl-2-adamantyl methacrylate and butyrolactone methacrylate were placed in proportions of 55:45 and dissolved in a 5:5 mixture of methyl ethyl ketone and tetrahydrofuran, thereby preparing 100 ml of a solution having a solids concentration of 20%. This solution was mixed with 2 mole % of V-65 produced by Wako Pure Chemical Industries, Ltd., and then added dropwise to 10 ml of methyl ethyl ketone heated to 60° C. over a period of 4 hours in an atmosphere of nitrogen.

After the completion of the addition, the reaction solution was heated for additional 4 hours, admixed again with 1 mole % of V-65, and then stirred for 4 hours. At the conclusion of the reaction, the resultant solution was cooled to room temperature, and poured into 3 liters of a 1:1 mixture of distilled water and isopropyl alcohol. A white powdery matter thus deposited was recovered as Resin (1).

The ratio (by mole) of the repeating units in the resin was 46:54 as determined by $C^{13}$-NMR. The resin had a weight average molecular weight of 10,700 as measured by GPC and calculated in terms of standard polystyrene.

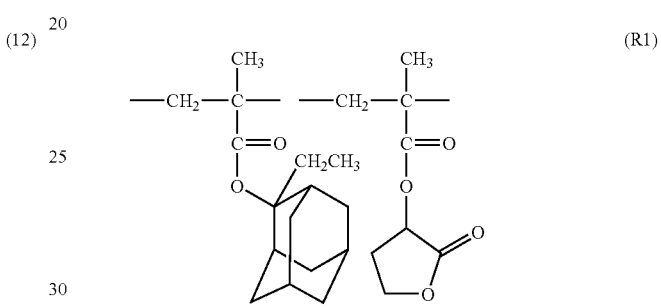

Synthesis Example 16

Synthesis of Resin (R2)

In a reaction vessel, 2-adamantyl-2-propyl methacrylate, 2-adamantyl-2-propyl acrylate, dihydoxyadamantyl methacrylate and norbornane lactone acrylate were placed in proportions of 20:20:20:40 and dissolved in a 60:40 mixture of propylene glycol monomethyl ether acetate and propylene glycol monomethyl ether, thereby preparing 450 g of a solution having a solids concentration of 22%. This solution was mixed with 3.5 mole % of V-601 produced by Wako Pure Chemical Industries, Ltd., and then added dropwise to 50 g of a 60:40 (by mass) mixture of propylene glycol monomethyl ether acetate and propylene glycol monomethyl ether heated to 80° C. over a period of 6 hours in an atmosphere of nitrogen.

After the completion of the addition, the reaction solution was stirred for additional 2 hours. At the conclusion of the reaction, the resultant solution was cooled to room temperature, and poured into 5 liters of a 9:1 (by mass) mixture of hexane and ethyl acetate. A white powdery matter thus deposited was recovered by filtration as Resin (R2).

The ratio (by mole) of the repeating units in the resultant resin was 20:20:20:40 in the order in which the corresponding monomers were described when determined by $C^{13}$-NMR. The weight average molecular weight and the dispersion degree of the resin were 13,100 and 2.1, respectively, as measured by GPC and calculated in terms of standard polystyrene. As a result of measurement with a differential scanning calorimeter (DSC), the glass transition temperature of Resin (R2) was found to be 171° C.

Examples 1 to 17 and Comparative Examples 1 to 4

(Preparation and Evaluation of Positive Resist Composition)

Positive resist compositions of Examples 1 to 17 and Comparative Examples 1 to 4 were each prepared as follows: 1.03 g of a resin, 0.00035 mol of a photo-acid generator, 1.65 mg of a nitrogen-containing basic compound and a surfactant in a proportion of 100 ppm to the total ingredients were mixed as shown in Table 2, the resulting mixture was dissolved into a mixed solvent as shown in Table 2 so as to have the solids concentration of 11 weight %, and then passed through a 0.1-μm micro-filter. Incidentally, all ratios set forth in Table 2 when two or three ingredients were used for each individual component are by weight.

SL-1: Propylene glycol monomethyl ether acetate
SL-2: Ethyl lactate
SL-3: Propylene glycol monomethyl ether
SL-4: 2-Heptanone
SL-5: Cyclopentanone
SL-6: Cyclohexanone
SL-7: 2-Methylcyclohexanone
SL-8: Propylene carbonate
SL-9: γ-Butyrolactone

[Pattern Formation Method]

On a silicon wafer, ARC29a (a product of Brewer Science Inc.) was coated uniformly in a thickness of 780 angstroms by means of a spin coater, and then dried at 205° C. for 60 seconds to form an antireflective coating. On this coating, each of the positive resist compositions just after preparation was further coated, and dried at 120° C. for 90 seconds.

TABLE 2

|  | Resin | Photo-acid generator | Basic compound | Surfactant | Solvent |
|---|---|---|---|---|---|
| Example 1 | 2-1 | z3 | N-1 | W-1 | SL-1/SL-5 = 80/20 |
| 2 | 8-1 | z33 | N-4 | W-2 | SL-2/SL-7 = 70/30 |
| 3 | 3-1 | z33/z31 = 40/60 | N-3 | W-3 | SL-4/SL-6 = 80/20 |
| 4 | 6-1 | z44 | N-7 | — | SL-4/SL-6 = 60/40 |
| 5 | 7-1 | z3/SI-14 = 50/50 | N-1/N-3 = 50/50 | W-5 | SL-2/SL-6 = 50/50 |
| 6 | 12-1 | SI-14 | N-6 | W-1 | SL-1/SL-4/SL-7 = 40/35/25 |
| 7 | 5-1 | SI-39/z33 = 20/80 | N-7 | W-2 | SL-1/SL-5/SL-6 = 70/15/15 |
| 8 | 11-1 | z33/I-1 = 40/60 | N-8 | W-35 | SL-1/SL-7 = 85/15 |
| 9 | 1-1 | SI-14/z35 = 20/80 | N-2 | W-4 | SL-1/SL-6/SL-9 = 60/35/5 |
| 10 | 1-1 | z3 | N-3 | W-5 | SL-2/SL-5 = 50/50 |
| 11 | 6-1 | z46/z22 = 90/10 | N-5 | W-1 | SL-1/SL-6/SL-8 = 60/38/2 |
| 12 | 4-1 | z33/z27 = 85/15 | N-6/N-2 = 50/50 | W-2 | SL-2/SL-7/SL-9 = 60/30/10 |
| 13 | 9-1 | PAG1-12 | N-4 | W-3 | SL-1/SL-6 = 60/40 |
| 14 | 3-2 | z28 | N-6 | W-4 | SL-1/SL-2/SL-5 = 40/40/20 |
| 15 | 10-1 | SI-14/SI-26 = 80/20 | N-7 | W-3/W-1 = 50/50 | SL-1/SL-3/SL-5 = 40/30/10 |
| 16 | 12-1 | z33 | N-3 | — | SL-1/SL-7/SL-8 = 60/35/5 |
| 17 | 11-1 | PAG1-13 | N-8 | W-4 | SL-4/SL-7 = 70/30 |
| Comparative Example 1 | R1 | z3 | N-8 | W-1 | SL-1 |
| 2 | 7-2 | z16 | N-3 | W-5 | SL-2/SL-9 = 95/5 |
| 3 | 12-1 | z3/SI-14 = 50/50 | N-6 | W-3 | SL-1/SL-3 = 80/20 |
| 4 | R2 | z16/z48 = 40/60 | N-6 | — | SL-1/SL-6 = 80/20 |

The basic compounds expressed by symbols in Table 2 denote the following ones.

N-1: 1,5-Diazabicyclo[4.3.0]nona-5-ene (DBN)
N-2: Triisodecylamine
N-3: Trioctylamine
N-4: Triphenylimidazole
N-5: Antipyrine
N-6: N,N-di-n-butylaniline
N-7: Adamantylamine
N-8: Triisooctylamine The surfactants expressed by symbols in Table 2 denote the following ones.

W-1: Megafac F176 (fluorine-containing surfactant, manufactured by Dainippon Ink & Chemicals, Inc.)
W-2: Megafac R08 (fluorine- and silicon-containing surfactant, manufactured by Dainippon Ink & Chemicals, Inc.)
W-3: organosiloxane polymer KP-341 (manufactured by Shin-Etsu Chemical Co., Ltd.)
W-4: Polyoxyethylene nonyl phenyl ether
W-5: Troysol S-336 (manufactured by Troy Chemical Industries, Inc.)

The solvents expressed by symbols in Table 2 denote the following ones.

Thus, a resist film having a thickness of 300 nm was formed.

Each of the thus formed resist films was subjected to exposure via a mask having the desired patterns by means of an ArF excimer laser stepper (made by ISI: NA=0.60, (σ=0.70)). Immediately after the exposure, each resist film was heated for 90 seconds on a 120° C. hot plate. Then, it was developed with a 2.38 weight % aqueous solution of tetramethylammonium hydroxide at 23° C. for 60 seconds, rinsed with purified water for 30 seconds, and then dried to form patterns.

[Line Edge Roughness (LER)]

A 130 nm isolated trench pattern was examined for line edge extended over a range of 5 μm in the length direction, and how distant the line edge was from the reference line on which the line edge was to lie was measured at each of 50 points within the foregoing range by use of a critical dimension scanning electron microscope (S-8840, made by Hitachi Ltd.). Further, the standard deviation (a) of the measured values was determined, and 3a (nm) was taken as an indication of edge roughness. The smaller value thereof means the better resist performance.

[Defocus Latitude (DOF)]

A 130 nm line pattern (line:space=1:1), a 130 nm isolated line (line:space=1:10) and a 130 nm isolated trench pattern were each examined for defocus latitude, and a deviation (μm) from focus which was allowable commonly to all of those patterns was determined.

The results obtained are shown in Table 3.

TABLE 3

|  | LER | DOF |
|---|---|---|
| Example 1 | 8.2 | 0.30 |
| 2 | 9.8 | 0.25 |
| 3 | 6.9 | 0.35 |
| 4 | 9.8 | 0.35 |
| 5 | 8.0 | 0.35 |
| 6 | 10.0 | 0.25 |
| 7 | 8.6 | 0.30 |
| 8 | 8.4 | 0.30 |
| 9 | 6.2 | 0.40 |
| 10 | 8.6 | 0.30 |
| 11 | 5.8 | 0.40 |
| 12 | 9.3 | 0.25 |
| 13 | 10.0 | 0.25 |
| 14 | 10.3 | 0.25 |
| 15 | 7.8 | 0.30 |
| 16 | 10.2 | 0.25 |
| 17 | 9.1 | 0.25 |
| Comparative Example 1 | 13.5 | 0.15 |
| 2 | 14.0 | 0.15 |
| 3 | 12.4 | 0.15 |
| 4 | 13.2 | 0.10 |

As can be seen from Table 3, the present positive resist compositions showed superiority in resist performances, namely smaller edge roughness and greater defocus latitude, over the comparative resist compositions.

In accordance with the invention, it is possible to provide positive resist compositions which are small in edge roughness and great in defocus latitude and have excellent adaptability to various types of patterns.

What is claimed is:

1. A positive resist composition, comprising:
(A) a resin comprising at least one kind of acrylate derivative repeating units, having a glass transition temperature in the range of 70 to 155° C. and capable of increasing its solubility in an alkali developer under action of an acid,
wherein the resin has repeating units of at least one kind selected from repeating units represented by the following formula (IV) and repeating units having groups represented by the following formula (V-1), (V-2), (V-3) and (V-4); and repeating units represented by the following formula (AII),
(B) a compound capable of generating an acid upon irradiation with an actinic ray or radiation, and
(C) a mixed an organic solvent comprising (a) at least one solvent selected from a propylene glycol monoalkyl ether carboxylate, an alkyl lactate and a linear ketone; and (b) a cyclic ketone:

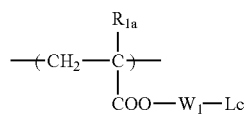

(IV)

-continued

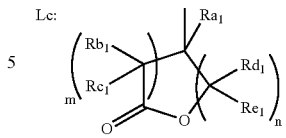

Lc:

wherein $R_{1a}$ represents a hydrogen atom or a methyl group, $W_1$ represents a divalent single group selected from the class consisting of a single bond, an alkylene group, an ether group, a thioether group, a carbonyl group and an ester group, or a combination thereof, $R_{a1}$, $R_{b1}$, $R_{c1}$, $R_{d1}$ and $R_{e1}$ each independently represents a hydrogen atom or an alkyl group having 1 to 4 carbon atoms, and m and n each independently represents an integer of 0 to 3, provided that m+n is from 2 to 6:

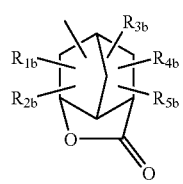

(V-1)

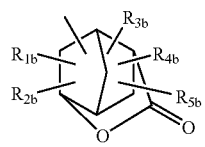

(V-2)

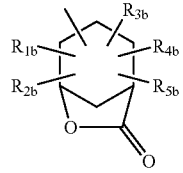

(V-3)

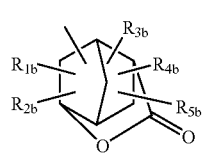

(V-4)

wherein $R_{1b}$ to $R_{5b}$ each independently represents a hydrogen atom, an alkyl group, a cycloalkyl group or an alkenyl group, and any two of them may be combined with each other to form a ring:

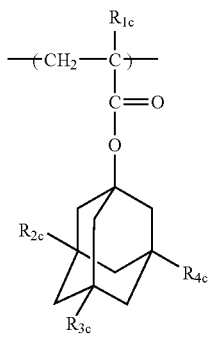
(AII)

wherein $R_{1c}$ represents a hydrogen atom or a methyl group, $R_{2c}$ to $R_{4c}$ each independently represents a hydrogen atom or a hydroxyl group, provided that at least one of $R_{2c}$ to $R_{4c}$ represents a hydroxyl group.

2. The composition according to claim 1, wherein 10 to 90 mole % of the repeating units constituting the resin (A) are derived from acrylate monomers.

3. The composition according to claim 1, wherein 50 to 75 mole % of the repeating units constituting the resin (A) are derived from acrylate monomers.

4. The composition according to claim 1, wherein the compound (B) is a triphenylsulfonium salt.

5. The composition according to claim 1, wherein the compound (B) is a phenacylsulfonium salt.

6. The composition according to claim 1, wherein the cyclic ketone is contained in an amount of 20 to 70% by weight based on the total amount of the organic solvent (C).

7. The composition according to claim 1, wherein the cyclic ketone is contained in an amount 30 to 60% by weight based on the total amount of the organic solvent (C).

8. The composition according to claim 1, wherein the resin (A) has alkali-soluble groups protected by 1-adamantyl-1-alkyl groups.

9. The composition according to claim 1, wherein the glass transition temperature is in the range of 70 to 150° C.

10. The composition according to claim 9, wherein the glass transition temperature is in the range of 80 to 140° C.

11. The composition according to claim 10, wherein the glass transition temperature is in the range of 100 to 130° C.

12. The composition according to claim 1, wherein the content of the repeating units represented by formula (IV) is from 20 to 70 mole % based on the total repeating units in the resin.

13. The composition according to claim 12, wherein the content of the repeating units represented by formula (IV) is from 25 to 60 mole % based on the total repeating units in the resin.

14. The composition according to claim 1, wherein the content of the repeating units represented by formulae (V-1) to (V-4) is from 20 to 70 mole % based on the total repeating units in the resin.

15. The composition according to claim 14, wherein the content of the repeating units represented by formulae (V-1) to (V-4) is from 25 to 60 mole % based on the total repeating units in the resin.

16. The composition according to claim 1, further comprising a nitrogen-containing basic compound.

17. The composition according to claim 1, further comprising at least one of fluorine-based and/or silicon-based surfactants.

18. A method for forming a pattern, which comprises forming a resist film comprising the composition described in claim 1, exposing the resist film upon irradiation with the actinic ray or a radiation, and subsequently developing the resist film.

* * * * *